US011429237B2

(12) United States Patent
Kim et al.

(10) Patent No.: US 11,429,237 B2
(45) Date of Patent: Aug. 30, 2022

(54) TOUCH SENSOR AND DISPLAY DEVICE

(71) Applicant: Samsung Display Co., Ltd., Yongin-Si (KR)

(72) Inventors: Ga Young Kim, Hwaseong-si (KR); Do Ik Kim, Suwon-si (KR); Jang Hui Kim, Suwon-si (KR)

(73) Assignee: Samsung Display Co., Ltd.

( * ) Notice: Subject to any disclaimer, the term of this patent is extended or adjusted under 35 U.S.C. 154(b) by 4 days.

(21) Appl. No.: 16/584,518

(22) Filed: Sep. 26, 2019

(65) Prior Publication Data

US 2020/0142539 A1 May 7, 2020

(30) Foreign Application Priority Data

Nov. 6, 2018 (KR) .................. 10-2018-0135081

(51) Int. Cl.
*G06F 3/044* (2006.01)
*G06F 3/041* (2006.01)
*H01L 27/32* (2006.01)

(52) U.S. Cl.
CPC .......... *G06F 3/0446* (2019.05); *G06F 3/0412* (2013.01); *G06F 3/0443* (2019.05);
(Continued)

(58) Field of Classification Search
CPC ............... G06F 3/0446; G06F 3/04182; G06F 3/04164; G06F 3/0443; G06F 3/0412;
(Continued)

(56) References Cited

U.S. PATENT DOCUMENTS

2012/0056820 A1* 3/2012 Corbridge ............. G06F 3/0443
345/173
2013/0009905 A1* 1/2013 Castillo ................. G06F 3/0414
345/174
(Continued)

FOREIGN PATENT DOCUMENTS

KR 10-2018-0125672 A1 11/2018
KR 10-2019-0132600 A1 11/2019
WO 2013005861 A1 1/2013

OTHER PUBLICATIONS

Extended European Search Report, Application No. 19204946.8 dated Mar. 12, 2020, 8 pages.

*Primary Examiner* — Roberto W Flores
(74) *Attorney, Agent, or Firm* — Innovation Counsel LLP

(57) ABSTRACT

Provided are a touch sensor and a display device. The touch sensor includes a base layer, first electrode members arranged on the base layer in a first direction and spaced apart from one another in a second direction, each first electrode members including a first opening and first touch electrodes, second electrode members arranged on the base layer in the second direction and spaced apart from one another in the first direction, each second electrode members including a second opening and second touch electrodes, a first strain gauge disposed in a first electrode row, a second strain gauge disposed in a first row, a first signal line connected to the first strain gauge, a second signal line connected to the first strain gauge, a third signal line connected to the second strain gauge and the second signal line, and a fourth signal line connected to the second strain gauge.

25 Claims, 59 Drawing Sheets

(52) U.S. Cl.
CPC ...... *G06F 3/04164* (2019.05); *G06F 3/04182* (2019.05); *H01L 27/323* (2013.01); *G06F 2203/04105* (2013.01); *G06F 2203/04112* (2013.01); *H01L 27/3244* (2013.01)

(58) Field of Classification Search
CPC . G06F 2203/04105; G06F 2203/04112; G06F 2203/04111; G06F 3/04144; G06F 3/0414; G06F 3/0416; G06F 3/044; G06F 3/045; G06F 3/041–047; H01L 27/323; H01L 27/3244; G02F 1/13338
See application file for complete search history.

(56) References Cited

U.S. PATENT DOCUMENTS

| | | | | |
|---|---|---|---|---|
| 2013/0257785 | A1* | 10/2013 | Brown | G06F 3/0446 345/174 |
| 2014/0253499 | A1* | 9/2014 | Lee | G06F 3/0448 345/174 |
| 2015/0042598 | A1* | 2/2015 | Chae | G06F 3/0443 345/174 |
| 2017/0010703 | A1* | 1/2017 | Chen | G02F 1/13338 |
| 2017/0115813 | A1* | 4/2017 | Chen | G06F 3/0446 |
| 2017/0261387 | A1* | 9/2017 | Vosgueritchian | G01L 1/2287 |
| 2017/0285864 | A1 | 10/2017 | Pedder et al. | |
| 2018/0039362 | A1* | 2/2018 | Liu | H01L 27/3225 |
| 2018/0046300 | A1* | 2/2018 | Dun | G02F 1/1343 |
| 2018/0239473 | A1* | 8/2018 | Wang | G06F 3/045 |

* cited by examiner

150a : 151a, 153a, 155a, 157a, 159a
150b : 151b, 153b, 155b, 157b, 159b
150c : 151c, 153c, 155c, 157c, 159c
150d : 151d, 153d, 155d, 157d, 159d

TOUCH SENSOR AND DISPLAY DEVICE

This application claims priority from Korean Patent Application No. 10-2018-0135081 filed on Nov. 6, 2018, in the Korean Intellectual Property Office, the disclosure of which is incorporated herein by reference in its entirety.

BACKGROUND

1. Field of the Disclosure

The present disclosure relates to a touch sensor and a display device.

2. Description of the Related Art

Electronic devices that can display images such as a smart phone, a tablet PC, a digital camera, a laptop computer, a navigation device and a smart TV include a display device for displaying images. Such a display device includes a display panel for generating and displaying an image and various input means.

Recently, a touch sensor that recognizes a touch input has been widely employed for a display device of a smartphone or a tablet PC. Because of its convenience, touch sensors are increasingly replacing existing physical input devices such as keypads.

SUMMARY

There is ongoing search to employ a pressure sensor for detecting the magnitude of a pressure on a display device as well as a touch sensor for detecting a touch position, in place of existing physical buttons.

Aspects of the present disclosure provide a touch sensor for sensing a pressure.

It should be noted that objects of the present disclosure are not limited to the above-mentioned object; and other objects of the present invention will be apparent to those skilled in the art from the following descriptions.

According to exemplary embodiments of the present disclosure, there are provided a touch sensor capable of sensing the pressure of a touch input as well as the position of the touch input, and a display device including the touch sensor.

It should be noted that effects of the present disclosure are not limited to those described above and other effects of the present disclosure will be apparent to those skilled in the art from the following descriptions.

An embodiment of a touch sensor includes a base layer; first electrode members arranged on the base layer in a first direction and spaced apart from one another in a second direction intersecting the first direction, each of the first electrode members comprising a first opening and a plurality of first touch electrodes electrically connected to one another in the first direction; second electrode members arranged on the base layer in the second direction and spaced apart from one another in the first direction, each of the second electrode members comprising a second opening and a plurality of second touch electrodes electrically connected to one another in the second direction intersecting the first direction; a first strain gauge comprising a portion located in the first opening and disposed in a first electrode row among electrode rows of the first electrode members; a second strain gauge comprising a portion located in the second opening and disposed in a first row among rows of the second touch electrodes; a first signal line connected to one end of the first strain gauge; a second signal line connected to another end of the first strain gauge and spaced apart from the first signal line; a third signal line connected to one end of the second strain gauge and the second signal line; and a fourth signal line connected to another end of the second strain gauge and spaced apart from the third signal line.

The touch sensor may have wherein the first strain gauge comprises: a plurality of first resistance lines electrically connected to one another in the first direction, and a plurality of second resistance lines electrically connected to one another in the first direction, and wherein each of the first resistance lines and each of the second resistance lines are located in the first opening in the first electrode row and are spaced from each other in the first opening.

The touch sensor may have wherein the first electrode members further comprise first connecting parts each of which connects two first touch electrodes, among the first touch electrodes, that are adjacent to each other in the first direction, and the second electrode members further comprise second connecting parts each of which connects two second touch electrodes, among the second touch electrodes, that are adjacent to each other in the second direction, the second connecting parts being insulated from the first connecting parts, wherein the first touch electrodes, the second touch electrodes, the first resistance lines and the second resistance lines are located in a same first layer, one of the first connecting parts and the second connecting parts are located in a second layer different from the first layer, and an other of the first connecting parts and the second connecting parts are located in the first layer.

The touch sensor may have wherein the first strain gauge comprises: first connecting lines each of which connects two first resistance lines, among the first resistance lines, that are adjacent to each other in the first direction, and second connecting lines each of which connects two second resistance lines, among the second resistance lines, that are adjacent to each other in the first direction, and wherein the first connecting lines and the second connecting lines are located in the second layer.

The touch sensor may have wherein the first strain gage further comprises a first connecting pattern connected to the first resistance lines and the second resistance lines and located in a same layer with the first resistance lines or the second resistance lines, and
wherein the first connecting pattern is located in an outermost first opening of the first electrode row among the first openings.

The touch sensor may further comprise: an insulating layer disposed on the base layer, wherein the first connecting lines and the second connecting lines are disposed on the base layer, wherein the insulating layer is disposed on the first connecting lines and the second connecting lines, and wherein the first touch electrodes, the second touch electrodes, the first resistance lines and the second resistance lines are disposed on the insulating layer.

The touch sensor may have wherein the base layer comprises a first encapsulation inorganic layer, an encapsulation organic layer disposed on the first encapsulation inorganic layer, and a second encapsulation inorganic layer disposed on the encapsulation organic layer, and wherein the first connecting lines and the second connecting lines are disposed on the second encapsulation inorganic layer.

The touch sensor may have wherein the first electrode members further comprise first connecting parts each of which connects two first touch electrodes, among the first touch electrodes, that are adjacent to each other in the first direction, and the second electrode members further comprise second connecting parts each of which connects two second touch electrodes, among the second touch electrodes, that are adjacent to each other in the second direction, the second connecting parts being insulated from the first connecting parts, wherein the first touch electrodes, the second touch electrodes and the first resistance lines are located in a same first layer, one of the first connecting parts and the second connecting parts are located in a second layer different from the first layer, and an other of the first connecting parts and the second connecting parts are located in the first layer, and the second resistance lines are located in the second layer.

The touch sensor may have wherein the first electrode members further comprise first connecting parts each of which connects two first touch electrodes, among the first touch electrodes, that are adjacent to each other in the first direction, and the second electrode members further comprise second connecting parts each of which connects two second touch electrodes, among the second touch electrodes, that are adjacent to each other in the second direction, the second connecting parts being insulated from the first connecting parts, wherein the first touch electrodes and the second touch electrodes are located in a same first layer, one of the first connecting parts and the second connecting parts are located in a second layer different from the first layer, and an other of the first connecting parts and the second connecting parts are located in the first layer, and the first resistance lines and the second resistance lines are located in the second layer.

The touch sensor may have wherein the second strain gauge comprises: a plurality of third resistance lines electrically connected to one another in the first direction, and a plurality of fourth resistance lines electrically connected to one another in the first direction, third connecting lines each of which connects two third resistance lines, among the third resistance lines, that are adjacent to each other in the first direction, and fourth connecting lines each of which connects two fourth resistance lines, among the fourth resistance lines, that are adjacent to each other in the first direction, wherein each of the third resistance lines and each of the fourth resistance lines are located in the second opening in the first row, and are spaced from each other in the second opening.

The touch sensor may have wherein an area of the second opening is larger than an area of the first opening.

The touch sensor may further comprise: a third strain gauge located in a second electrode row, among the electrode rows, that is adjacent to the first electrode row in the second direction of the first electrode members and comprising a portion located in the first opening in the second electrode row; and a fourth strain gauge located in a second row, among the rows, that is adjacent to the first row in the second direction of the second electrodes and comprising a portion located in second first opening in the second row, where the first row is located between the first electrode row and the second electrode row along the second direction, and the second electrode row is located between the first row and the second row along the second direction.

The touch sensor may further comprise: a fifth signal line connected to one end of the third strain gauge and the fourth signal line; a sixth signal line connected to another end of the third strain gauge; a seventh signal line connected to one end of the fourth strain gauge and the sixth signal line; and an eighth signal line connected to another end of the fourth strain gauge.

The touch sensor may have wherein a sensing area where the first electrode members and the second electrode members are disposed, and a peripheral area around the sensing area, are defined in the base layer, wherein the third signal line is connected to the second signal line in the peripheral area, the fifth signal line is connected to the fourth signal line in the peripheral area, and the seventh signal line is connected to the sixth signal line in the peripheral area.

The touch sensor may further comprise: a Wheatstone bridge circuit comprising a first node to which a driving voltage is applied, a second node to which a reference voltage is applied, a first output node and a second output node, wherein the first signal line and the eighth signal line are electrically connected to the first node, the third signal line is electrically connected to the second output node, the fifth signal line is electrically connected to the second node, and the seventh signal line is electrically connected to the first output node.

The touch sensor may have wherein the base layer comprises a first area and a second area adjacent to the first area in the first direction, wherein the first strain gauge further comprises: a first conductive pattern electrically connected to the first resistance lines in the first direction and having a shape different from that of the first resistance lines, and a second conductive pattern connected to the second resistance lines in the first direction and having a shape different from that of the second resistance lines, wherein the first conductive pattern and the second conductive pattern are located in the first opening in the first area and are spaced apart from each other, and wherein the first resistance lines and the second resistance lines are located in the first opening in the second area.

The touch sensor may have wherein the first conductive pattern and the second conductive pattern have a mesh structure.

The touch sensor may further comprise: a dummy pattern located in a different area than the second strain gauge, wherein the dummy pattern is disposed in the second opening located in the different area among the second openings and spaced apart from the second touch electrodes, and wherein the first touch electrodes, the second touch electrodes and the dummy pattern are located in the same first layer, and the first touch electrodes and the second touch electrodes are made of a same material.

The touch sensor may further comprise: a plurality of noise sensing electrodes located in a different area than the first strain gauge and electrically connected to one another in the first direction, wherein each of the noise sensing electrodes is located in the first opening and spaced apart from the first touch electrodes in the different area.

The touch sensor may further comprise: a controller configured to cancel a noise in a signal sensed by the first electrode members based on a noise signal sensed by the noise sensing electrode members.

An embodiment of a touch sensor includes a base layer; a plurality of touch electrodes disposed on the base layer and arranged in a first direction and each having an opening; a strain gauge comprising a plurality of first resistance lines electrically connected to one another in the first direction, a plurality of second resistance lines electrically connected to one another in the first direction, and a connecting pattern connecting one of the first resistance lines with the respective one of the second resistance lines, wherein each of the first resistance lines is located in the opening and is spaced apart from the touch electrode, and each of the second resistance lines is located in the opening and is spaced apart from the touch electrode and the first resistance lines.

The touch sensor may have wherein the first resistance lines or the second resistance lines are located in a same layer with the touch electrodes and are made of a same material as the touch electrode.

The touch sensor may have wherein the first resistance lines and the second resistance lines are located in a different layer than the touch electrodes.

The touch sensor may further comprise: a noise sensing electrode located in a different area than the strain gauge, wherein the noise sensing electrode is located in the opening in the different area and is spaced apart from the touch electrodes.

The touch sensor may have wherein the noise sensing electrode is located in a same layer with the touch electrodes and is made of a same material as the touch electrodes.

An embodiment of a display device includes a base substrate; a light-emitting diode disposed on the base substrate; a thin-film encapsulation layer disposed on the light-emitting diode; a touch electrode disposed on the thin-film encapsulation layer and comprising an opening; and a strain gauge, wherein the strain gauge comprises: a first resistance line and a second resistance line located in the opening and spaced apart from the touch electrode, a first connecting line connected to the first resistance line and located on a different layer than the touch electrode, a second connecting line connected to the second resistance line, spaced apart from the first connecting line and located on the same layer with the first connecting line, and a connecting pattern connected to the first resistance line and the second resistance line and located in the same layer with the touch electrode or the first connecting line.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
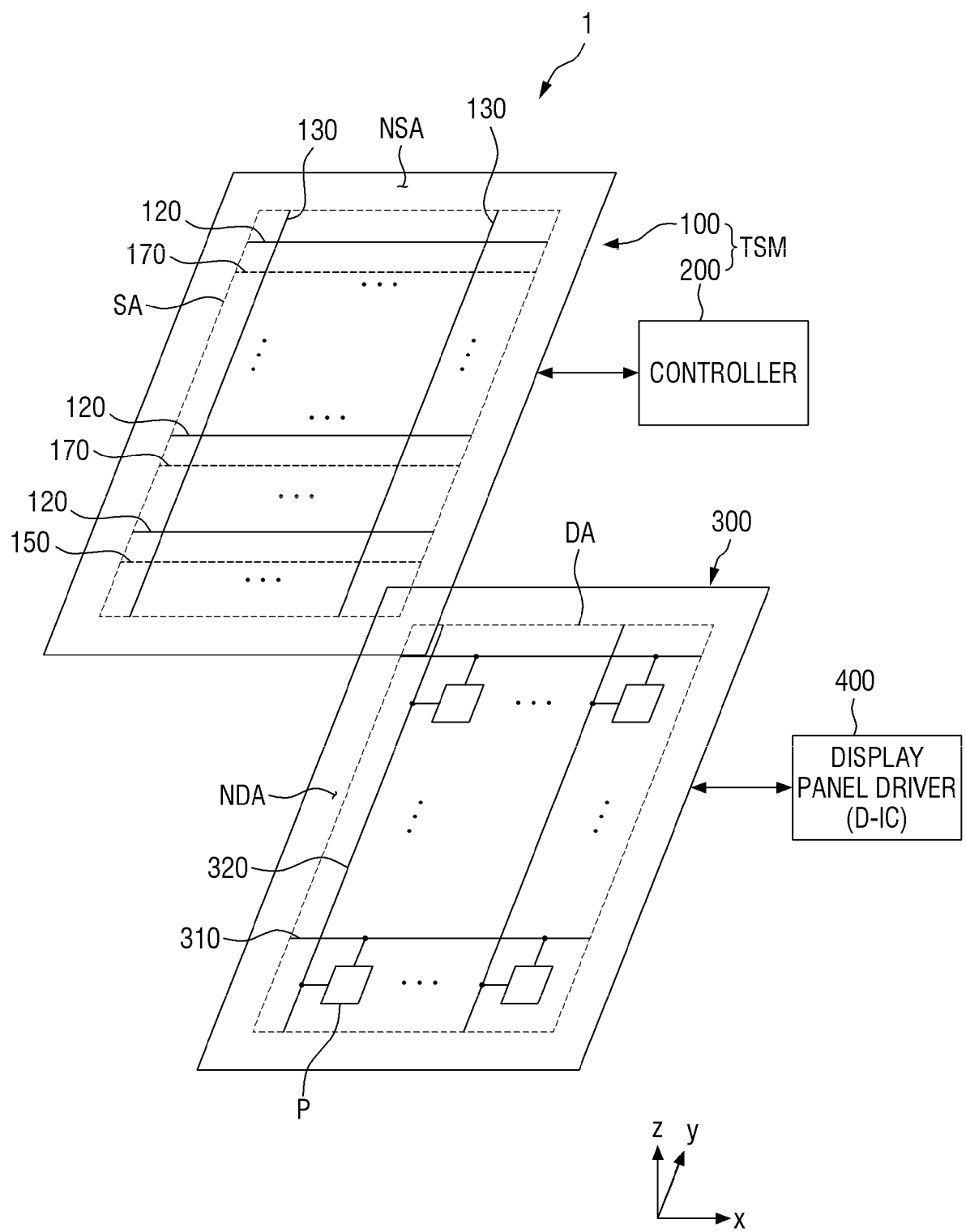
FIG. 1 is a view showing a display device according to an exemplary embodiment of the present disclosure.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Exemplary embodiments of the inventive subject matter are described herein with reference to plan and perspective illustrations that are schematic illustrations of idealized exemplary embodiments of the inventive subject matter. As such, variations from the shapes of the illustrations as a result, for example, of manufacturing techniques and/or tolerances, are to be expected. Therefore, the exemplary embodiments of the present disclosure are not limited to specific features but may include variations depending on the fabricating processes. Therefore, the regions illustrated in the drawings have schematic attributes, and the shapes of the regions illustrated in the drawings are for illustrating specific shapes and are not for limiting the scope of the present disclosure.

The drawings are not to scale and the relative dimensions of various elements in the drawings are depicted schematically and not necessarily to scale.

Hereinafter, exemplary embodiments of the present disclosure will be described with reference to the accompanying drawings.

Figure 2:
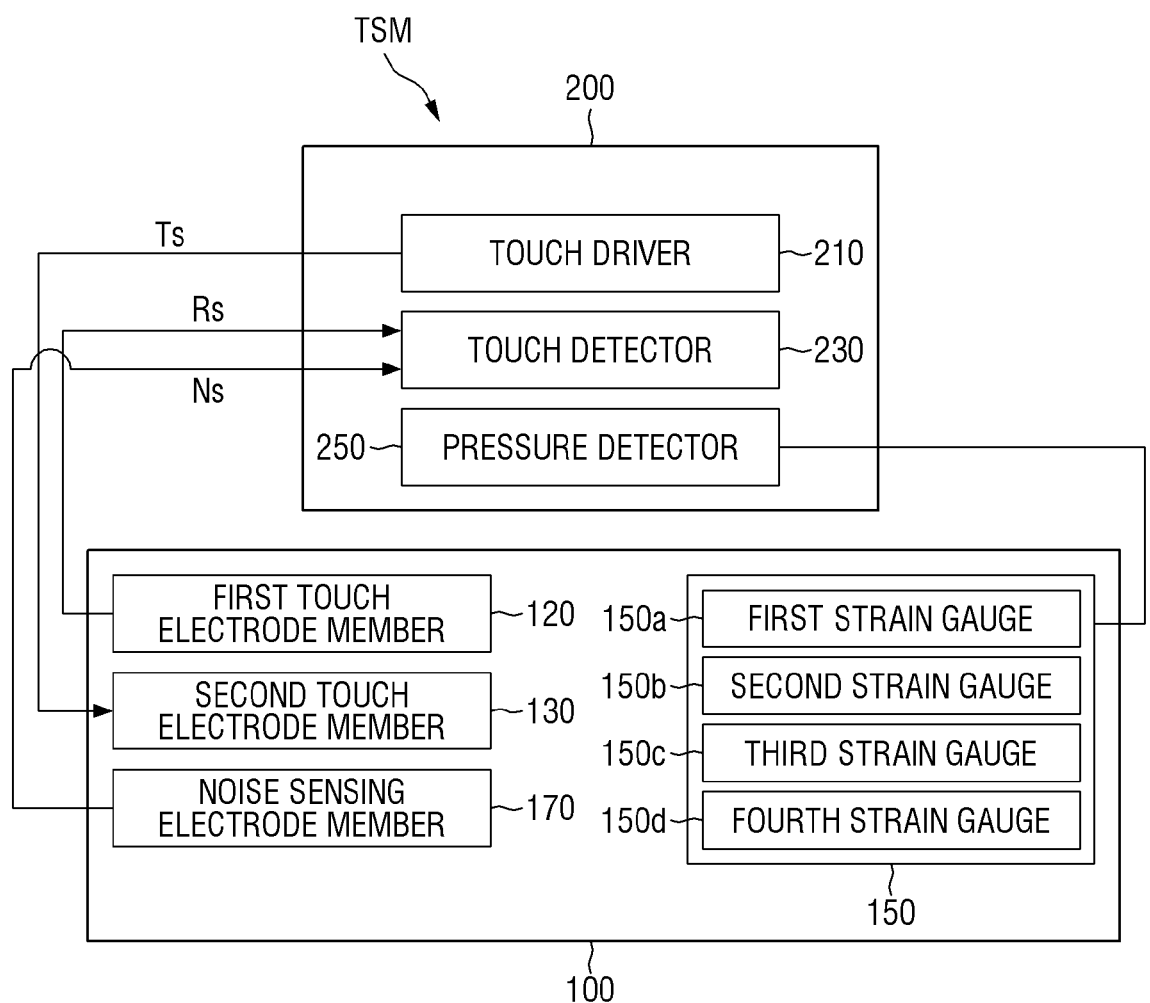
FIG. 2 is a block diagram of the touch sensor shown in FIG. 1.

FIG. 1 is a view showing a display device according to an exemplary embodiment of the present disclosure. FIG. 2 is a block diagram of the touch sensor shown in FIG. 1.

Referring to FIGS. 1 and 2, a display device 1 according to an exemplary embodiment of the present disclosure includes a touch sensor TSM and a display panel 300, and may further include a display panel driver 400. The touch sensor TSM includes a sensor part 100 and a controller 200.

It is to be noted that although the sensor part 100 and the display panel 300 are separated from each other in the exemplary embodiment shown in FIG. 1, this is for convenience of illustration and the present disclosure is not limited thereto. For example, the sensor part 100 and the display panel 300 may be integrally formed.

The display panel 300 includes a display area DA and a non-display area NDA surrounding at least a part of the display area DA. In the display area DA, a plurality of scan lines 310, a plurality of data lines 320, and a plurality of pixels P are connected to the scan lines 310 and the data lines 320. In the non-display area NDA, lines for supplying a variety of driving signals and/or supply voltages for driving the pixels P may be disposed.

The type of the display panel 300 is not particularly limited herein. For example, the display panel 300 may be a self-luminous display panel such as an organic light-emitting display panel (OLED panel), a quantum-dot light-emitting display panel (QLED panel), a micro light-emitting diode display panel (micro LED display panel), and a nano light-emitting diode display panel (nano LED display panel). Alternatively, the display panel 300 may be a non-light-emitting display panel such as a liquid-crystal display panel (LCD panel), an electro-phoretic display panel (EPD panel), and an electro-wetting display panel (EWD panel). When the display panel 300 is a non-luminous display panel, the display device 1 may further include a backlight unit for supplying light to the display panel 300. In the following description, an organic light-emitting display panel is employed as an example of the display panel 300 for convenience of description.

The display panel driver 400 is electrically connected to the display panel 300 to supply signals necessary for driving the display panel 300. For example, the display panel driver 400 may include at least one of a scan driver for supplying a scan signal to the scan lines 310, a data driver for supplying a data signal to the data lines 320, and a timing controller for driving the scan driver and the data driver. In some exemplary embodiments, the scan driver, the data driver and/or the timing controller may be, but are not limited to being, integrated into a single display IC (D-IC). For example, in another exemplary embodiment, at least one of the scan driver, the data driver and the timing controller may be integrated into or mounted on the display panel 300.

The sensor part 100 may be provided on at least one area of the display panel 300. For example, the sensor part 100 may be formed on at least one surface of the display panel 300 such that it overlaps with the display panel 300. For example, the sensor part 100 may be disposed on one of the two surfaces (for example, the upper surface) of the display panel 300 from which images are displayed. Alternatively, the sensor part 100 may be formed directly on at least one of the two surfaces of the display panel 300, or may be formed inside the display panel 300. For example, the sensor part 100 may be formed directly on an outer surface of the top substrate (or an thin-film encapsulation layer) or the bottom substrate of the display panel 300 (e.g., the upper surface of the top substrate or the lower surface of the bottom substrate) or may be formed directly on an inner surface of the top substrate or the bottom substrate (e.g., the lower surface of the top substrate or the upper surface of the bottom substrate).

The sensor part 100 includes a sensing area SA and a peripheral area NSA surrounding at least a part of the sensing area SA. In some exemplary embodiments, the sensing area SA may be the area of the sensor part 100 where a touch input is sensed, whereas the peripheral area NSA may be the area of the sensor part 100 where no touch input is sensed. In some exemplary embodiments, the sensing area SA may be in line with the display area DA of the display panel 300, while the peripheral area NSA may be in line with the non-display area NDA of the display panel 300. For example, the sensing area SA of the sensor part 100 may overlap with the display area DA of the display panel 300, and the peripheral area NSA of the sensor part 100 may overlap with the non-display area NDA of the display panel 300.

A plurality of first electrode members 120 and a plurality of second electrode members 130 for detecting a touch input may be disposed in the sensing area SA of the sensor part 100.

The first electrode members 120 may be extended in a first direction x and may be spaced apart from one another in a second direction y intersecting the first direction x. That is to say, the first electrode members 120 extended in the first direction x may be spaced apart from one another in the second direction y to form electrode rows.

The second electrode members 130 may be extended in the second direction y and may be spaced apart from one another in the first direction x. The second electrode members 130 may be spaced apart and insulated from the first electrode members 120. That is to say, the second electrode members 130 extended in the second direction y may be spaced apart from one another in the first direction x to form columns.

Figure 3:
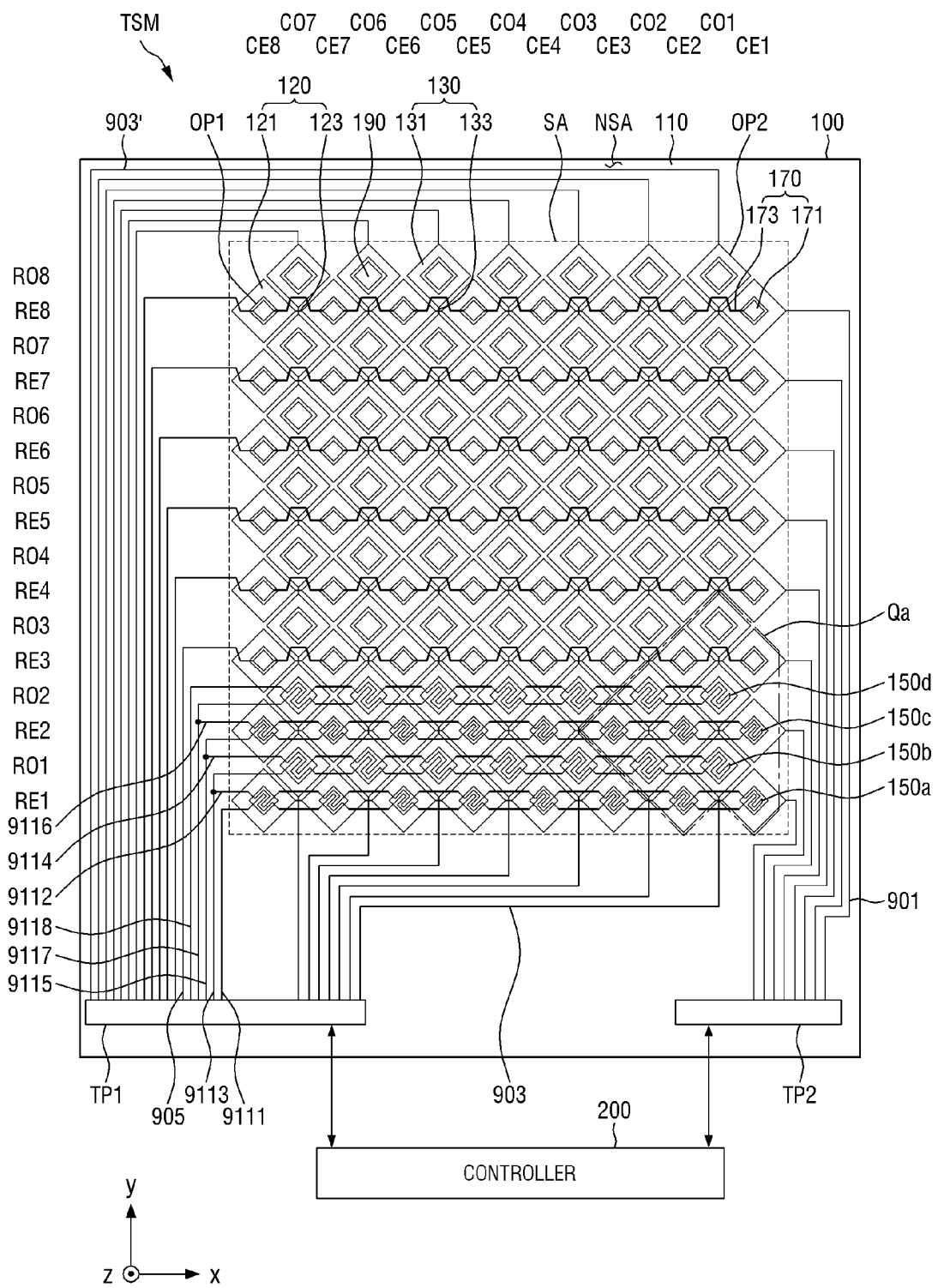
FIG. 3 is a view of the touch sensor of FIG. 2, especially a plan view showing the sensor part of the touch sensor and the connective relationship between the sensor part and the controller.

The shape, size and/or orientations of the first electrode members 120 and the second electrode members 130 are not particularly limited herein. As a non-limiting example, the first electrode members 120 and the second electrode members 130 may be configured as shown in FIG. 3, which will be described later.

The first electrode members 120 and the second electrode members 130 may be electrically connected to the controller 200. In some exemplary embodiments, the second electrode members 130 may be driving electrode members that receive a driving signal Ts for detecting a touch from the controller 200, and the first electrode members 120 may be sensing electrode members that output a sensing signal Rs for detecting a touch to the controller 200.

The first electrode members 120 and the second electrode members 130 may overlap with at least one of the electrodes of the display panel 300. For example, when the display panel 300 is an organic light-emitting display panel, the first electrode members 120 and the second electrode members 130 may overlap with the cathode electrode of the display panel 300 or the like.

Strain gauges 150 may be disposed in the sensing area SA of the sensor part 100 to detect a touch pressure. The length or cross-sectional area of the strain gauges 150 may vary when an external force is applied, such that the resistance value may be changed. The strain gauges 150 may be spaced apart from the first electrode members 120 and the second electrode members 130, and may be insulated from the first electrode members 120 and the second electrode members 130.

In some exemplary embodiments, at least a part of the strain gauges 150 may be extended in the first direction x, like the first electrode members 120.

In some embodiments, the strain gauges 150 may include a first strain gauge 150a, a second strain gauge 150b, a third strain gauge 150c, and a fourth strain gauge 150d. The strain gauges 150 will be described in detail later.

In the sensing area SA of the sensor part 100, noise sensing electrode members 170 for sensing noise may be further disposed.

The noise sensing electrode members 170 may be electrically connected to the controller 200 and may be electrically connected to a touch detector 230, which will be described later in more detail. The noise sensing electrode members 170 may sense the noise generated in the sensor part 100 and provide it to the touch detector 230 as a noise sensing signal Ns.

The noise sensing electrode members 170 may be extended in the first direction x and may be spaced apart from one another in the second direction y intersecting the first direction x. In some exemplary embodiments, the noise sensing electrode members 170 may be spaced apart from the first electrode members 120, the second electrode members 130 and the first strain gauge 150a.

The controller 200 may be electrically connected to the sensor part 100 to supply a driving signal Ts to the sensor part 100 and may receive a sensing signal Rs from the sensor part 100 in response to the driving signal Ts, thereby detecting a touch position. Furthermore, the controller 200 may be electrically connected to the first strain gauge 150*a* to detect a touch pressure.

In some exemplary embodiments, the touch controller 200 may further include a touch driver 210, a touch detector 230, and a pressure detector 250.

The touch driver 210 may provide a driving signal Ts for detecting a touch input to the second electrode members 130.

The touch detector 230 may receive the sensing signal Rs from the first electrode members 120 in response to the driving signal Ts and detect if there is a touch input and/or the position of the touch input if any. In some exemplary embodiments, the sensing signal Rs may be a change in the mutual capacitance between the first electrode members 120 and the second electrode members 130. More specifically, when a touch input is made, the capacitance changes at the point where the touch input is made or at the periphery thereof. The touch detector 230 may receive the amount of the change in the mutual capacitance between the first electrode members 120 and the second electrode members 130 as a sensing signal Rs and may detect if there is a touch input and/or the position of the touch input if any by using the received sensing signal. In addition, the touch detector 230 may receive a noise sensing signal Ns from the noise sensing electrode members 170 and may remove or cancel the noise included in the sensing signal Rs using the noise sensing signal Ns.

In some exemplary embodiments, the touch detector 230 may include one or more amplifiers for amplifying the received sensing signal Rs, an analog-to-digital converter coupled to the output of the amplifier, and a processor. The touch detector 230 will be described in more detail later with reference to FIG. 46.

The pressure detector 250 may be electrically connected to the strain gauges 150 and may detect a touch pressure based on a change in the resistance value of the strain gauge 150. In some exemplary embodiments, the pressure detector 250 may include a Wheatstone bridge circuit electrically connected to each of the first strain gauge 150*a*, the second strain gauge 150*b*, the third strain gauge 150*c*, and the fourth strain gauge 150*d*.

In some exemplary embodiments, the touch driver 210, the touch detector 230 and the pressure detector 250 may be integrated into a single touch IC. It is, however, to be understood that this is merely illustrative.

In some other exemplary embodiments, the touch driver 210 and the touch detector 230 may be integrated into a single touch IC, while the pressure detector 250 may be outside the touch IC. For example, the pressure detector 250 may be disposed on the display panel 300 or may be disposed on a separate flexible circuit board.

Hereinafter, the touch sensor TSM will be described in more detail with reference to FIGS. 3 to 23.

Figure 4:
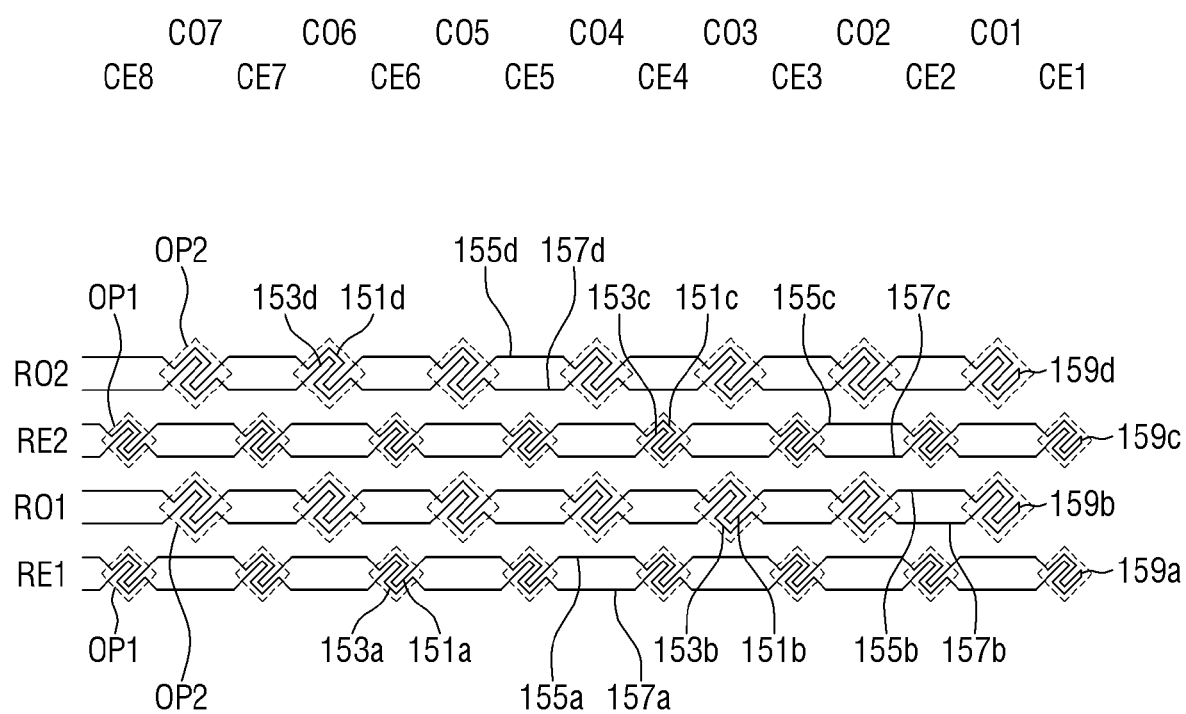
FIG. 4 is an enlarged plan view of the first strain gauge, the second strain gauge, the third strain gauge and the fourth strain gauge shown in FIG. 3.
Figure 4:
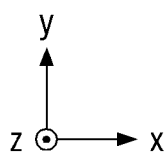
Figure 5:
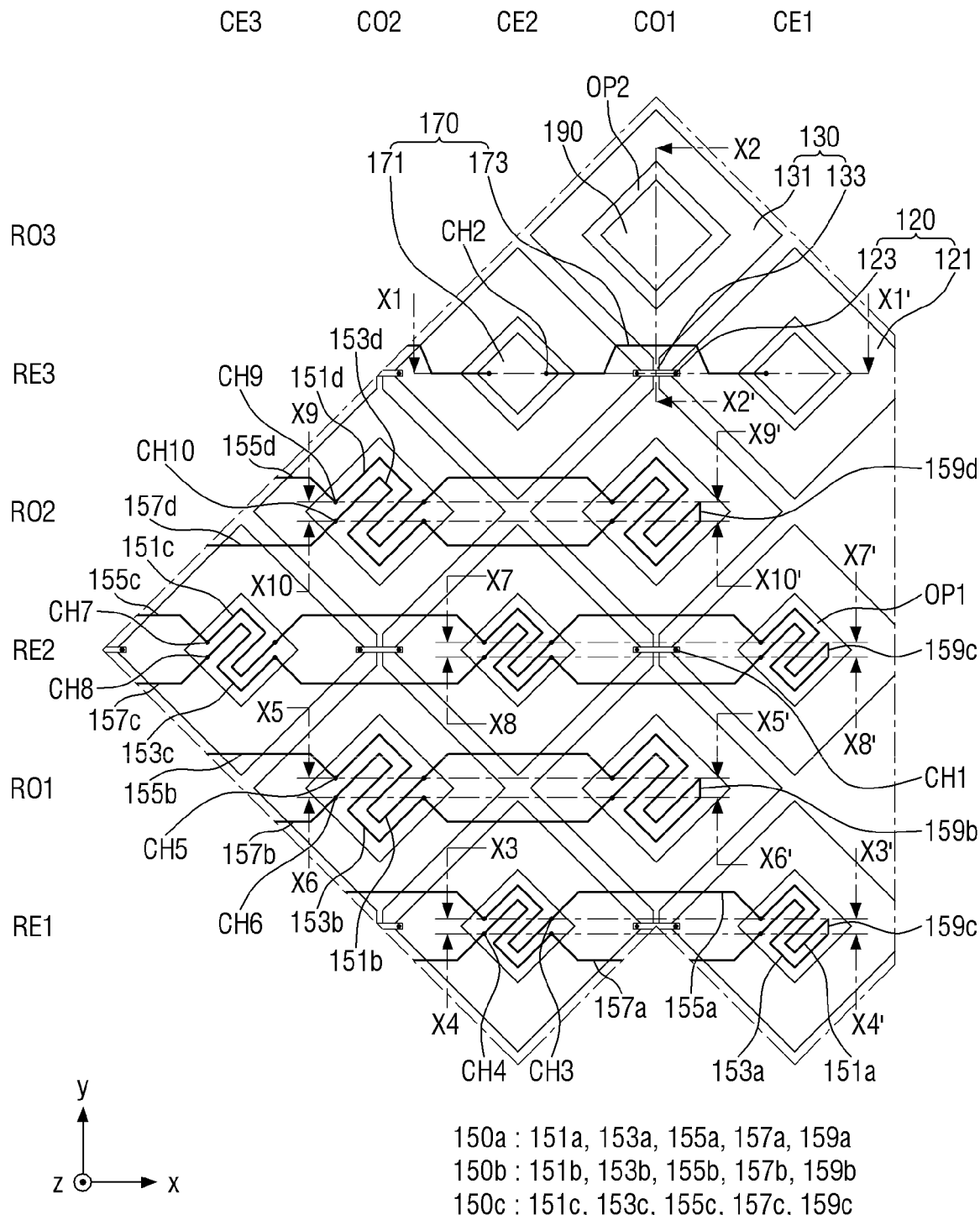
FIG. 5 is an enlarged plan view of portion Qa of FIG. 3.
Figure 6:
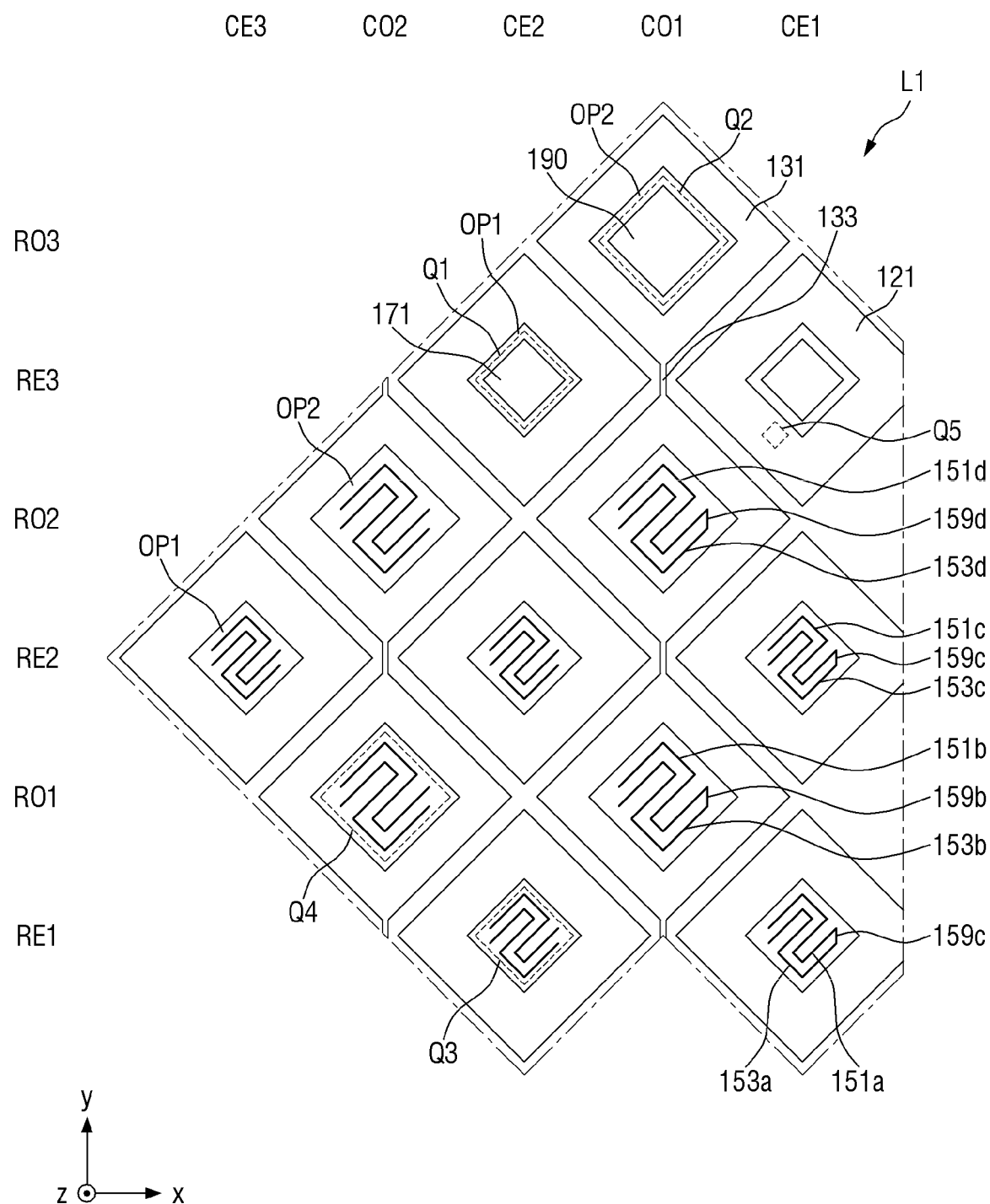
FIG. 6 is a view showing an example of a structure of a first layer of the sensor part shown in FIG. 5.
Figure 7:
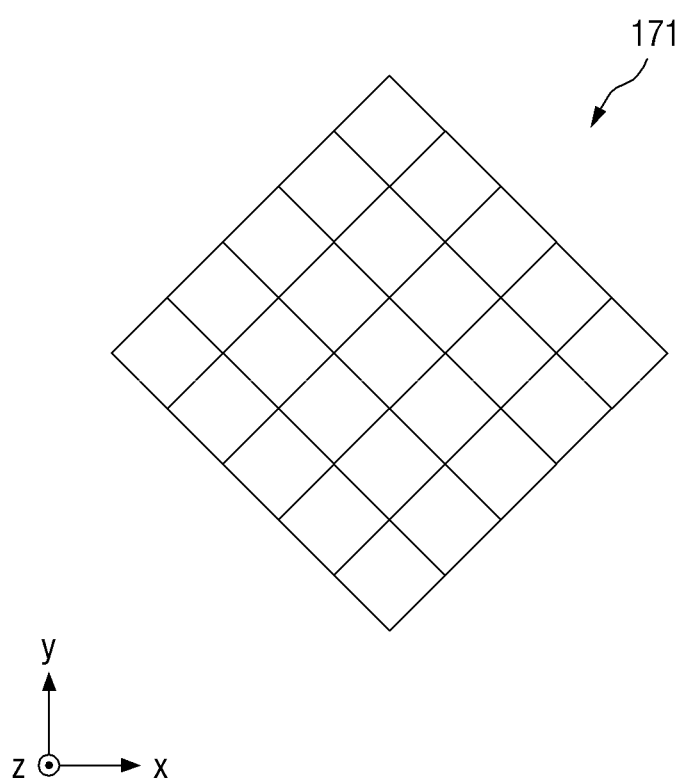
FIG. 7 is an enlarged plan view of portion Q1 of FIG. 6.
Figure 8:
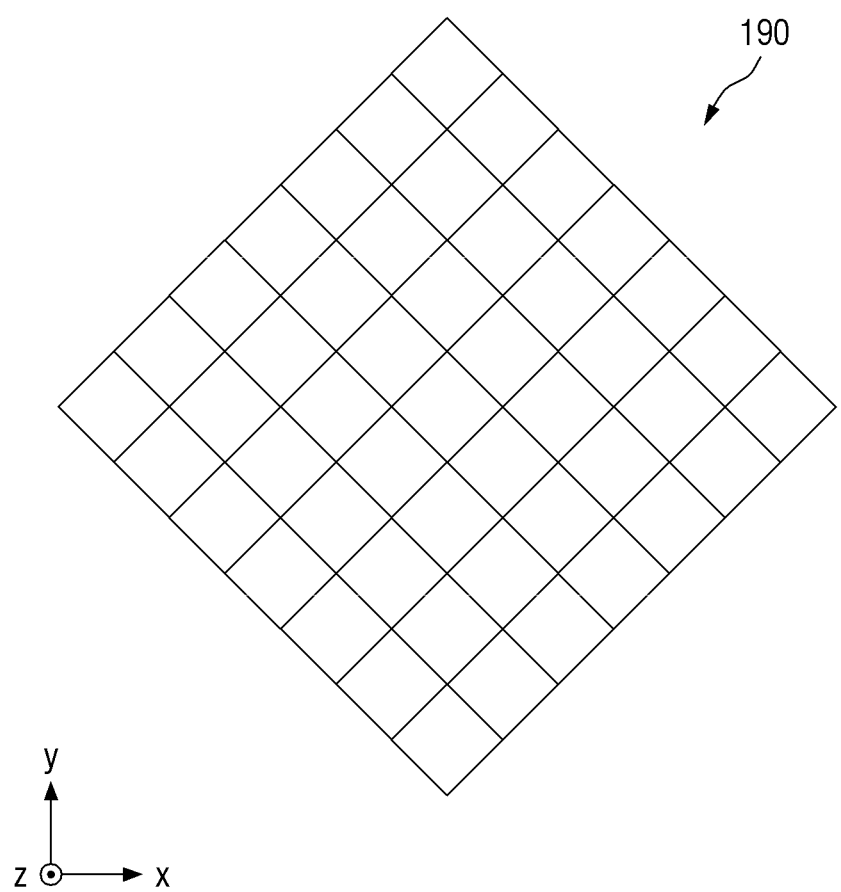
FIG. 8 is an enlarged plan view of portion Q2 of FIG. 6.
Figure 9:
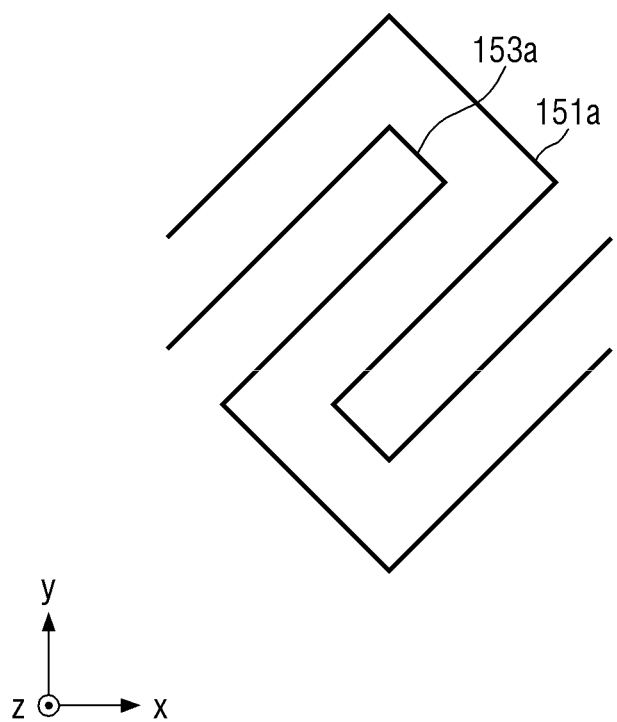
FIG. 9 is an enlarged plan view of portion Q3 of FIG. 6.
Figure 10:
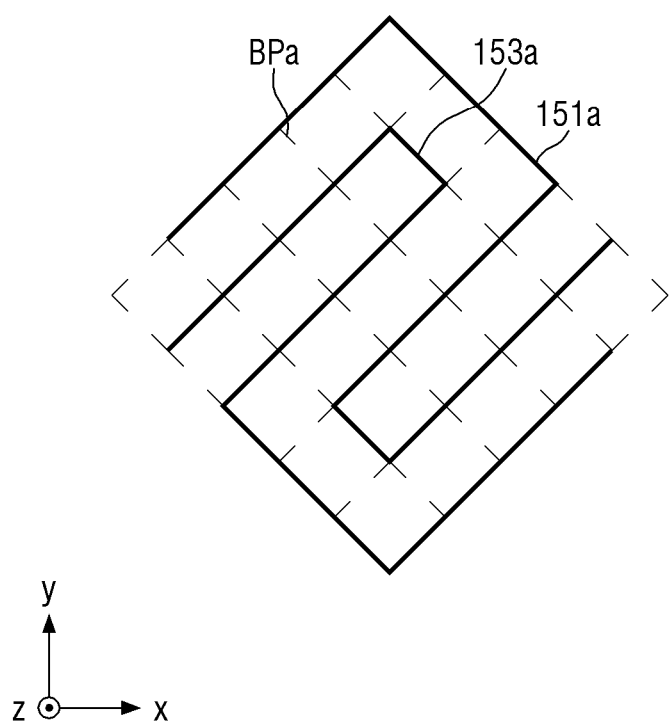
FIG. 10 is a plan view showing a modification of the example shown in FIG. 9.
Figure 11:
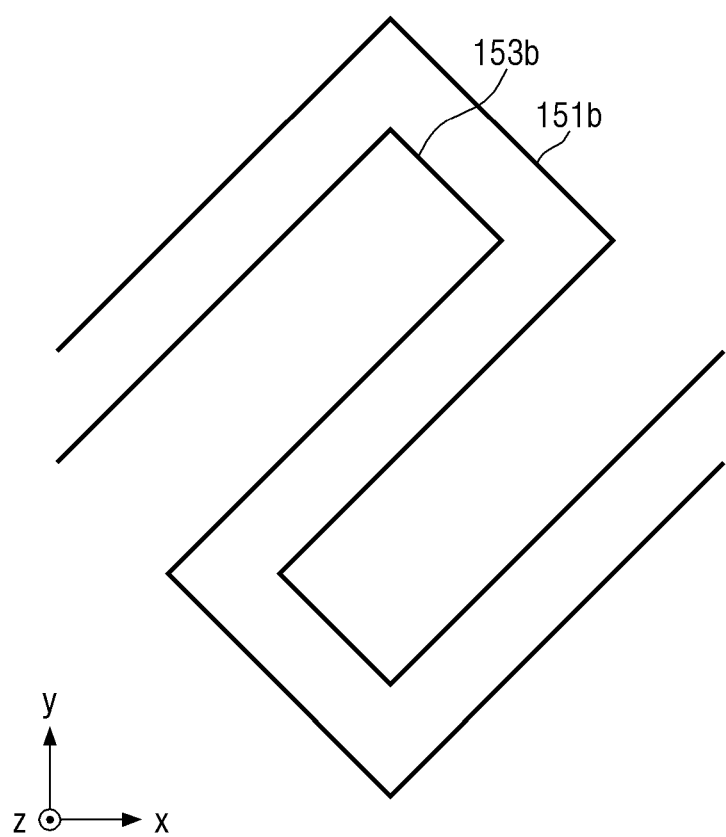
FIG. 11 is an enlarged plan view of portion Q4 of FIG. 6.
Figure 12:
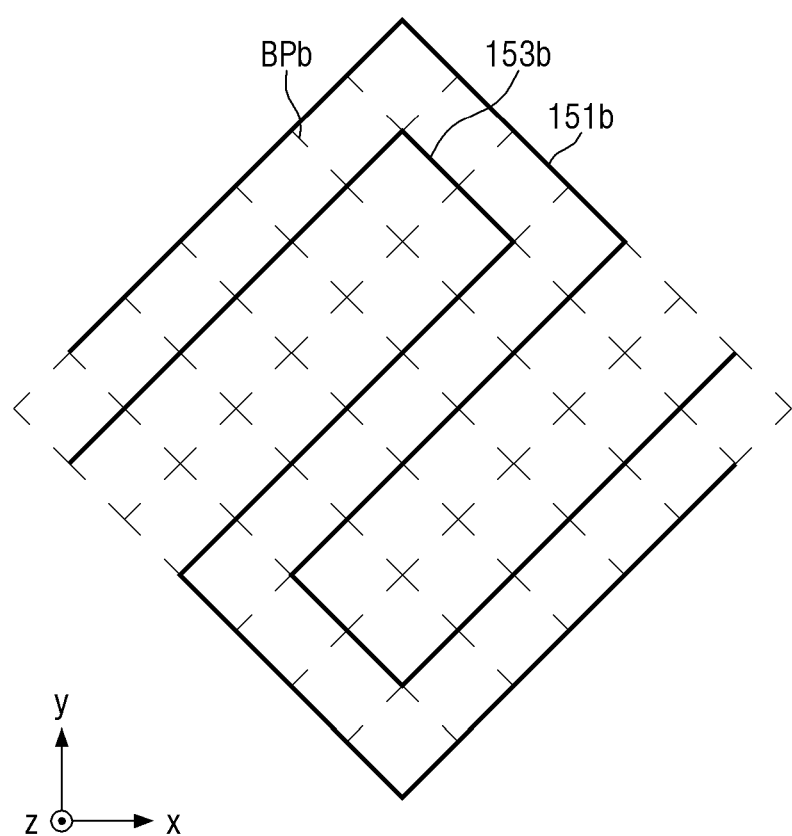
FIG. 12 is a plan view of a modification of the example shown in FIG. 11.
Figure 13:
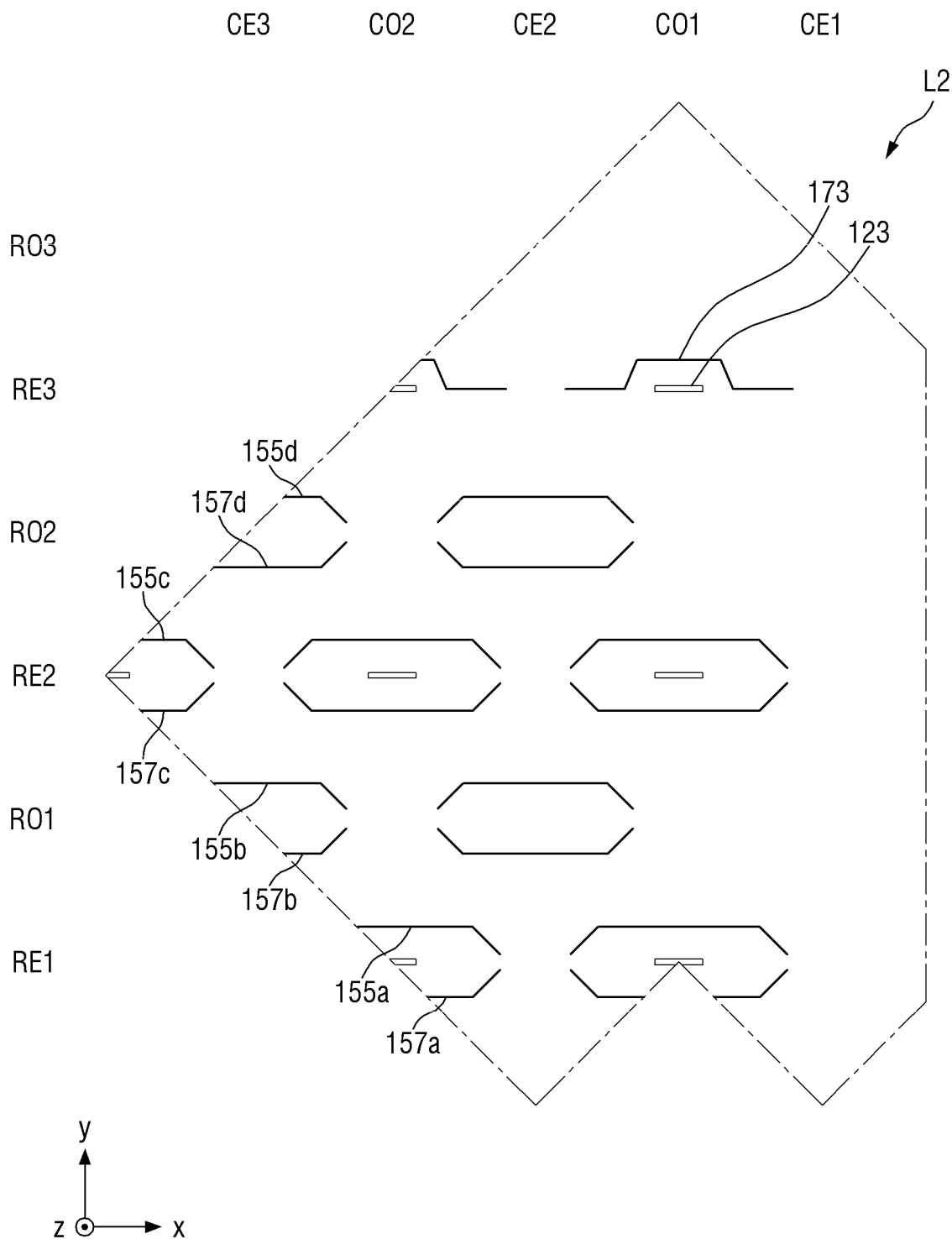
FIG. 13 is a view showing an example of a second layer of the sensor part shown in FIG. 5.
Figure 14:
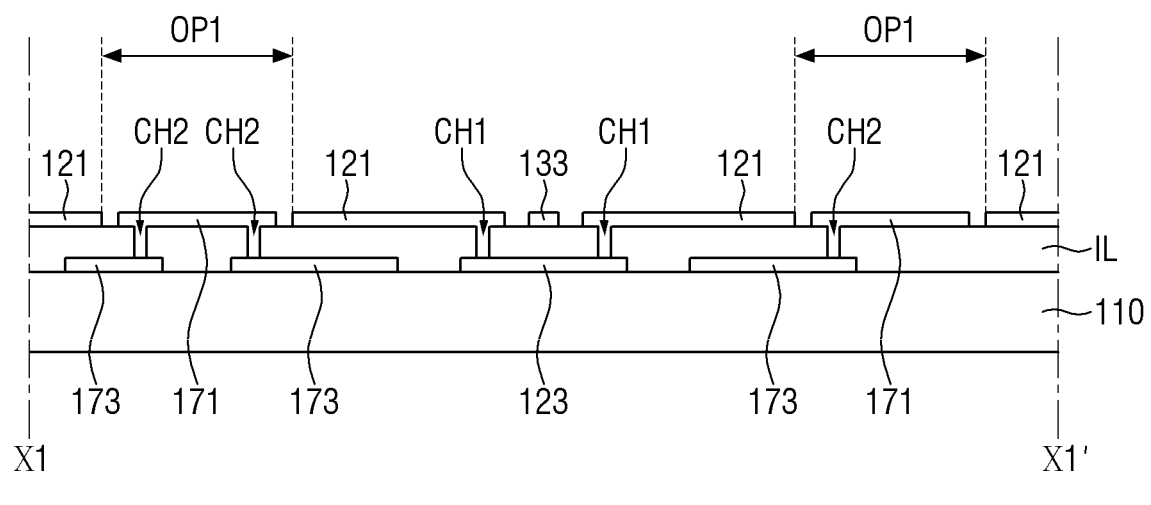
FIG. 14 is a cross-sectional view taken along line X1-X1' of FIG. 5.
Figure 15:
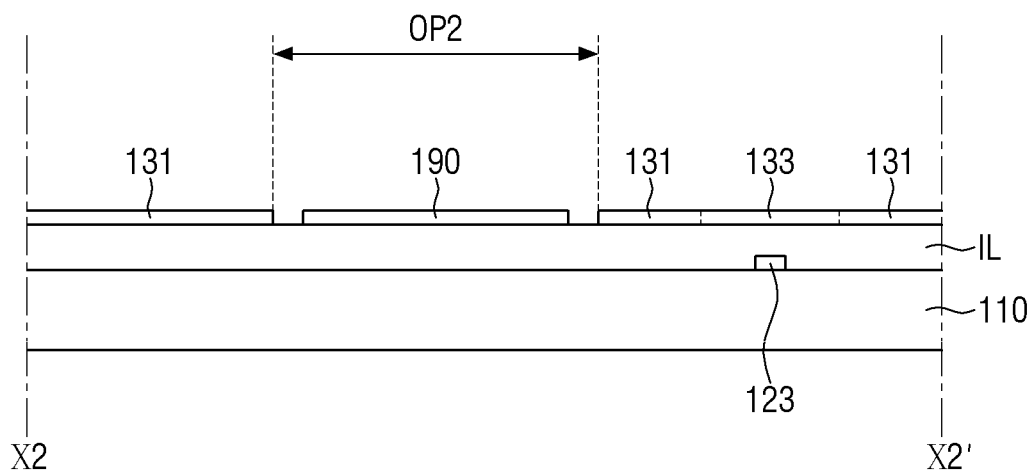
FIG. 15 is a cross-sectional view taken along line X2-X2' of FIG. 5.
Figure 16:
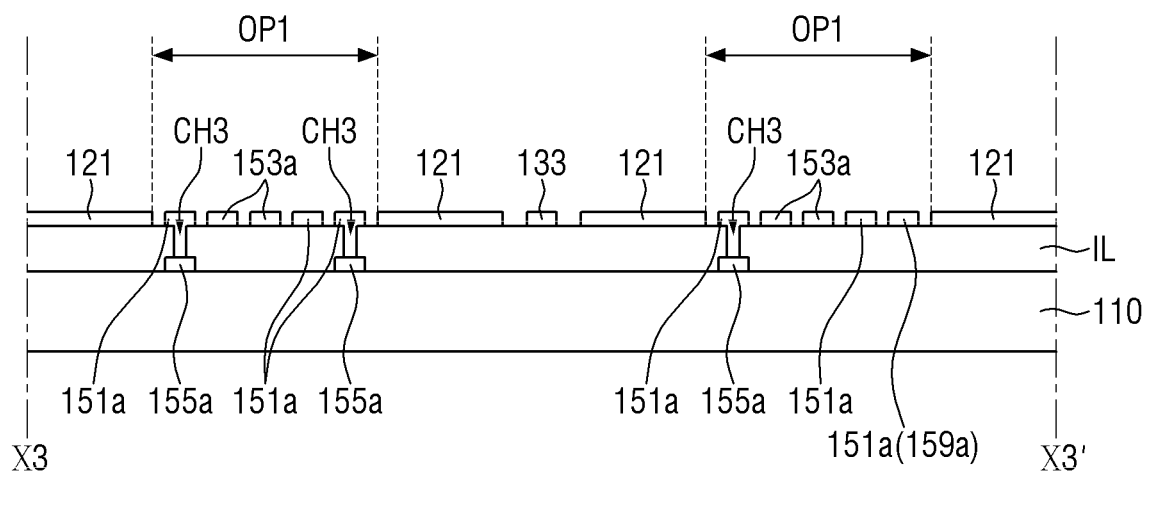
FIG. 16 is a cross-sectional view taken along line X3-X3' of FIG. 5.
Figure 17:
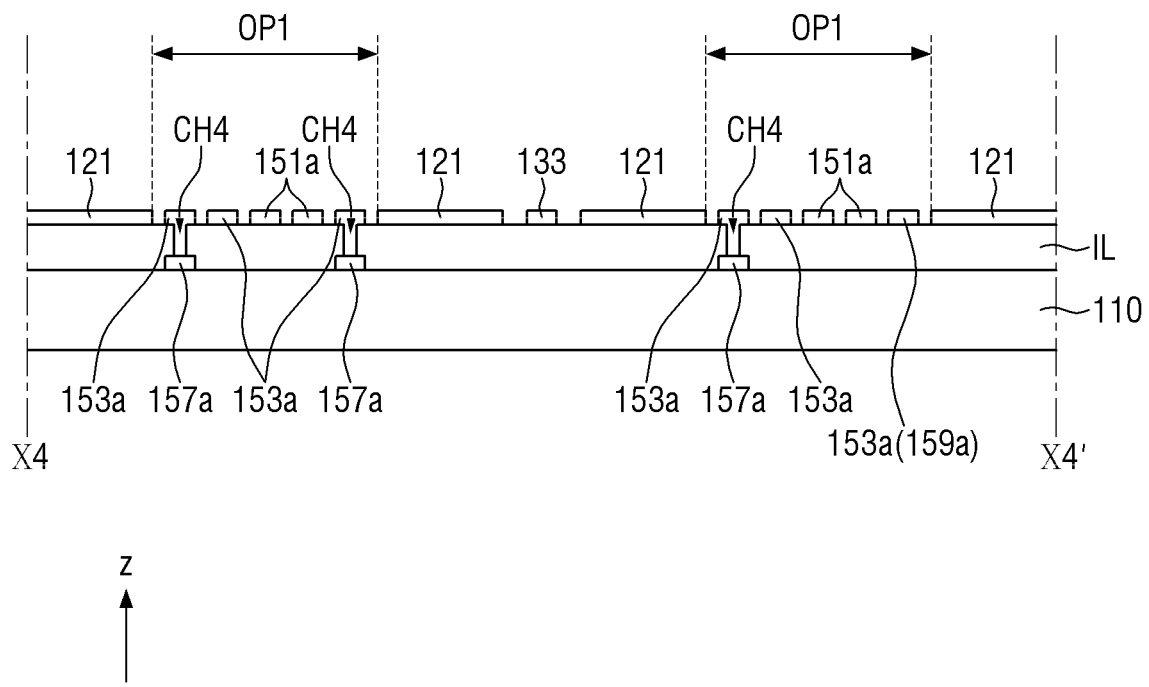
FIG. 17 is a cross-sectional view taken along line X4-X4' of FIG. 5.
Figure 18:
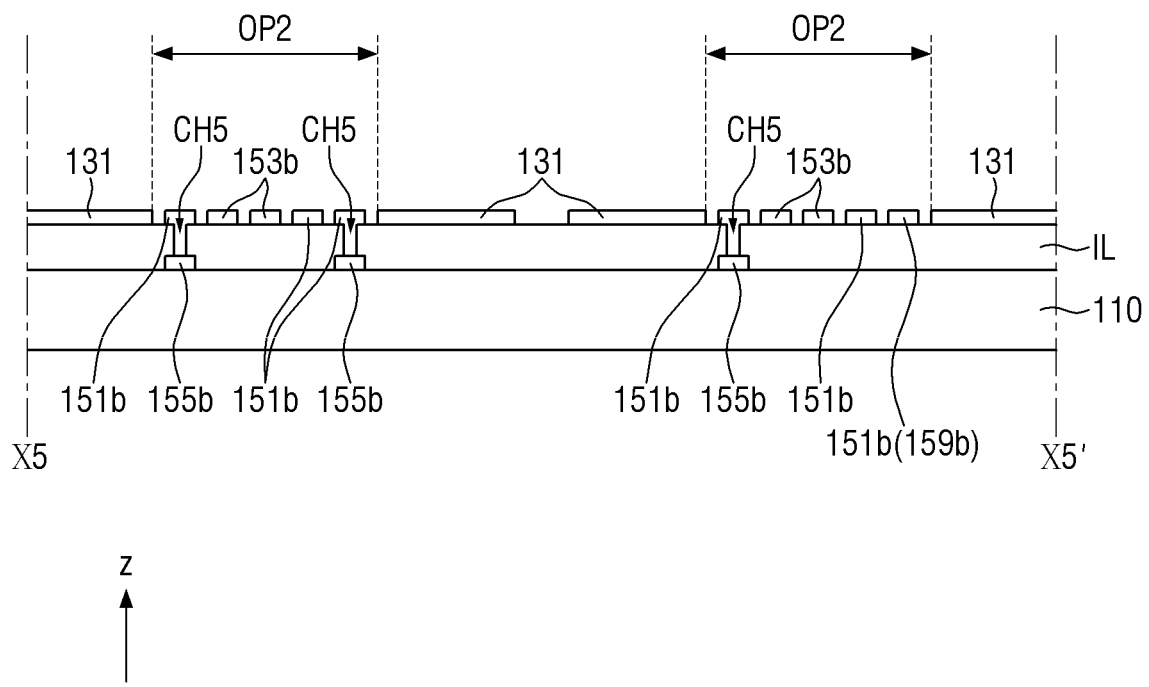
FIG. 18 is a cross-sectional view taken along line X5-X5' of FIG. 5.
Figure 19:
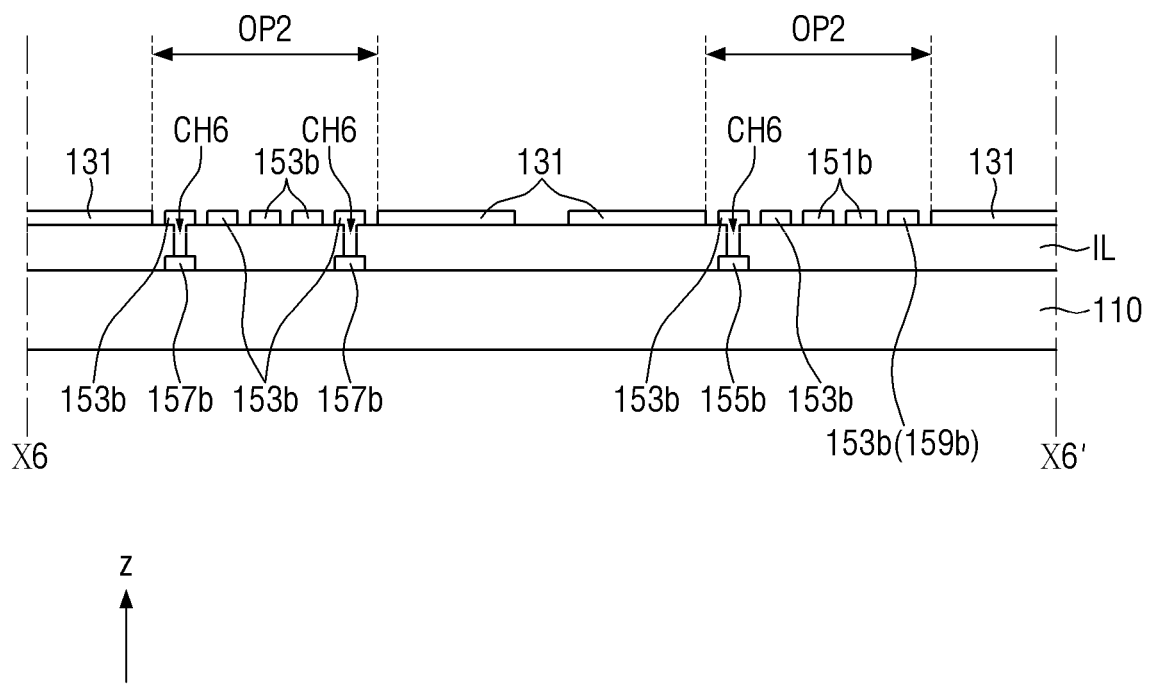
FIG. 19 is a cross-sectional view taken along line X6-X6' of FIG. 5.
Figure 20:
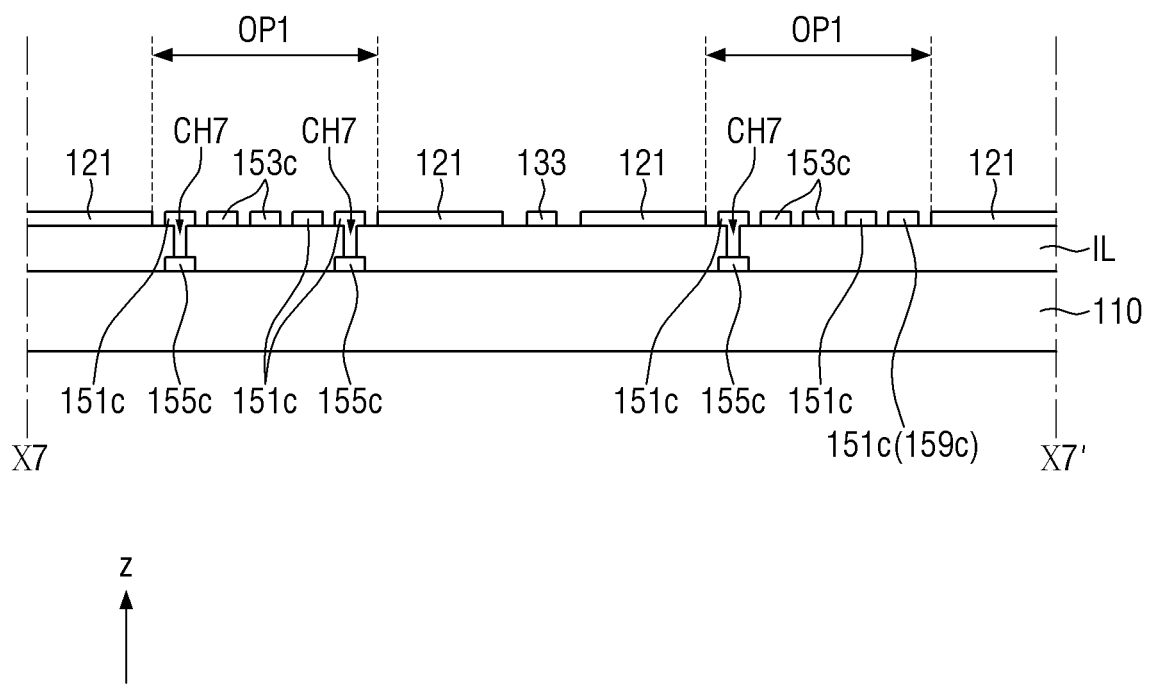
FIG. 20 is a cross-sectional view taken along line X7-X7' of FIG. 5.
Figure 21:
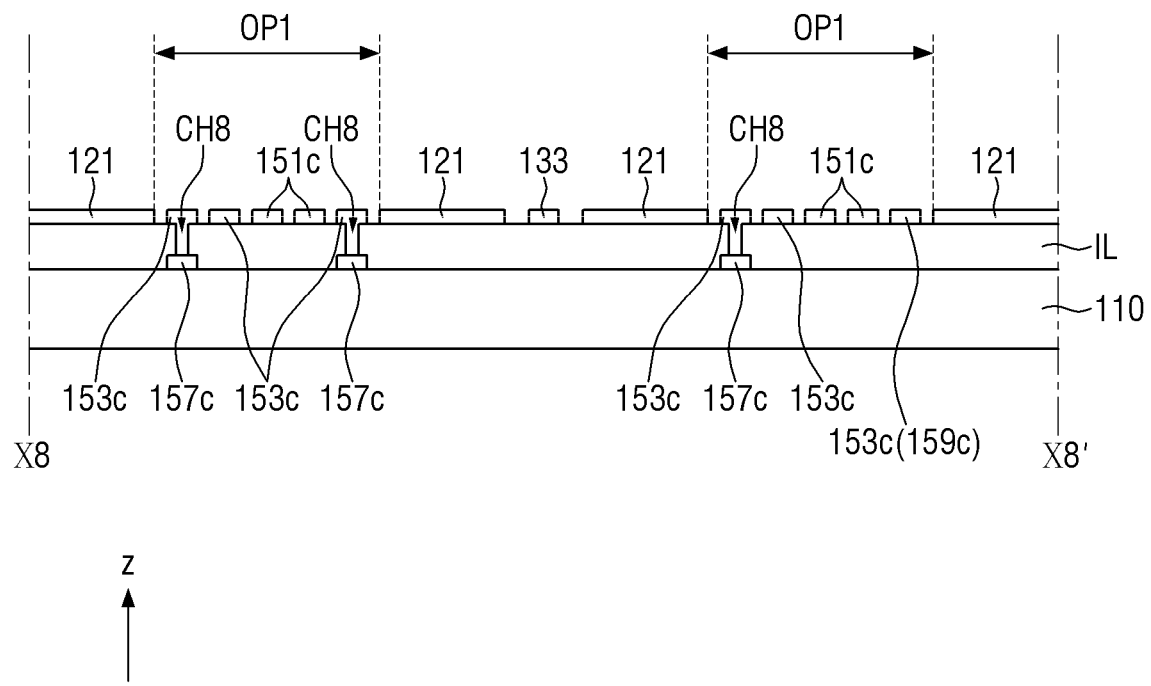
FIG. 21 is a cross-sectional view taken along line X8-X8' of FIG. 5.
Figure 22:
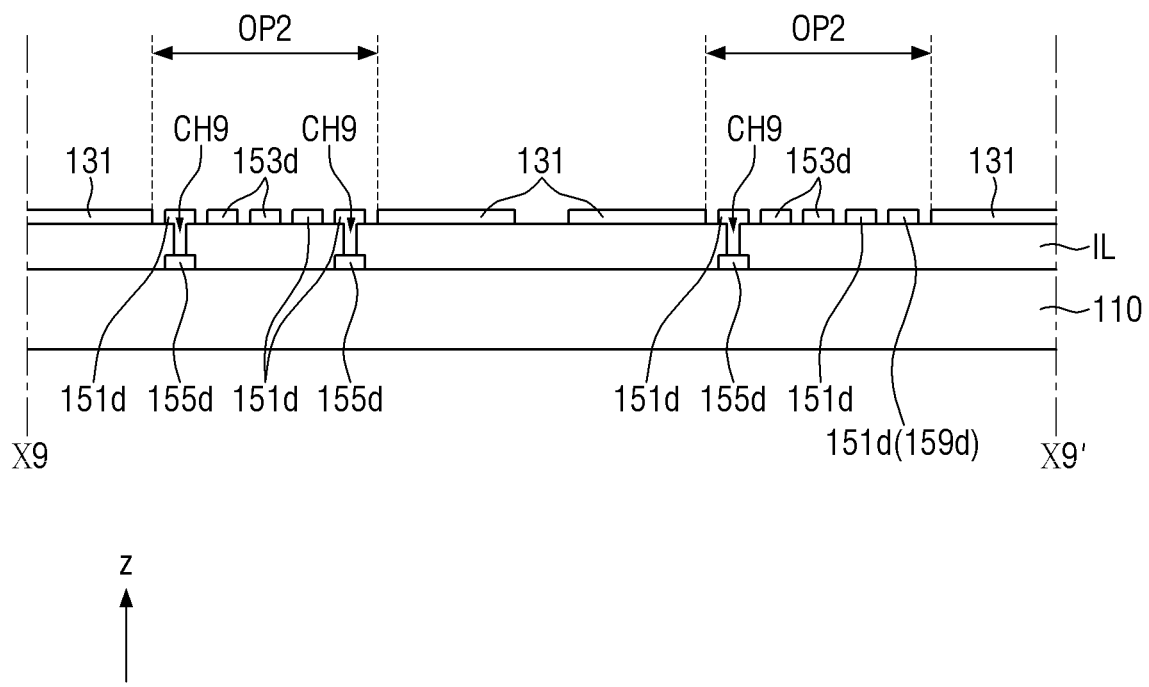
FIG. 22 is a cross-sectional view taken along line X9-X9' of FIG. 5.
Figure 23:
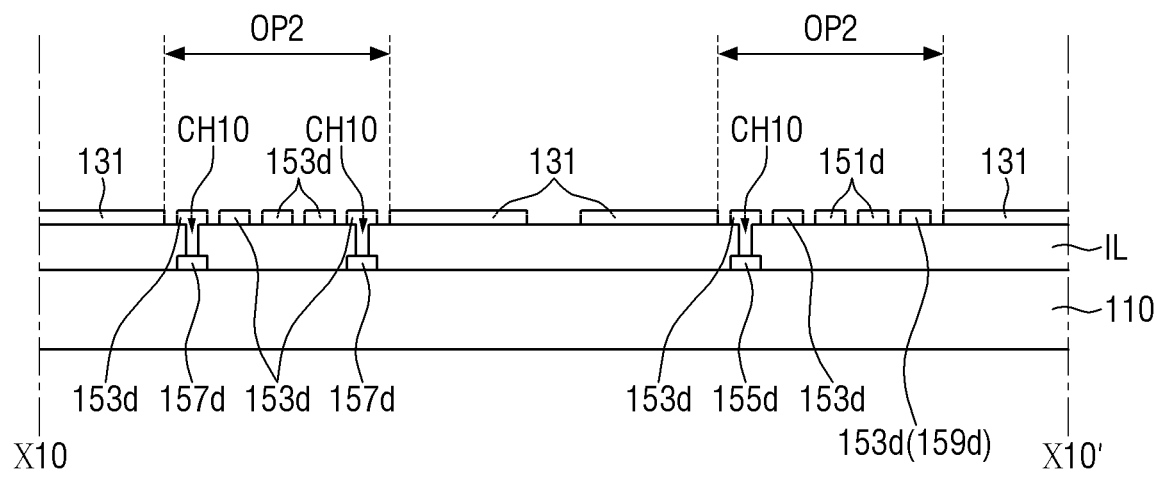
FIG. 23 is a cross-sectional view taken along line X10-X10' of FIG. 5.

FIG. 3 is a view of the touch sensor of FIG. 2, especially a plan view showing the sensor part of the touch sensor and the connective relationship between the sensor part and the controller. FIG. 4 is an enlarged plan view of the first strain gauge, the second strain gauge, the third strain gauge and the fourth strain gauge shown in FIG. 3. FIG. 5 is an enlarged plan view of portion Qa of FIG. 3. FIG. 6 is a view showing an example of a structure of a first layer of the sensor part shown in FIG. 5. FIG. 7 is an enlarged plan view of portion Q1 of FIG. 6. FIG. 8 is an enlarged plan view of portion Q2 of FIG. 6. FIG. 9 is an enlarged plan view of portion Q3 of FIG. 6. FIG. 10 is a plan view showing a modification of the example shown in FIG. 9. FIG. 11 is an enlarged plan view of portion Q4 of FIG. 6. FIG. 12 is a plan view showing a modification of the example shown in FIG. 11. FIG. 13 is a view showing an example of a structure of a second layer of the sensor part shown in FIG. 5. FIG. 14 is a cross-sectional view taken along line X1-X1' of FIG. 5. FIG. 15 is a cross-sectional view taken along line X2-X2' of FIG. 5. FIG. 16 is a cross-sectional view taken along line X3-X3' of FIG. 5. FIG. 17 is a cross-sectional view taken along line X4-X4' of FIG. 5. FIG. 18 is a cross-sectional view taken along line X5-X5' of FIG. 5. FIG. 19 is a cross-sectional view taken along line X6-X6' of FIG. 5. FIG. 20 is a cross-sectional view taken along line X7-X7' of FIG. 5. FIG. 21 is a cross-sectional view taken along line X8-X8' of FIG. 5. FIG. 22 is a cross-sectional view taken along line X9-X9' of FIG. 5. FIG. 23 is a cross-sectional view taken along line X10-X10' of FIG. 5.

Referring to FIGS. 3 to 23, the sensor part 100 includes a base layer 110, first electrode members 120, second electrode members 130, a first strain gauge 150*a*, a second strain gauge 150*b*, a third strain gauge 150*c* and a fourth strain gauge 150*d*, and may further include noise sensing electrode members 170. The sensor part 100 may further include a dummy electrode 190.

The base layer 110 may include the sensing area SA and the peripheral area NSA. The base layer 110 works as the base of the sensor part 100 and may be one of the constituent layers of the display panel 300 in some exemplary embodiments. For example, in the exemplary embodiment where the sensor part 100 and the display panel 300 are integrally formed, the base layer 110 may be at least one of the constituent layers of the display panel 300. For example, the base layer 110 may be a thin-film encapsulation layer of the display panel 300. Alternatively, in some exemplary embodiments, the base layer 110 may be a rigid substrate or a flexible substrate. For example, the base layer 110 may be a rigid substrate made of glass or tempered glass, or a flexible substrate made of a flexible plastic material in the form of a thin film. In the following description for the sake of convenience, it is assumed that the base layer 110 is composed of at least one the constituent layers of the display panel 300, e.g., a layer including the thin-film encapsulation layer, for example.

In the sensing area SA of the base layer 110, the first electrode members 120, the second electrode members 130 insulated from the first electrode members 120, the first strain gauge 150*a*, the second strain gauge 150*b*, the third strain gauge 150*c*, and the fourth strain gauge 150*d*, which are insulated from the first electrode members 120 and the second electrode members 130, may be disposed.

The first electrode members 120 may be extended in the first direction x and may be spaced apart from one another in the second direction y, as described above. Each of the first electrode members 120 spaced from one another in the second direction y may form an electrode row. In the example shown in FIG. 3, eight first electrode members 120 are arranged in the second direction y, including a first electrode row RE1, a second electrode row RE2, a third electrode row RE3, a fourth electrode row RE4, a fifth electrode row RE5, a sixth electrode row RE6, a seventh electrode row RE7 and an eighth electrode row RE8 arranged in this order in the second direction y. It is, however, to be understood that the present disclosure is not limited thereto. The number of the first electrode members 120 may vary as required.

The first electrode members 120 may include a plurality of first touch electrodes 121 arranged in the first direction x, and a plurality of first connecting parts 123 each electrically connecting first touch electrodes 121 that are adjacent to each other in the first direction x. In the following description of the exemplary embodiments, the term "connection" may encompass physical and/or electrical connection.

In some exemplary embodiments, the first touch electrodes 121 may be located in a first layer L1. The first touch electrodes 121 may have a diamond or rectangular shape, but are not limited thereto. The first touch electrodes 121 may have any of variety of shapes such as a triangle, other types of quadrangles, a pentagon, a circle and a bar.

The first touch electrodes 121 may include a conductive material. For example, the conductive material may include a metal or an alloy thereof. Examples of the metal may include gold (Au), silver (Ag), aluminum (Al), molybdenum (Mo), chrome (Cr), titanium (Ti), nickel (Ni), neodymium (Nd), copper (Cu), platinum (Pt), etc. In addition, the first touch electrodes 121 may be made of a transparent conductive material. Examples of the transparent conductive material may include silver nanowire (AgNW), indium tin oxide (ITO), indium zinc oxide (IZO), antimony zinc oxide (AZO), indium tin zinc oxide (ITZO), zinc oxide (ZnO) and tin oxide ($SnO_2$), carbon nano tube, graphene, etc.

In some exemplary embodiments, the first touch electrodes 121 may be made up of a single-layer structure or a multi-layer structure. When the first touch electrodes 121 have a multi-layer structure, the first touch electrodes 121 may include multiple metal layers. For example, the first touch electrodes 121 may have a triple-layer structure of titanium (Ti)/aluminum (Al)/titanium (Ti).

In some exemplary embodiments, the first touch electrodes 121 may have a mesh structure so that they are not seen by a user. When the first touch electrodes 121 have a mesh structure, the first touch electrodes 121 may be disposed such that they do not overlap with the light-emitting area of the display panel. In other words, a mesh hole overlapping with the light-emitting area may be defined in the first touch electrode 121 having the mesh structure.

In some exemplary embodiments, the first touch electrodes 121 spaced apart from one another in the second direction y may form the electrode columns. In the example shown in FIG. 3, eight first touch electrodes 121 are arranged in a single column, which form a first electrode column CE1, a second electrode column CE2, a third electrode column CE3, a fourth electrode column CE4, a fifth electrode column CE5, a sixth electrode column CE6, a seventh electrode column CE7 and an eighth electrode column CE8 arranged in the first direction x. It is, however, to be understood that the present disclosure is not limited thereto. The number of the electrode columns of the first touch electrodes 121 may vary as required.

Each of the first touch electrodes 121 may include a first opening OP1. For example, at least the center portion of each of the first touch electrodes 121 may be open, so that a layer disposed thereunder may be exposed through it. For example, when an insulating layer IL is disposed under the first touch electrodes 121, a part of the insulating layer IL may be exposed through the first opening OP1.

The first connecting parts 123 may electrically connect first touch electrodes 121 that are adjacent to each other in the first direction x and may come in contact with the first touch electrodes 121. In some exemplary embodiments, the first connecting parts 123 may be implemented as a bridge-type connecting pattern. In some exemplary embodiments, the first connecting parts 123 may be disposed in a second layer L2 different from the first layer L1 where the first touch electrodes 121 are disposed.

In some exemplary embodiments, the insulating layer IL may be disposed between the first touch electrodes 121 and the first connecting parts 123. In some exemplary embodiments, the first connecting parts 123 located in the second layer L2 may be disposed on the base layer 110, the insulating layer IL may be disposed over the first connecting parts 123, and the first touch electrodes 121 located in the first layer L1 may be disposed on the insulating layer IL. In addition, the first connecting parts 123 may be connected to and in contact with the first touch electrodes 121 through the first contact holes CH1 formed in the insulating layer IL.

The insulating layer IL may include an insulative material. In some exemplary embodiments, the insulating material may be an inorganic insulating material or an organic insulating material. The inorganic insulating material may include at least one of aluminum oxide, titanium oxide, silicon oxide, silicon oxynitride, zirconium oxide, and hafnium oxide. The organic insulating material may include at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin.

The first connecting part 123 may include a conductive material. In some exemplary embodiments, the first connecting part 123 may include the same material as the first touch electrodes 121, or may include at least one selected from the materials listed above as the materials of the first touch electrodes 121. In some exemplary embodiments, the first connecting parts 123 may be made up of either a single-layer or multiple layers. For example, the first connecting parts 123 may have a triple-layer structure of titanium (Ti)/aluminum (Al)/titanium (Ti). It is, however, to be understood that the present disclosure is not limited thereto. The first connecting parts 123 may be made of a material different that of the first touch electrodes 121.

Although the figure shows that each of the first connecting parts 123 is disposed between the first touch electrodes 121 adjacent to each other in the first direction x, the number of the first connecting parts 123 is not limited thereto. For example, two or more first connecting parts 123 may be disposed between two first touch electrodes 121 adjacent to each other in the first direction x.

The second electrode members 130 may be extended in the second direction y and may be spaced apart from one another in the first direction x, as described above. Each of the second electrode members 130 spaced from one another in the first direction x may form a column. In the example shown in FIG. 3, seven second electrode members 130 are arranged in the first direction x, including a first column CO1, a second column CO2, a third e column CO3, a fourth column CO4, a fifth column CO5, a sixth column CO6, and a seventh column CO7 arranged in the reverse first direction x. It is, however, to be understood that the present disclosure is not limited thereto. The number of the second electrode members 130 may vary as required.

The second electrode members 130 may include a plurality of second touch electrodes 131 arranged in the second direction y, and second connecting parts 133 electrically connecting second touch electrodes 131 that are adjacent to each other in the second direction y.

The second touch electrodes 131 may be electrically connected to one another in the second direction y. In addition, the second touch electrodes 131 may be spaced apart from one another in the first direction x.

In some exemplary embodiments, the second touch electrodes 131 spaced apart from one another in the first direction x may form rows. In the example shown in FIG. 3, seven second electrode members 131 are arranged in a single row, which form a first row RO1, a second row RO2, a third row RO3, a fourth row RO4, a fifth row RO5, a six row RO6, a seventh row RO7 and an eighth row RO8 arranged in the first direction x. It is, however, to be understood that the present disclosure is not limited thereto. The number of the rows of the second touch electrodes 131 may vary as required.

In some exemplary embodiments, each of the rows of the second touch electrodes 131 may be located between every two electrode rows of the first electrode members 120. For example, a first row RO1 may be located between the first electrode row RE1 and the second electrode row RE2, and a second row RO2 may be located between the second electrode row RE2 and the third electrode row RE3. That is to say, the rows of the second touch electrodes 131 and the rows of the first electrode members 120 may be repeatedly and alternately arranged in the second direction y.

Each of the second touch electrodes 131 may include a second opening OP2. For example, at least the center portion of each of the second touch electrodes 131 may be open, so that a layer disposed thereunder may be exposed through it. For example, when the insulating layer IL is disposed under the second touch electrodes 131, a part of the insulating layer IL may be exposed through the second opening OP2.

In some exemplary embodiments, the area of the second openings OP2 may be different from the area of the first openings OP1. For example, the area of the second openings OP2 may be larger than the area of the first openings OP1.

In some exemplary embodiments, the second touch electrodes 131 and the first touch electrodes 121 may be located on the same layer, i.e., the first layer L1. The second touch electrodes 131 may have, but are not limited to, a diamond shape when viewed from the top. The second touch electrodes 131 may have any of variety of shapes such as a triangle, a quadrangle other than a diamond, a pentagon, a circle and a bar.

The second connecting parts 133 may electrically connect the second touch electrodes 131 adjacent to each other in the second direction y and may come in contact with the second touch electrodes 131. In some exemplary embodiments, the second connecting parts 133 may be disposed in the same first layer L1 with the first touch electrodes 121 and the second touch electrodes 131.

The second connecting parts 133 may be insulated from and intersect with the first connecting parts 123. In some exemplary embodiments, the insulating layer IL may be disposed between the second connecting parts 133 and the first connecting parts 123.

The second touch electrodes 131 and the second connecting parts 133 may include a conductive material. In some exemplary embodiments, the second touch electrodes 131 and the second connecting parts 133 may be made of the same conductive material as the first touch electrodes 121.

In some exemplary embodiments, when the first touch electrodes 121 has a mesh structure, the second touch electrodes 131 and the second connecting parts 133 may have a mesh structure, like the first touch electrodes 121.

In some exemplary embodiments, the second electrodes 131 may be driving electrodes that receive a driving signal Ts for detecting a touch position, and the first electrodes 121 may be sensing electrodes that output a sensing signal Rs for detecting a touch position.

The first strain gauge 150a may be located in an electrode row of the first electrode members 120. For example, the first strain gauge 150a may be located in the first electrode row RE1.

The first strain gauge 150a may include a first resistance line 151a, a second resistance line 153a, a first connecting line 155a, a second connecting line 157a, and a first connecting pattern 159a.

The first resistance line 151a and the second resistance line 153a may be located in the first opening OP1 formed in each of the first touch electrodes 121 of the first electrode row RE1 and may be spaced apart from the first touch electrodes 121. In addition, the first resistance line 151a and the second resistance line 153a may be spaced apart from each other in the first opening OP1. In some exemplary embodiments, the first resistance line 151a and the second resistance line 153a may not overlap each other when viewed from the top.

The first resistance line 151a and the second resistance line 153a may meander in a predetermined pattern. When a pressure having a certain intensity is applied to the sensor part 100 of the touch sensor TSM, the length of the first resistance line 151a and/or the length of the second resistance line 153a is changed. Accordingly, the resistance value of the first strain gauge 151a is changed, and the intensity of the touch pressure can be determined based on the changed resistance value.

In some exemplary embodiments, each of the first resistance line 151a and the second resistance line 153a may have a shape that includes two or more bent portions and portions extended in a direction intersecting the first direction x and the second direction y, as shown in FIG. 9.

Alternatively, the shape of the first resistance line 151a and the shape of the second resistance line 153a may be variously changed.

In some exemplary embodiments, the first resistance line 151a and the second resistance line 153a may be located in the same first layer L1 with the first and second touch electrodes 121 and 131. For example, when the first touch electrodes 121 and the second touch electrodes 131 are disposed on the insulating layer IL, the first resistance line 151a and the second resistance line 153a may also be disposed on the insulating layer IL.

The first resistance line 151a may include a conductive material. In some exemplary embodiments, the first resistance line 151a may be made of the same material as the first and second touch electrodes 121 and 131.

When the first touch electrodes 121 and the second touch electrodes 131 have a mesh structure, the first resistance line 151a and the second resistance line 153a may be formed by removing a part of the mesh structure. When the first resistance line 151a and the second resistance line 153a are formed by removing a part of the mesh structure, in some exemplary embodiments, branch portions BPa may be further located in the first opening OP1, which are connected to the first resistance line 151a and/or the second resistance line 153a and are spaced apart from one another as shown in FIG. 10.

The branch portions BPa may be the remaining portions after a part of the mesh structure has been removed. The branch portions BPa may be spaced apart from the first touch electrodes 121 and may be disposed in the same first layer L1 with the first resistance line 151a and the second resistance line 153a and may be made of the same material as the first resistance line 151a and the second resistance line 153a.

The first connecting line 155a may electrically connect first resistance lines 151a that are adjacent to each other in the first direction x and may come in contact with the first resistance line 151*a*. The second connecting line 157*a* may electrically connect second resistance lines 153*a* that are adjacent to each other in the first direction x and may come in contact with the second resistance line 153*a*. The first connecting line 155*a* and the second connecting line 157*a* may be spaced apart from each other with no contact with the first electrode member 120 and the second electrode member 130. In some exemplary embodiments, the first connecting line 155*a* and the second connecting line 157*a* may be located in the same second layer L2 with the first connecting part 123*a* and may be made of the same material as the first connecting part 123*a*.

In some exemplary embodiments, the insulating layer IL may be disposed between the first resistance line 151*a* and the first connecting line 155*a* and between the second resistance line 153*a* and the second connecting line 157*a*. For example, the first resistance line 151*a* and the second resistance line 153*a* may be disposed on the insulating layer IL, and the first connecting line 155*a* and the second connecting line 157*a* may be disposed under the insulating layer IL.

The first resistance line 151*a* and the first connecting line 155*a* may be connected to each other and in contact with each other through a third contact hole CH3 formed in the insulating layer IL. The second resistance line 153*a* and the second connecting line 157*a* may be connected to each other and in contact with each other through a fourth contact hole CH4 formed in the insulating layer IL.

In some exemplary embodiments, the first connecting pattern 159*a* may be located in the first opening OP1 formed in the first electrode row RE1 and the first electrode column CE1. That is to say, the first connecting pattern 159*a* may be disposed in the outermost first opening OP1 of the first electrode row RE1 in the first direction x. The first connecting pattern 159*a* may connect the first resistance line 151*a* with the second resistance line 153*a*. In some exemplary embodiments, the first connecting pattern 159*a* may be located in the first layer L1 with the first and second touch electrodes 121 and 131 and may include the same conductive material as the first and second touch electrodes 121 and 131.

The first strain gauge 150*a* including the first resistance line 151*a*, the first connecting line 155*a*, the second resistance line 153*a*, the second connecting line 157*a*, and the first connecting pattern 159*a* may have a shape that is extended from one side to another side of the sensing unit 100 in the first direction x and then is extended from the another side to the one side in the first direction x when viewed from the top. Accordingly, both ends of the first strain gauge 150*a* may be positioned adjacent to one side of the sensing area SA, for example, to the left side of the sensing area SA in FIG. 3.

The second strain gauge 150*b* may be positioned in a row of the second touch electrodes 131. For example, the second strain gauge 150*b* may be located in the first row RO1.

The second strain gauge 150*b* may include a third resistance line 151*b*, a fourth resistance line 153*b*, a third connecting line 155*b*, a fourth connecting line 157*b*, and a second connecting pattern 159*b*.

The third resistance line 151*b* and the fourth resistance line 153*b* may be positioned in the second opening OP2 formed in each of the second touch electrodes 131 of the first row RO1. The third resistance line 151*b* and the fourth resistance line 153*b* may be spaced apart from the second touch electrodes 131. The third resistance line 151*b* and the fourth resistance line 153*b* may be spaced apart from each other in the second opening OP2.

The third resistance line 151*b* and the fourth resistance line 153*b* may form a predetermined pattern. In some exemplary embodiments, each of the third resistance line 151*b* and the fourth resistance line 153*b* may have a shape that includes two or more bent portions and portions extended in a direction intersecting the first direction x and the second direction y, as shown in FIG. 11.

Alternatively, the shape of the third resistance line 151*b* and the shape of the fourth resistance line 153*b* may be variously changed.

In some exemplary embodiments, the third resistance line 151*b* and the fourth resistance line 153*b* may be located in the same first layer L1 with the first and second touch electrodes 121 and 131. The third resistance line 151*b* and the fourth resistance line 153*b* may include a conductive material, and in some exemplary embodiments, the first resistance line 151*a* may be made of the same material as the first and second touch electrodes 121 and 131.

In some exemplary embodiments, the third resistance line 151*b* and the fourth resistance line 153*b* may be formed by removing a part of the mesh structure. In such a case, branch portions BPb may be further located in the second opening OP2, which are connected to the third resistance line 151*b* and/or the fourth resistance line 153*b* and are spaced apart from one another as shown in FIG. 12.

The branch portions BPb may be the remaining portions after a part of the mesh structure has been removed. The branch portions BPb may be spaced apart from the second touch electrodes 131 and may be disposed in the same first layer L1 with the third resistance line 151*b* and the fourth resistance line 153*b* and may be made of the same material as the third resistance line 151*b* and the fourth resistance line 153*b*.

The third connecting line 155*b* may electrically connect between the third resistance lines 151*b* adjacent to each other in the first direction x and may come in contact with the third resistance line 151*b*. In addition, the fourth connecting line 157*b* may electrically connect between the fourth resistance lines 153*b* adjacent to each other in the first direction x and may come in contact with the fourth resistance line 153*b*.

The third connecting line 155*b* and the fourth connecting line 157*b* may be spaced apart from and not in contact with the first electrode members 120 and the second electrode members 130. In addition, the third connecting line 155*b* may be spaced apart from the fourth connecting line 157*b*. In some exemplary embodiments, the third connecting line 155*b* and the fourth connecting line 157*b* may be located in the same second layer L2 with the first connecting part 123*a* and may be made of the same material as the first connecting part 123*a*.

In some exemplary embodiments, the insulating layer IL may be disposed between the third resistance line 151*b* and the third connecting line 155*b* and between the fourth resistance line 153*b* and the fourth connecting line 157*b*. The fourth resistance line 151*b* and the third connecting line 155*b* may be connected to each other and in contact with each other through a fifth contact hole CH5 formed in the insulating layer IL. The fourth resistance line 153*b* and the fourth connecting line 157*b* may be connected to each other and in contact with each other through a sixth contact hole CH6 formed in the insulating layer IL.

In some exemplary embodiments, the second connecting pattern 159*b* may be located in the second opening OP2 located in the first row RO1 and the first column CO1. The second connecting pattern 159b may be located in the second opening OP2 and may connect the third resistance line 151b with the fourth resistance line 153b. In some exemplary embodiments, the second connecting pattern 159b may be located in the first layer L1 with the first and second touch electrodes 121 and 131 and may include the same conductive material as the first and second touch electrodes 121 and 131.

The third strain gauge 150c may be located in an electrode row of the first electrode members 120 and may be located in a different electrode row than the first strain gauge 150a. For example, the third strain gauge 150c may be located in the second electrode row RE2.

The third strain gauge 150c may include a fifth resistance line 151c, a sixth resistance line 153c, a fifth connecting line 155c, a sixth connecting line 157c, and a third connecting pattern 159c. The fifth resistance line 151c, the sixth resistance line 153c, the fifth connecting line 155c, the sixth connecting line 157c and the third connecting pattern 159c are substantially identical to the first resistance line 151a, the second connecting layer 153a, the first connecting line 155a, the second connecting line 157a and the first connecting pattern 159a, respectively; and, therefore, the redundant description will be omitted. Therefore, descriptions will focus on differences.

The fifth resistance line 151c and the sixth resistance line 153c may be located in the first opening OP1 formed in each of the first touch electrodes 121 of the second electrode row RE2 and may be spaced apart from the first touch electrodes 121. In addition, the fifth resistance line 151c and the sixth resistance line 153c may be spaced apart from each other in the first opening OP1.

In some exemplary embodiments, the fifth resistance line 151c and the sixth resistance line 153c may have substantially the same shape as the structure shown in FIG. 9 when viewed from the top. When the first touch electrodes 121 have a mesh structure, branch portions connected to the fifth resistance line 151c and the sixth resistance line 153c may be further disposed in the first opening OP1 of the second electrode row RE2, similarly to that shown in FIG. 10.

In some exemplary embodiments, the fifth resistance line 151c and the sixth resistance line 153c may be located in the first layer L1 with the first and second touch electrodes 121 and 131 and may include the same conductive material as the first and second touch electrodes 121 and 131.

The fifth connecting line 155c may electrically connect between the fifth resistance lines 151c adjacent to each other in the first direction x and may come in contact with the fifth resistance line 151c. In addition, the sixth connecting line 157c may electrically connect between the sixth resistance lines 153c adjacent to each other in the first direction x and may come in contact with the fourth resistance line 153b.

The fifth resistance line 151c and the fifth connecting line 155c may be connected to each other and in contact with each other through a seventh contact hole CH7 formed in the insulating layer IL. The sixth resistance line 153c and the sixth connecting line 157c may be connected to each other and in contact with each other through an eighth contact hole CH8 formed in the insulating layer IL.

In some exemplary embodiments, the fifth connecting line 155b and the sixth connecting line 157b may be located in the same second layer L2 with the first connecting part 123a and may be made of the same material as the first connecting part 123a.

In some exemplary embodiments, the third connecting pattern 159c may be located in the first opening OP1 formed in the second electrode row RE2 and the first electrode column CE1. The third connecting pattern 159c may connect the fifth resistance line 151c with the sixth resistance line 153c. In some exemplary embodiments, the third connecting pattern 159c may be located in the first layer L1 with the first and second touch electrodes 121 and 131 and may include the same conductive material as the first and second touch electrodes 121 and 131.

The fourth strain gauge 150d may be located in a row of the second touch electrodes 131 and may be located in a different row than the second strain gauge 150b. For example, the fourth strain gauge 150d may be located in the second row RO2.

The fourth strain gauge 150d may include a seventh resistance line 151d, an eighth resistance line 153d, a seventh connecting line 155d, an eighth connecting line 157d, and a fourth connecting pattern 159d.

The seventh resistance line 151d, the eighth resistance line 153d, the seventh connecting line 155d, the eighth connecting line 157d and the fourth connecting pattern 159d are substantially identical to the third resistance line 151b, the fourth resistance line 153b, the third connecting layer 155b, the fourth connecting line 157b and the second connecting line 159b, respectively; and, therefore, the redundant description will be omitted. Therefore, descriptions will focus on differences, and the redundant description will be omitted.

The seventh resistance line 151d and the eighth resistance line 153d may be located in the second opening OP2 in the second row RO2. The seventh resistance line 151d and the eighth resistance line 153d may be spaced apart from the second touch electrodes 131. The seventh resistance line 151d and the eighth resistance line 153d may be spaced apart from each other in the second opening OP2.

In some exemplary embodiments, the seventh resistance line 151d and the eighth resistance line 153d may have substantially the same shape as the structure shown in FIG. 11 when viewed from the top. When the first touch electrodes 121 have a mesh structure, branch portions connected to the seventh resistance line 151d and the eighth resistance line 153d may be further disposed in the second opening OP2 of the second row RO2, similarly to that shown in FIG. 12.

In some exemplary embodiments, the seventh resistance line 151d and the eighth resistance line 153d may be located in the first layer L1 with the first and second touch electrodes 121 and 131 and may include the same conductive material as the first and second touch electrodes 121 and 131.

The seventh connecting line 155d may electrically connect seventh resistance lines 151d that are adjacent to each other in the first direction x, and may come in contact with the seventh resistance line 151d. In addition, the eighth connecting line 157d may electrically connect eighth resistance lines 153d that are adjacent to each other in the first direction x, and may come in contact with the eighth resistance line 153d.

The seventh resistance line 151d and the seventh connecting line 155d may be connected to each other and in contact with each other through a ninth contact hole CH9 formed in the insulating layer IL. The eighth resistance line 153d and the eighth connecting line 157d may be connected to each other and in contact with each other through a tenth contact hole CH10 formed in the insulating layer IL.

In some exemplary embodiments, the seventh connecting line 155d and the eighth connecting line 157d may be located in the same second layer L2 with the first connecting part 123a and may be made of the same material as the first connecting part 123a.

In some exemplary embodiments, the fourth connecting pattern 159d may be located in the second opening OP2 located in the second row RO2 and the first column CO1. The fourth connecting pattern 159d may connect the seventh resistance line 151d with the eighth resistance line 153d. In some exemplary embodiments, the fourth connecting pattern 159d may be located in the first layer L1 with the first and second touch electrodes 121 and 131 and may include the same conductive material as the first and second touch electrodes 121 and 131.

Similar to the first strain gauge 150a, each of the second strain gauge 150b, the third strain gauge 150c and the fourth strain gauge 150d may be extended from one side to another side of the sensor part 100 in the first direction x and then extended from the another side to the one side in the first direction x. Accordingly, both ends of the second strain gauge 150b, both ends of the third strain gauge 150c and both ends of the fourth strain gauge 150d may be located adjacent to one side of the sensing area, for example, the left side of the sensing area SA in FIG. 3.

The dummy electrode 190 may be disposed in a row where neither the second strain gauge 150b nor the fourth strain gauge 150d are disposed among the second openings OP2 of the second touch electrodes 131. The dummy electrode 190 may be located in the second opening OP2. In the example shown in FIG. 3, the dummy electrodes 190 are disposed in the second openings OP2 located in the third row RO3, the fourth row RO4, the fifth row RO5, the sixth row RO6, the seventh row RO7 and the eighth row RO8. As the second opening OP2 is formed in each of the second touch electrodes 131, there may be a difference in the reflectance of the external light. As a result, the pattern may be seen from the outside of the display device 1 as a stain. In this regard, the dummy electrode 190 reduces the difference in the reflectance of the external light so that the pattern is less visible from the outside.

In some exemplary embodiments, the dummy electrode 190 may have the same shape as the second opening OP2. For example, if the second opening OP2 has a diamond shape, the dummy electrode 190 may also have a diamond shape.

The dummy electrode 190 may be disposed in the second opening OP2 and spaced apart from the second touch electrode 131. That is to say, the dummy electrode 190 may be an island-shaped conductive pattern. In some exemplary embodiments, the dummy electrode 190 may be floating.

The dummy electrode 190 may be located in the same first layer L1 with the first and second touch electrodes 121 and 131 and the first resistance line 151a and may be made of the same conductive material as the first and second touch electrodes 121 and 131 and the first resistance line 151a.

In some exemplary embodiments, when the second touch electrode 131 has a mesh structure, the dummy electrode 190 may also have a mesh structure, as shown in FIG. 8.

The noise sensing electrode members 170 may be positioned in the electrode rows of the first electrode members 120 and may be disposed on electrode rows different from the electrode rows where the first strain gauge 150a and the third strain gauge 150c are disposed. For example, the noise sensing electrode members 170 may be disposed in the third electrode row RE3, the fourth electrode row RE4, the fifth electrode row RE5, the sixth electrode row RE6, the seventh electrode row RE7 and the eighth electrode row RE8, and may be spaced from one another in the second direction y.

Each of the noise sensing electrode members 170 may include a noise sensing electrode 171 and a third connecting part 173.

The noise sensing electrode 171 may be disposed in the first opening OP1 of the first touch electrodes 121 and may be spaced apart from the first touch electrodes 121. In some exemplary embodiments, the noise sensing electrode 171 may be located in the same first layer L1 with the first touch electrodes 121 and may be made of the same material as the first touch electrodes 121.

In some exemplary embodiments, when the first touch electrodes 121 have a mesh structure, the noise sensing electrodes 171 may also have a mesh structure, as shown in FIG. 7.

In some exemplary embodiments, the area of the first opening OP1 may be smaller than the area of the second opening OP2, and accordingly the area of the noise sensing electrode 171 may be smaller than the area of the dummy electrode 190.

The third connecting part 173 may electrically connect two noise sensing electrodes 171 that are adjacent to each other in the first direction x among the noise sensing electrodes 171 located in the same electrode row. In some exemplary embodiments, the third connecting part 173 may be located in the same second layer L2 with the first connecting part 123, and may be made of the same material as the first connecting part 123.

In some exemplary embodiments, the noise sensing electrode 171 may be connected to the third connecting part 173 through a second contact hole CH2 formed in the insulating layer IL.

The third connecting part 173 may be spaced apart from the first electrode member 120, the second electrode member 130, the first strain gauge 150a, the second strain gauge 150b, the third strain gauge 150c and the fourth strain gauge 150d.

In some exemplary embodiments, lines 901, 903, 903', and 905 and signal lines 9111, 9112, 9113, 9114, 9115, 9116, 9117 and 9118 may be disposed in the peripheral area NSA of the base layer 110, as shown in FIG. 3.

For example, the lines 901, 903 and 905 may include first lines 901 connected to the respective first electrode members 120, second lines 903 connected to the respective second electrode members 130, third lines 903' connected to the other ends of the respective second electrode members 130, and fourth lines 905 connected to the respective noise sensing electrode members 170. As used herein, the other ends of the second lines 903 refer to the opposite side of the one ends of the second electrode members 130 to which the second lines 903 are connected. That is to say, the lines connected to the second electrode members 130 may have a double routing structure, and accordingly RC delay caused by the resistance of the second electrode members 130 and the like can be reduced. It is, however, to be understood that the present disclosure is not limited thereto. Unlike that shown in FIG. 3, the second lines 903 may be connected to one ends of the second electrode members 130 whereas no other lines may be connected to the other ends of the second electrode members 130. That is to say, in other exemplary embodiments, the lines connected to the second electrode members 130 may have a single routing structure.

The signal lines 9111, 9112, 9113, 9114, 9115, 9116, 9117 and 9118 may include the first signal line 9111, the second signal line 9112, the third signal line 9113, the fourth signal line 9114, the fifth signal line 9115, the sixth signal line 9116, the seventh signal line 9117, and the eighth signal line 9118.

The first signal line 9111 may be connected to one end of the first strain gauge 150a, and the second signal line 9112 may be connected to the other end of the first strain gauge 150*a*. The third signal line 9113 may be connected to one end of the second strain gauge 150*b*, and the fourth signal line 9114 may be connected to the other end of the second strain gauge 150*b*. The fifth signal line 9115 may be connected to one end of the third strain gauge 150*c*, and the sixth signal line 9116 may be connected to the other end of the third strain gauge 150*c*. The seventh signal line 9117 may be connected to one end of the fourth strain gauge 150*d*, and the eighth signal line 9118 may be connected to the other end of the first strain gauge 150*a*.

In some exemplary embodiments, the second signal line 9112 may be connected to the third signal line 9113, the fourth signal line 9114 may be connected to the fifth signal line 9115, and the sixth signal line 9116 may be connected to the seventh signal line 9117.

Pad portions TP1 and TP2 may be disposed on the peripheral area NSA of the base layer 110. The pad portions TP1 and TP2 may be electrically connected to the lines 901, 903 and 905 and the signal lines 9111, 9112, 9113, 9114, 9115, 9116, 9117 and 9118. The controller 200 may be electrically connected to the pad portions TP1 and TP2.

In some exemplary embodiments, the pad portions TP1 and TP2 may include a first pad portion TP1 and a second pad portion TP2 that are spaced apart from each other in the first direction x. For example, the first pad portion TP1 may be connected to the second line 903, the third line 903' and the fourth line 905. The second pad portion TP2 may be connected to the first line 901. In addition, the first pad portion TP1 may be connected to the first signal line 9111, the third signal line 9113, the fifth signal line 9115, the seventh signal line 9117 and the eighth signal line 9118. It is, however, to be understood that this is merely illustrative. For example and in the alternative, the first pad portion TP1 and the second pad portion TP2 may not be spaced apart from each other but may form a single pad portion. In addition, the lines and signal lines connected to the first pad portion TP1 and the second pad portion TP2 may be variously changed.

In the touch sensor TSM according to the above-described exemplary embodiment of the present disclosure, the first touch electrodes 121, the second touch electrode 131, the first resistance line 151*a*, the second resistance line 153*a*, the third resistance line 151*b*, the fourth resistance line 153*b*, the fifth resistance line 151*c*, the sixth resistance line 153*c*, the seventh resistance line 151*d* and the eighth resistance line 153*d* are located in the same first layer L1, and thus there are advantages in that they can be produced simultaneously during the same process, and that the fabricating process can become simpler. In addition, as the first touch electrode 121, the second touch electrode 131, the first resistance line 151*a*, the second resistance line 153*a*, the third resistance line 151*b*, the fourth resistance line 153*b*, the fifth resistance line 151*c*, the sixth resistance line 153*c*, the seventh resistance line 151*d* and the eighth resistance line 153*d* are located in the same first layer L1, there is an advantage in that the touch sensor TSM can have the pressure sensing capability with the reduced thickness.

In addition, as the connecting lines 155*a*, 157*a*, 155*b*, 157*b*, 155*c*, 157*c*, 155*d* and 157*d* are located in the same second layer L2 with the first connecting parts 123, there are advantages in that the connecting lines 155*a*, 157*a*, 155*b*, 157*b*, 155*c*, 157*c*, 155*d* and 157*d* of the strain gauges 150 can be simultaneously formed in the same process and thus the fabricating process becomes simpler.

In addition, as the touch sensor TSM includes the noise sensing electrode members 170, it is possible to suppress malfunction of the touch sensor TSM and to improve the sensitivity of the sensor. In addition, as the noise sensing electrodes 171 are disposed in the first layer L1 and the third connecting parts 173 are disposed in the second layer L2, the fabricating process of the touch sensor TSM can become simpler, and the thickness of the touch sensor TSM can be reduced with the noise sensing capability.

In addition, as some of the signal lines 9111, 9112, 9113, 9114, 9115, 9116, 9117 and 9118 are connected to one another in the peripheral area NSA and only some of the signal lines are connected to the pad portions TP1 and TP2, the area of the peripheral area NSA occupied by the signal lines 9111, 9112, 9113, 9114, 9115, 9116, 9117 and 9118 can be reduced, and the area occupied by the pad portions (e.g., the first pad portion TP1) can be reduced.

In some other exemplary embodiments of the present disclosure, the structure of the touch sensor TSM, especially the positions of the first resistance line 151*a*, the second resistance line 153*a*, the third resistance line 151*b*, the fourth resistance line 153*b*, the fifth resistance line 151*c*, the sixth resistance line 153*c*, the seventh resistance line 151*d* and the eighth resistance line 153*d* may be altered.

Figure 24:
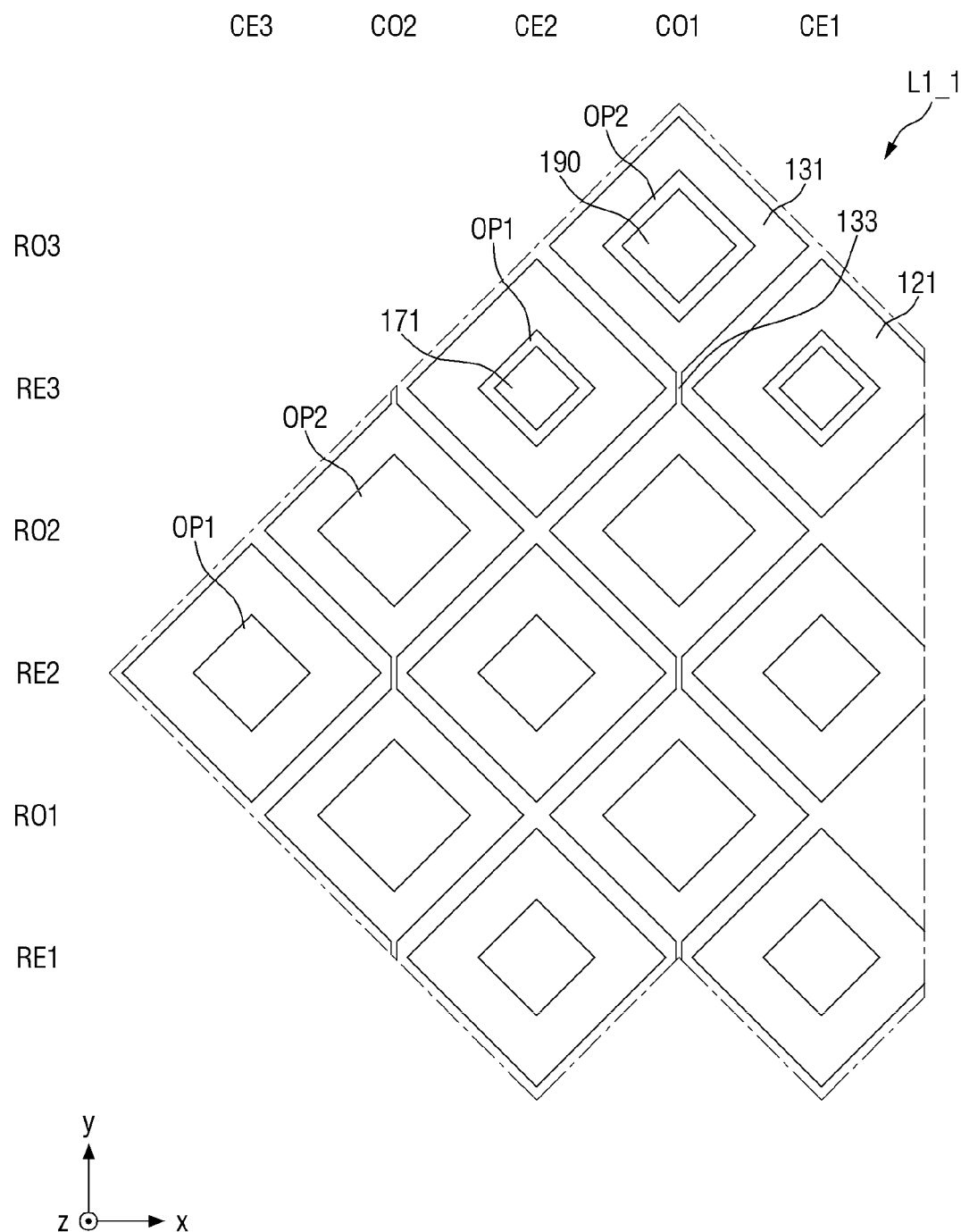
FIG. 24 is a view showing a structure of a first layer according to a modification of the example shown in FIG. 6.
Figure 25:
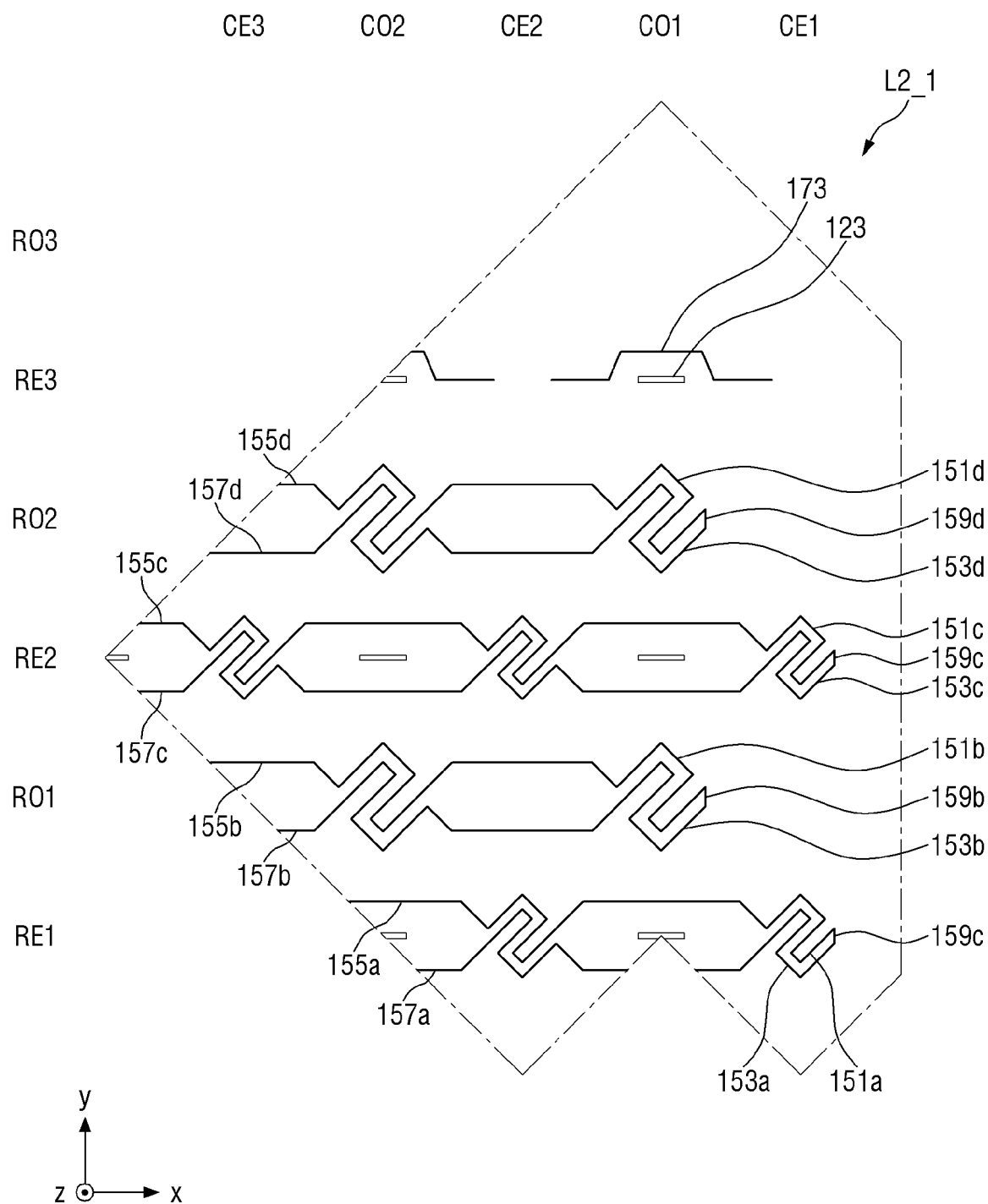
FIG. 25 is a view showing a structure of a second layer according to a modification of the example shown in FIG. 13.
Figure 26:
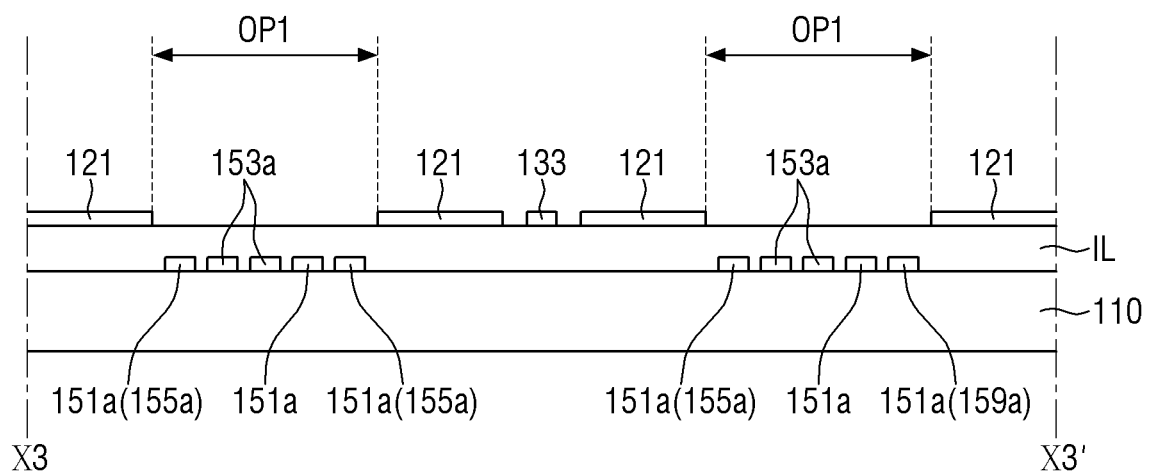
FIG. 26 is a cross-sectional view of a modification of the example shown in FIG. 16.
Figure 27:
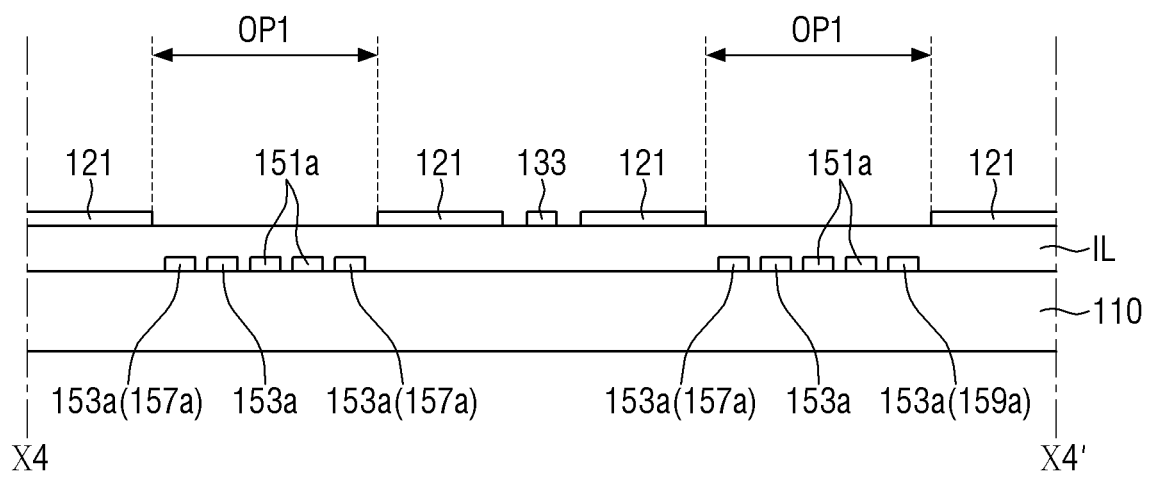
FIG. 27 is a cross-sectional view of a modification of the example shown in FIG. 17.
Figure 28:
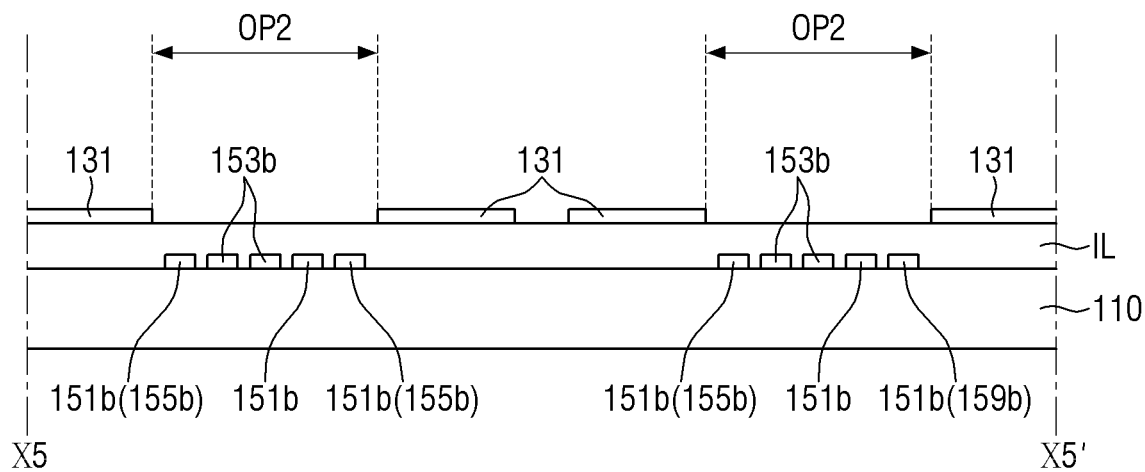
FIG. 28 is a cross-sectional view of a modification of the example shown in FIG. 18.
Figure 29:
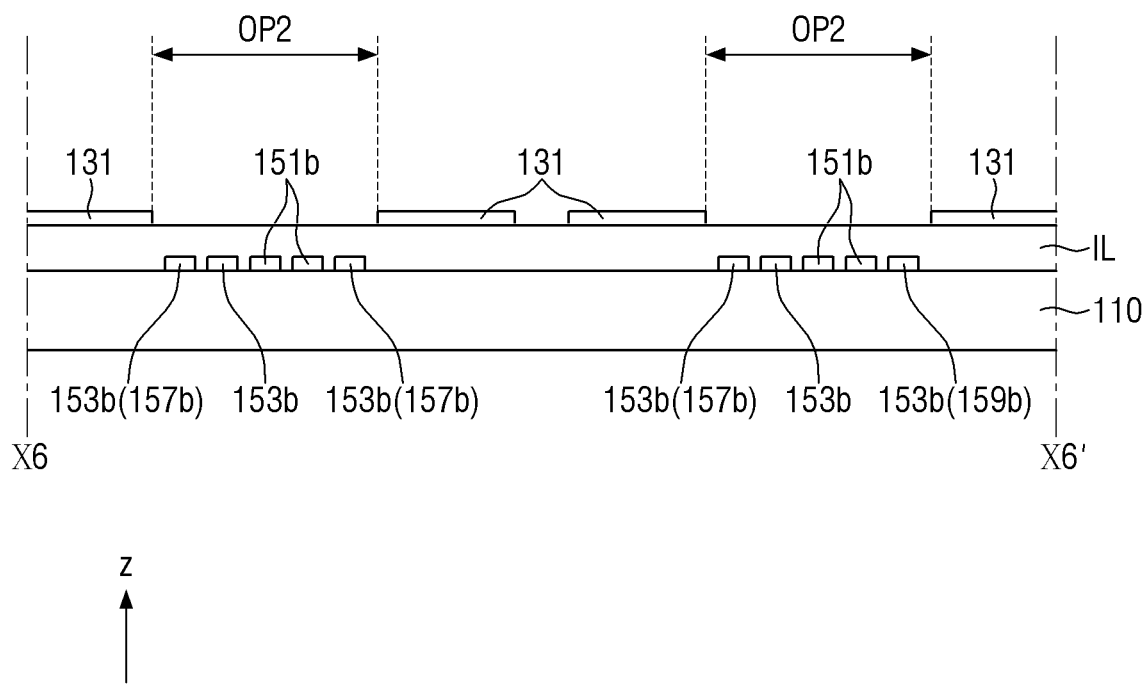
FIG. 29 is a cross-sectional view of a modification of the example shown in FIG. 19.
Figure 30:
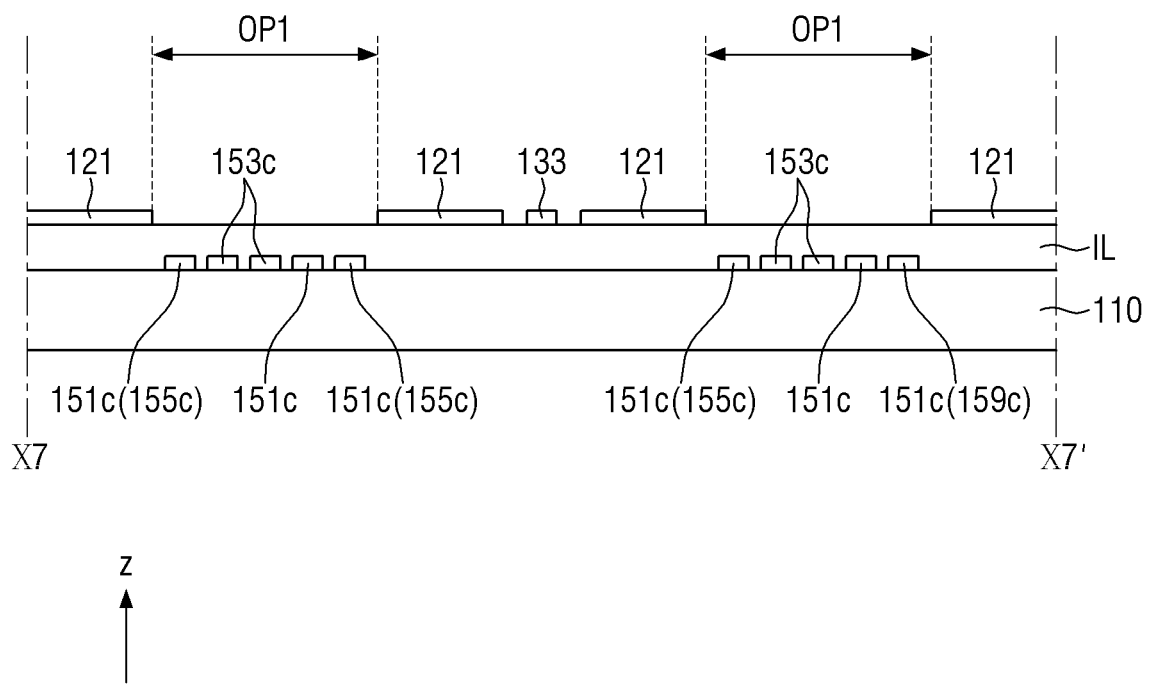
FIG. 30 is a cross-sectional view of a modification of the example shown in FIG. 20.
Figure 31:
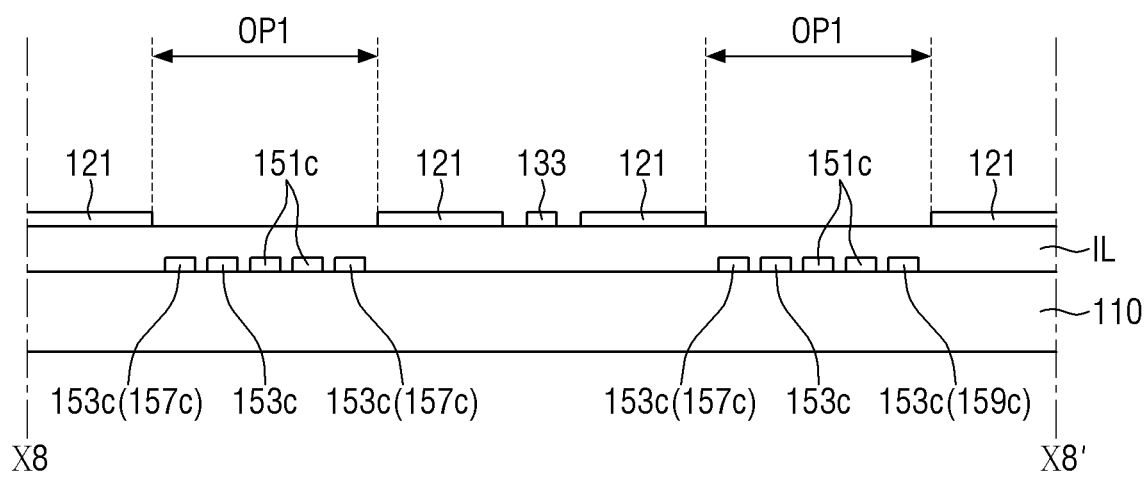
FIG. 31 is a cross-sectional view of a modification of the example shown in FIG. 21.
Figure 32:
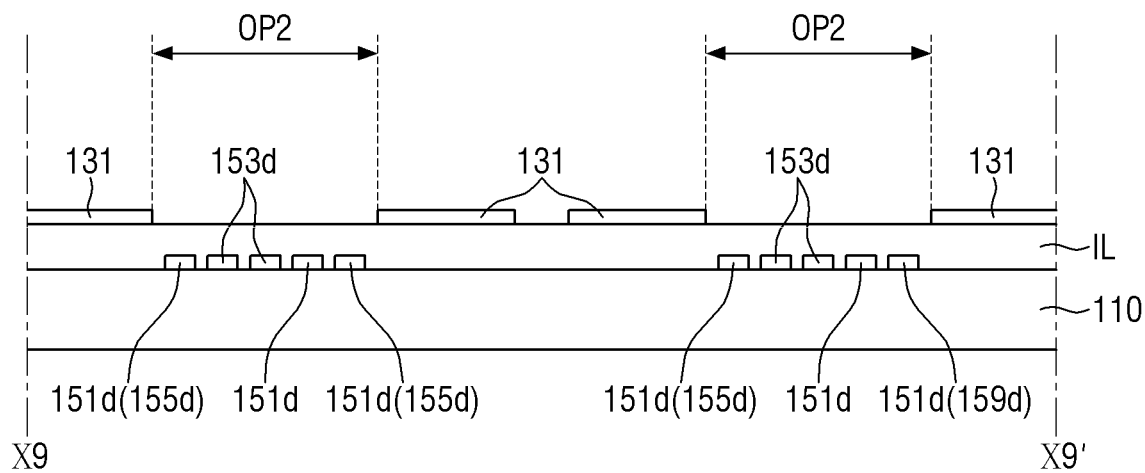
FIG. 32 is a cross-sectional view of a modification of the example shown in FIG. 22.
Figure 33:
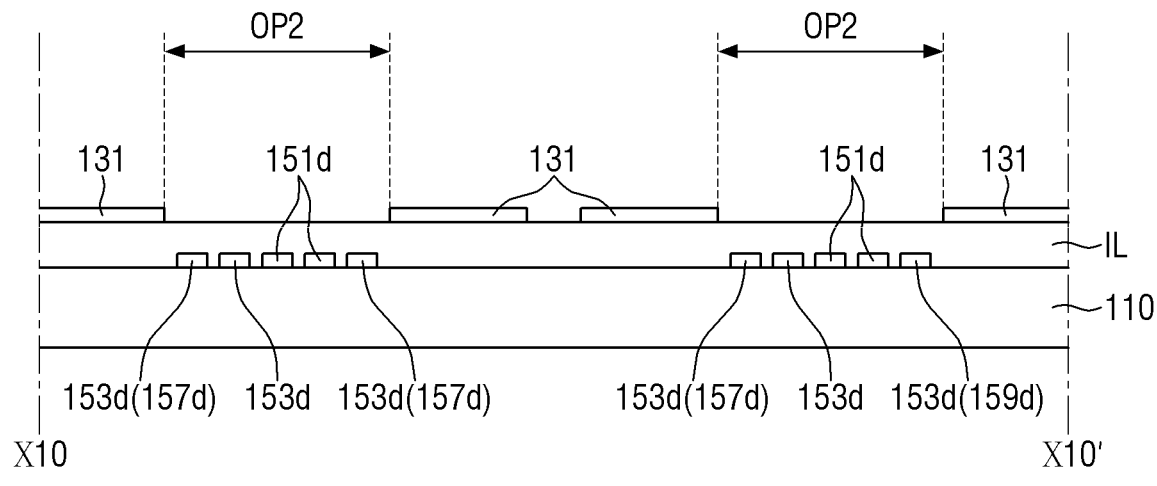
FIG. 33 is a cross-sectional view of a modification of the example shown in FIG. 23.

FIG. 24 is a view showing a structure of a first layer according to a modification of the example shown in FIG. 6. FIG. 25 is a view showing a structure of a second layer according to a modification of the example shown in FIG. 13. FIG. 26 is a cross-sectional view of a modification of the example shown in FIG. 16. FIG. 27 is a cross-sectional view of a modification of the example shown in FIG. 17. FIG. 28 is a cross-sectional view of a modification of the example shown in FIG. 18. FIG. 29 is a cross-sectional view of a modification of the example shown in FIG. 19. FIG. 30 is a cross-sectional view of a modification of the example shown in FIG. 20. FIG. 31 is a cross-sectional view of a modification of the example shown in FIG. 21. FIG. 32 is a cross-sectional view of a modification of the example shown in FIG. 22.

Referring to FIGS. 24 to 32, in some modifications, the first resistance line 151*a*, the second resistance line 153*a*, the third resistance line 151*b*, the fourth resistance line 153*b*, the fifth resistance line 151*c*, the sixth resistance line 153*c*, the seventh resistance line 151*d* and the eighth resistance line 153*d* may be disposed in a layer different from the first and second touch electrodes 121 and 131, unlike the examples shown in FIGS. 6 and 13 to 23. For example, the first touch electrodes 121 and the second touch electrode 131 may be disposed in a first layer L1_1, while the first resistance line 151*a*, the second resistance line 153*a*, the third resistance line 151*b*, the fourth resistance line 153*b*, the fifth resistance line 151*c*, the sixth resistance line 153*c*, the seventh resistance line 151*d* and the eighth resistance line 153*d* may be disposed in a second layer L2_1, where the connecting lines 155*a*, 157*a*, 155*b*, 157*b*, 155*c*, 157*c*, 155*d* and 157*d*, and the first connecting part 123 are disposed, and may be made of the same material as the connecting lines 155*a*, 157*a*, 155*b*, 157*b*, 155*c*, 157*c*, 155*d* and 157*d*, and the first connecting part 123.

According to the modification, the first connecting pattern 159*a*, the second connecting pattern 159*b*, the third connecting pattern 159*c* and the fourth connecting pattern 159*d* may be located in the same second layer L2_1 with the first connecting part 123 and may be made of the same material as the first connecting part 123.

Figure 34:
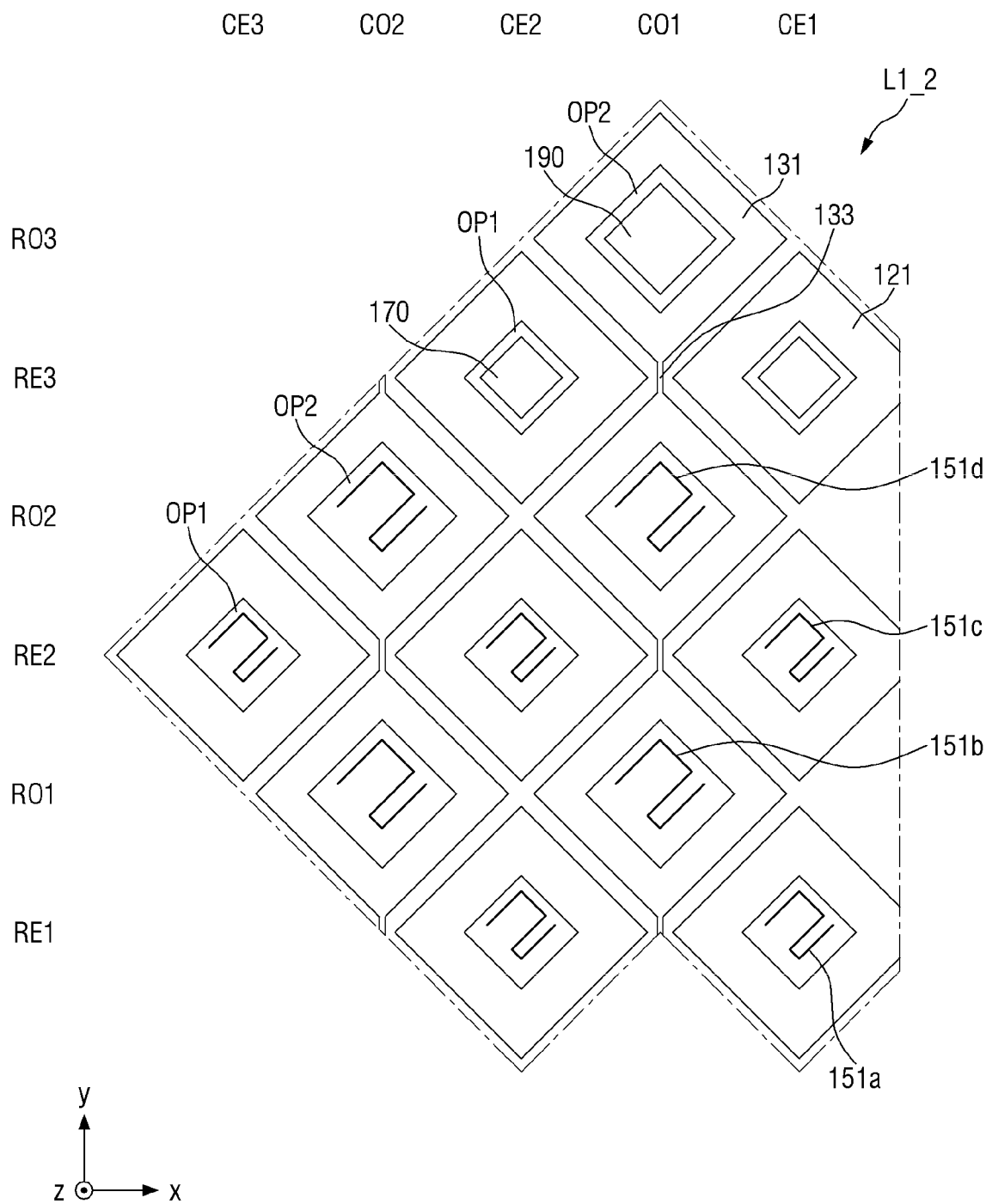
FIG. 34 is a view showing a structure of a first layer according to another modification of the example shown in FIG. 6.
Figure 35:
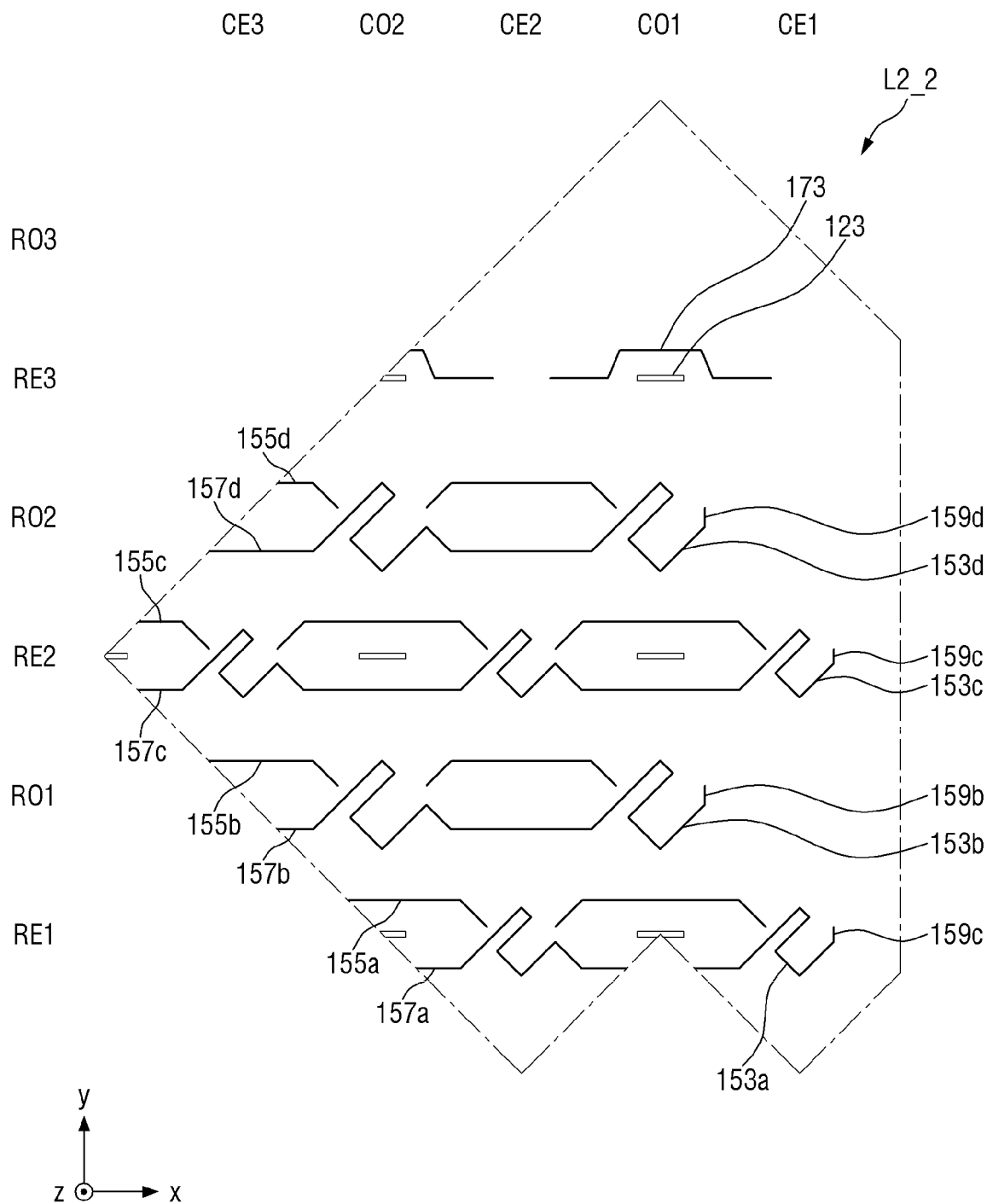
FIG. 35 is a view showing a structure of a second layer according to another modification of the example shown in FIG. 13.
Figure 36:
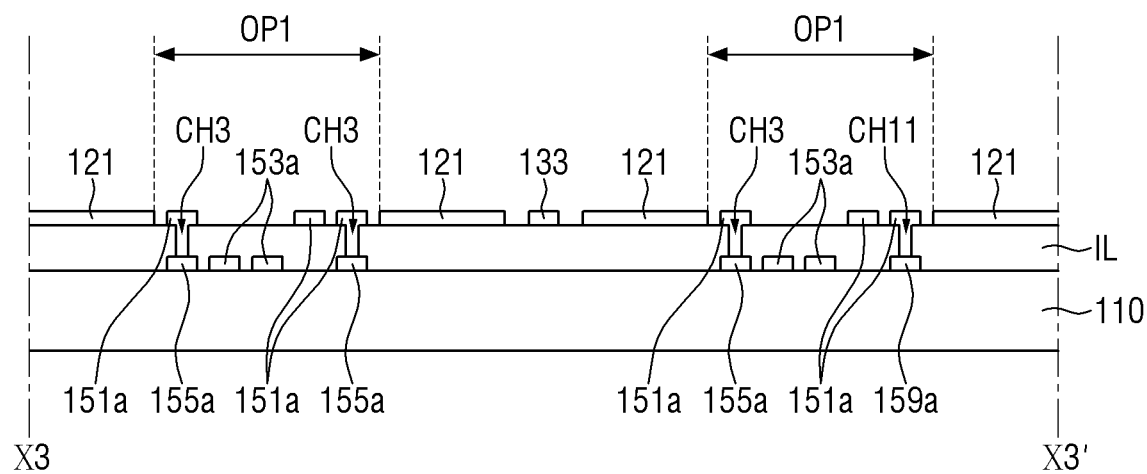
FIG. 36 is a cross-sectional view of another modification of the example shown in FIG. 16.
Figure 37:
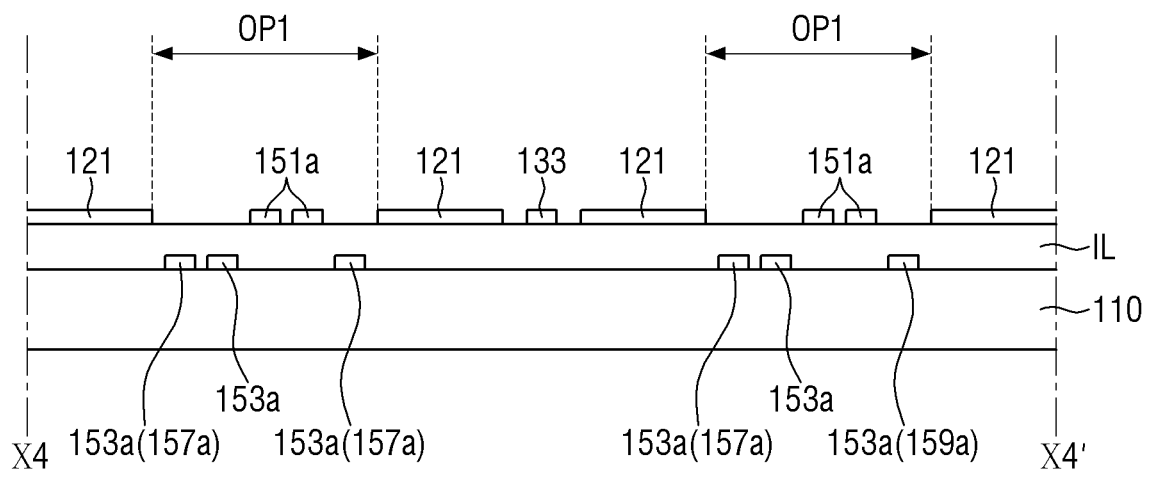
FIG. 37 is a cross-sectional view of another modification of the example shown in FIG. 17.
Figure 38:
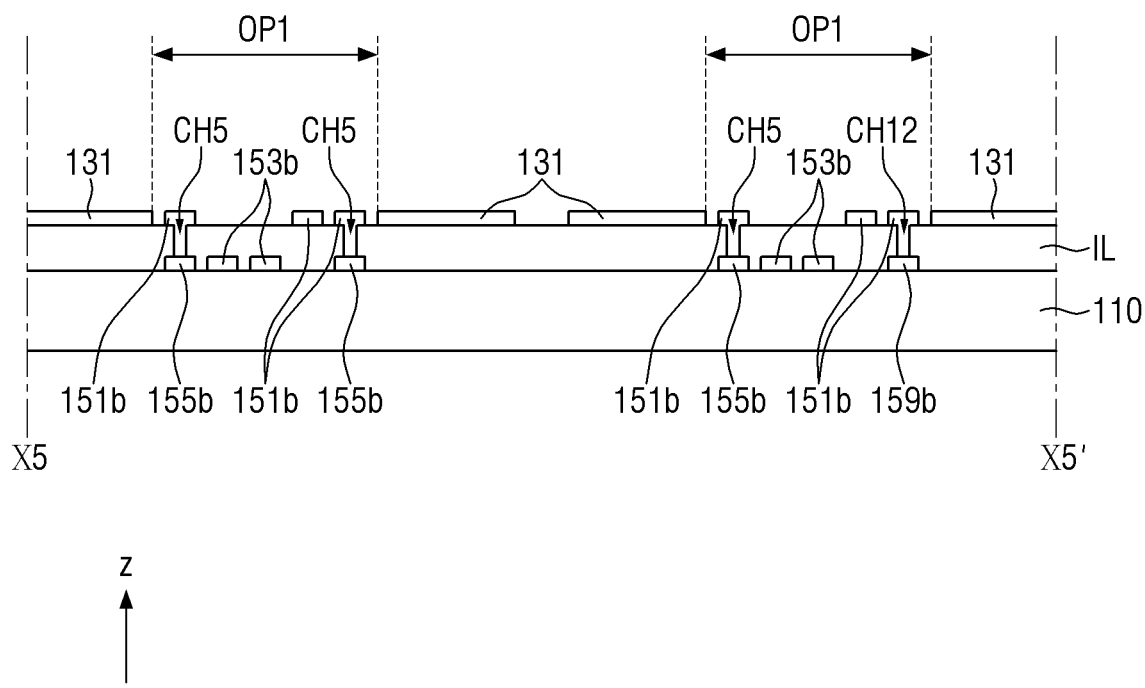
FIG. 38 is a cross-sectional view of another modification of the example shown in FIG. 18.
Figure 39:
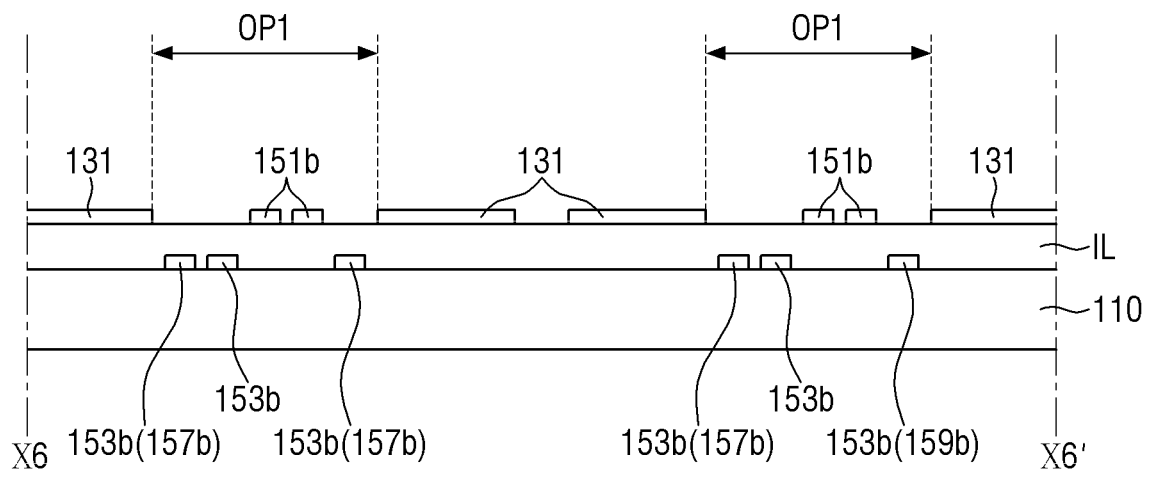
FIG. 39 is a cross-sectional view of another modification of the example shown in FIG. 19.
Figure 40:
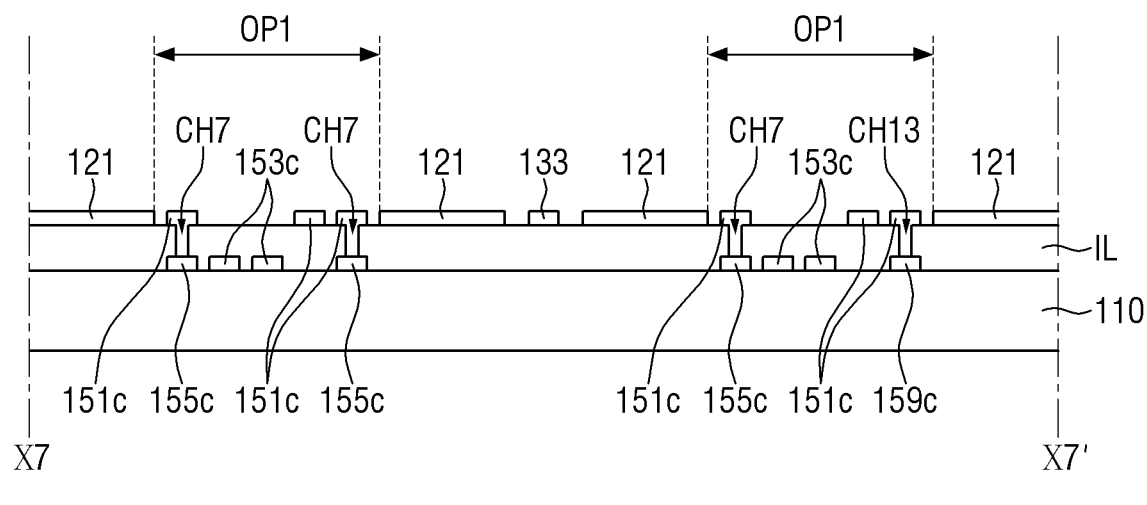
FIG. 40 is a cross-sectional view of another modification of the example shown in FIG. 20.
Figure 41:
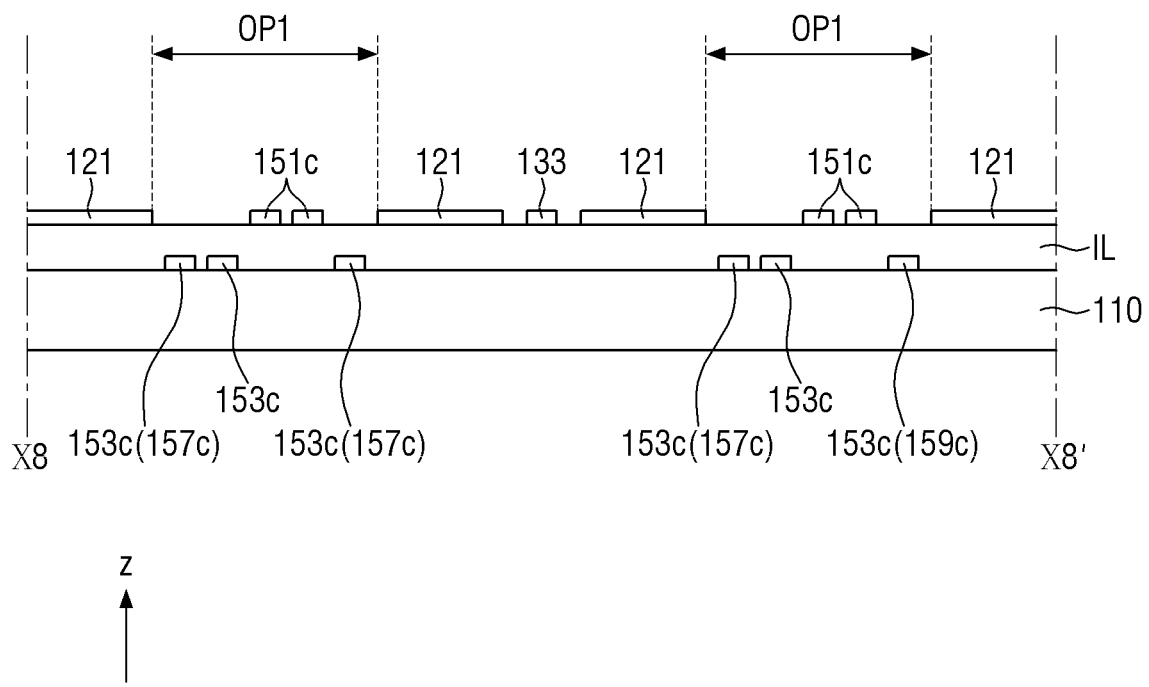
FIG. 41 is a cross-sectional view of another modification of the example shown in FIG. 21.
Figure 42:
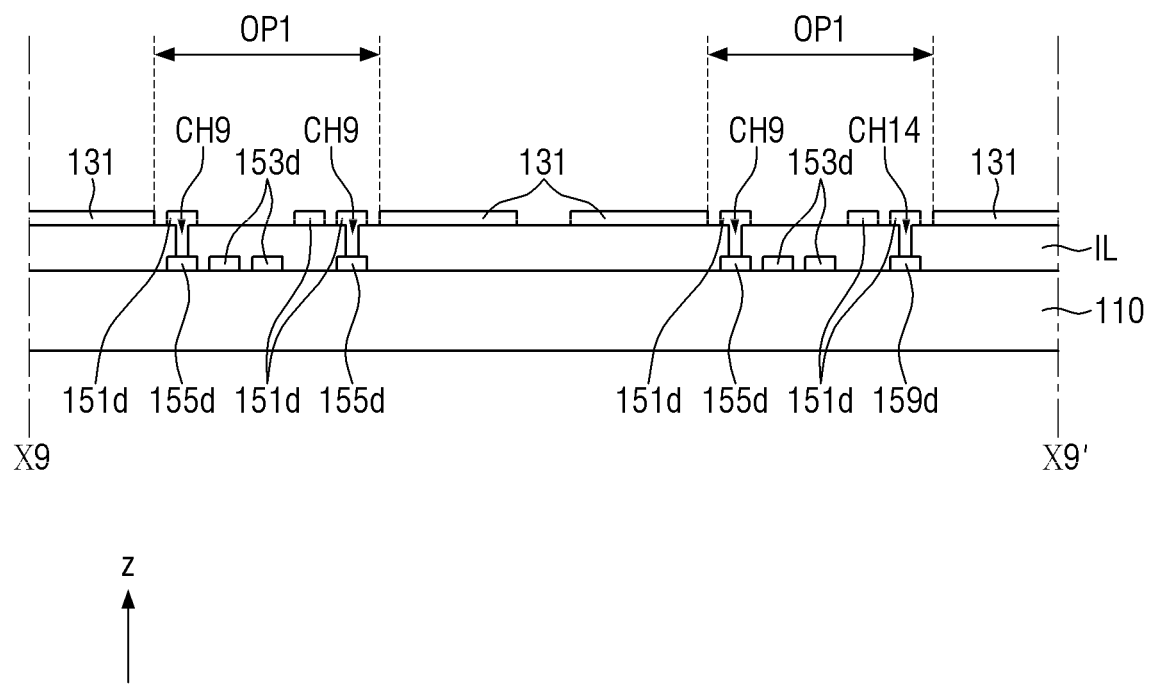
FIG. 42 is a cross-sectional view of another modification of the example shown in FIG. 22.
Figure 43:
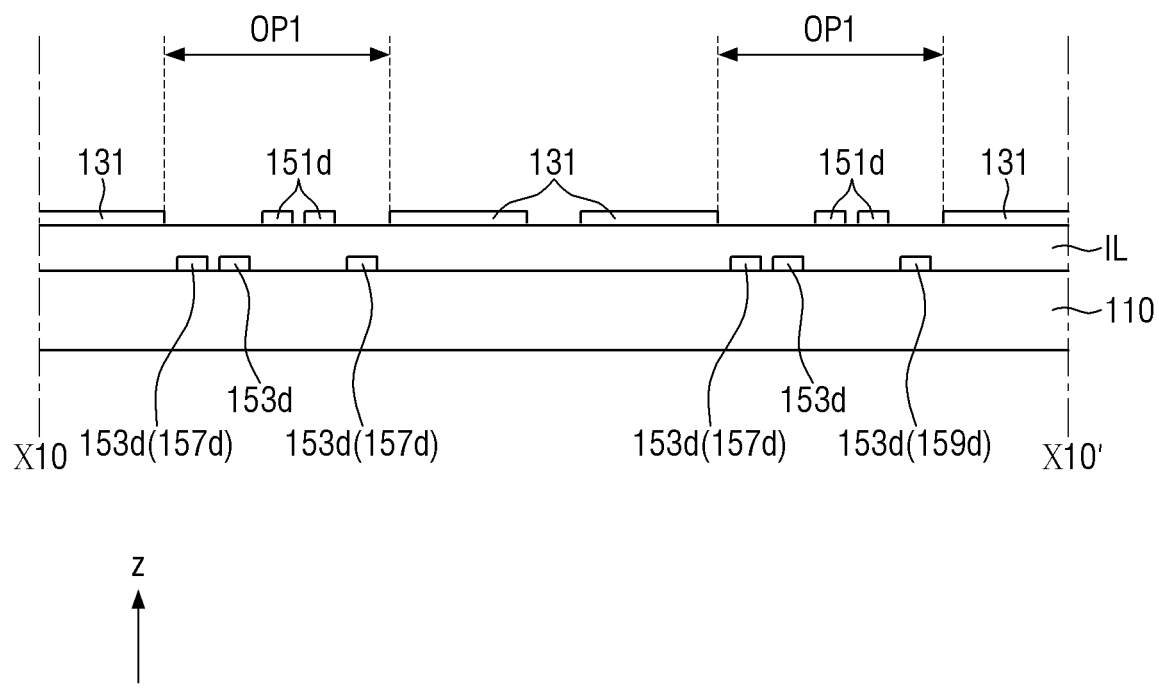
FIG. 43 is a cross-sectional view of another modification of the example shown in FIG. 23.

FIG. 34 is a view showing a structure of a first layer according to another modification of the example shown in FIG. 6. FIG. 35 is a view showing a structure of a second layer according to another modification of the example shown in FIG. 13. FIG. 36 is a cross-sectional view of another modification of the example shown in FIG. 16. FIG. 37 is a cross-sectional view of another modification of the example shown in FIG. 17. FIG. 38 is a cross-sectional view of another modification of the example shown in FIG. 18. FIG. 39 is a cross-sectional view of another modification of the example shown in FIG. 19. FIG. 40 is a cross-sectional view of another modification of the example shown in FIG. 20. FIG. 41 is a cross-sectional view of another modification of the example shown in FIG. 21. FIG. 42 is a cross-sectional view of another modification of the example shown in FIG. 22. FIG. 43 is a cross-sectional view of another modification of the example shown in FIG. 23.

Referring to FIG. 34 to 43, unlike the examples shown in FIGS. 6 and 13 to 23, in some other modifications, the first resistance line 151a, the third resistance line 151b, the fifth resistance line 151c and the seventh resistance line 151d may be located in the same first layer L1_2 with the first and second touch electrodes 121 and 131 and may be made of the same material as the first and second touch electrodes 121 and 131. The second resistance line 153a, the fourth resistance line 153b, the sixth resistance line 153c and the eighth resistance line 153d may be located in the same second layer L2_2 with the connecting lines 155a, 157a, 155b, 157b, 155c, 157c, 155d and 157d and the first connecting part 123 and may be made of the same material as the connecting lines 155a, 157a, 155b, 157b, 1556c, 157c, 155d and 157d and the first connecting part 123.

In some exemplary embodiments, when the first connecting part 123 and the first touch electrode 121 are made of different materials, the first resistance line 151a, the third resistance line 151b, the fifth resistance line 151c and the seventh resistance line 151d may be made of a different material from that of the second resistance line 153a, the fourth resistance line 153b, the sixth resistance line 153c and the eighth resistance line 153d.

In the drawings, the first resistance line 151a and the second resistance line 153a do not overlap with each other when viewed from the top. It is, however, to be understood that the present disclosure is not limited thereto. The first resistance line 151a and the second resistance line 153a are located in different layers and thus the first resistance line 151a and the fourth resistance line 153a overlap with each other. Besides, the overlapping relationship between the third resistance line 151b and the fourth resistance line 153b, the overlapping relationship between the fifth resistance line 151c and the sixth 151d and the eighth resistance line 153d may also be modified like the overlapping relationship between the first resistance line 151a and the second resistance line 153a.

According to this modification, the first connecting pattern 159a, the second connecting pattern 159b, the third connecting pattern 159c and the fourth connecting pattern 159d may also be located in the same second layer L2_2 with the first connecting part 123 and may be made of the same material as the first connecting part 123.

In the first electrode column CE1, the first resistance line 151a may be connected to the first connecting pattern 159a through an eleventh contact hole CH11 formed in the insulating layer IL, and the third resistance line 151c may be connected to the third connecting pattern 159c through a thirteenth contact hole CH13 formed in the insulating layer IL. In addition, in the first column CO1, the second resistance line 151b may be connected to the second connecting pattern 159b through a twelfth contact hole CH12 formed in the insulating layer IL, and the fourth resistance line 151d may be connected to the fourth connecting pattern 159d through a fourteenth contact hole CH14 formed in the insulating layer IL.

In addition to the above, the structure of the sensor part 100 may be variously modified.

For example, the first electrode row RE1 and the second electrode row RE2 have the structures shown in FIGS. 24 to 32, and the first row RO1 and the second row RO2 may be the structures shown in FIGS. 34 to 43. Alternatively, the first electrode row RE1 and the first row RO1 may have the structures shown in FIGS. 24 to 32, and the second electrode row RE2 and the second row RO2 may be the structures shown in FIGS. 34 to 43. Besides, the above-described exemplary embodiments may be combined and modified in a variety of ways.

Incidentally, according to some exemplary embodiments of the present disclosure, the base layer 110 of the sensor part 100 may be a thin-film encapsulation layer of the organic light-emitting display panel. In such a case, the base layer 110 may be implemented either as multiple layers including at least one organic layer and inorganic layer or as a single layer including a combination of organic materials. For example, the base layer 110 may be implemented as multiple layers including at least two inorganic layers and at least one organic layer interposed between the inorganic layers. As such, in the display device in which the base layer 110 is implemented as the thin-film encapsulation layer of the organic light-emitting display panel, the electrodes of the sensor part 100 and the elements of the display panel 300 may be disposed on different surfaces of the base layer 110.

Figure 44:
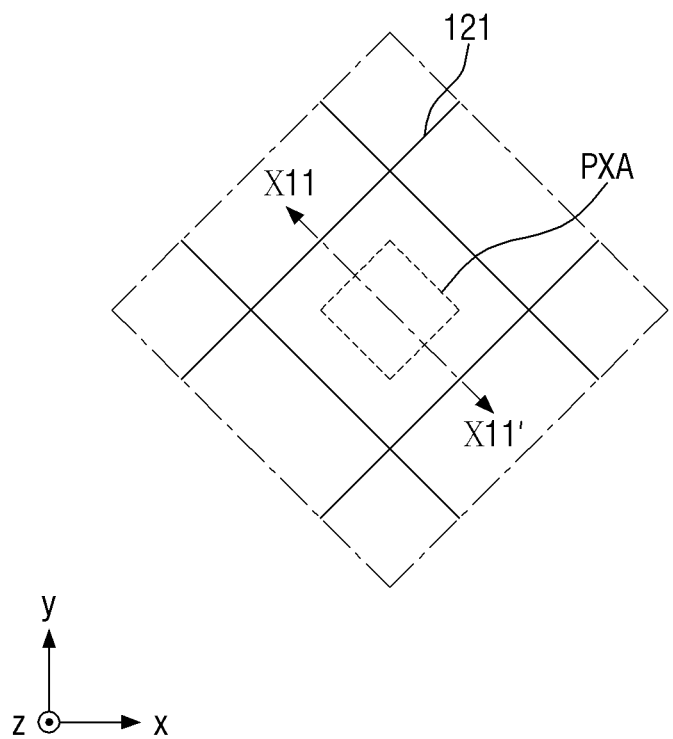
FIG. 44 is an enlarged plan view of portion Q5 of FIG. 5.
Figure 45:
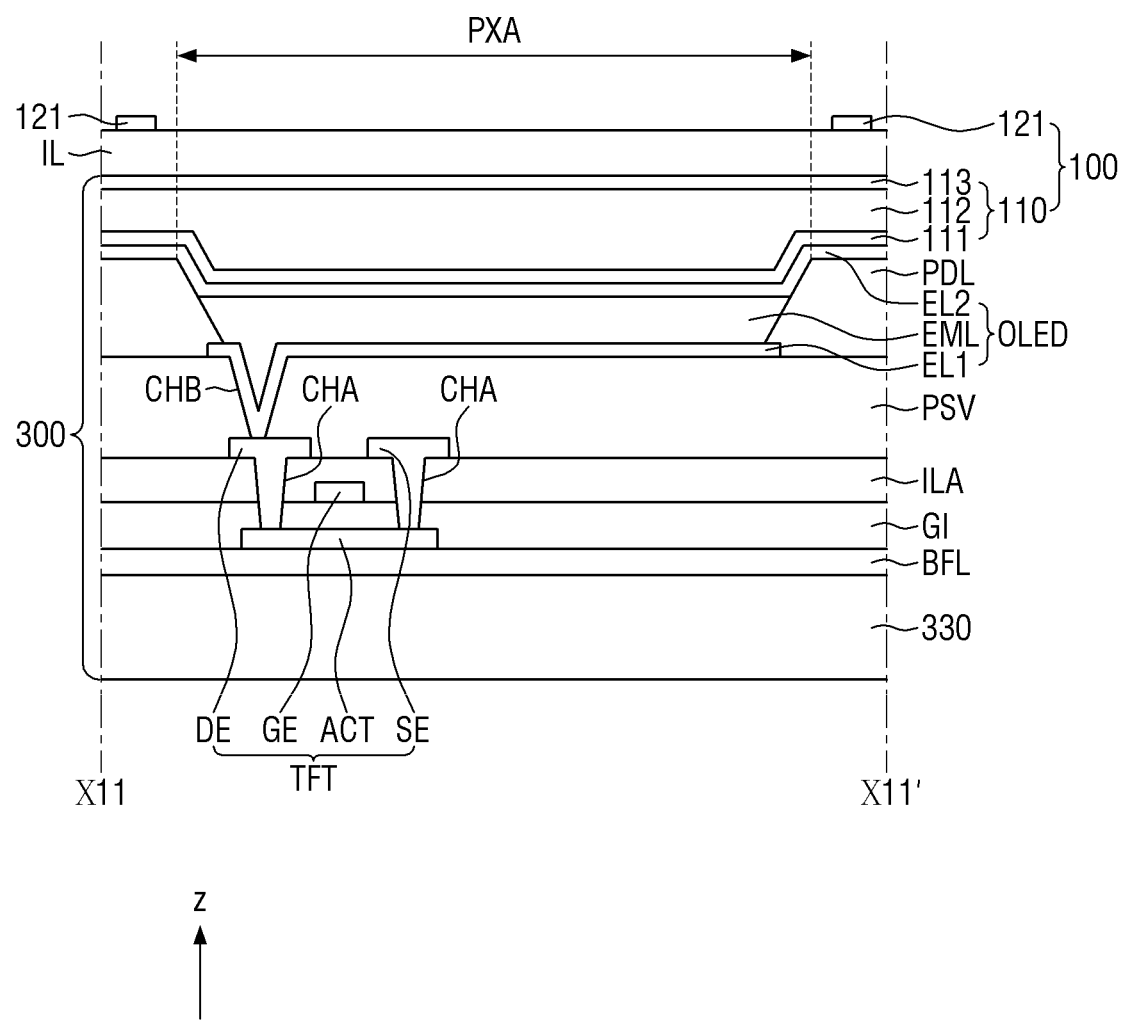
FIG. 45 is a cross-sectional view of an example of the sensor part and the display panel, taken along line X11-X11' in FIG. 44.

FIG. 44 is an enlarged plan view of portion Q5 of FIG. 6. FIG. 45 is a cross-sectional view of an example of the sensor part and the display panel, taken along line X11-X11' in FIG. 44.

Referring to FIGS. 44 and 45, the sensor part 100 may include the thin-film encapsulation layer of the display panel (e.g., an organic light-emitting display panel) 300 as a base layer 110. In other words, the display panel 300 and the sensor part 100 may be formed integrally. In the following description, the base layer 110 and the thin-film encapsulation layer are denoted by the same reference numerals. For convenience of illustration, FIG. 45 shows only a light-emitting element (e.g., an organic light-emitting diode, OLED) and a single thin film transistor (TFT) connected thereto among the elements disposed in each pixel of the display panel 300.

The display panel 300 includes a base substrate 330, a light-emitting diode OLED disposed on one surface of the base substrate 330, and a thin-film encapsulation layer 110 disposed over the light-emitting diode OLED to cover at least the light-emitting diode OLED. In addition, according to some exemplary embodiments, the display panel 300 may further include at least one thin film transistor (TFT) connected to the light-emitting diode OLED. The thin film transistor TFT may be disposed between the base substrate 330 and the light-emitting diode OLED.

Besides, the display panel 300 may further include one or more power supply lines, signal lines, and/or capacitors (not shown).

According to some exemplary embodiments of the present disclosure, the base substrate 330 may be a rigid substrate or a flexible substrate, and the material thereof is not particularly limited herein. For example, the base substrate 330 may be a thin film substrate having flexibility.

A buffer layer BFL is disposed on a surface of the base substrate 330. The buffer layer BFL can prevent impurities from diffusing from the base substrate 330 and can improve the flatness of the base substrate 330. The buffer layer BFL may be implemented as a single layer or as two or more layers. The buffer layer BFL may be an inorganic insulating layer made of an inorganic material. For example, the buffer layer BFL may be formed of silicon nitride, silicon oxide, silicon oxynitride, etc.

The thin-film transistor TFT is disposed on the buffer layer BFL. The thin-film transistor TFT includes an active layer ACT, a gate electrode GE, a source electrode SE and a drain electrode DE. According to some exemplary embodiments of the present disclosure, the active layer ACT is disposed on the buffer layer BFL and may be made of a semiconductor material. For example, the active layer ACT may be a semiconductor pattern made of polysilicon, amorphous silicon, oxide semiconductor, etc. A region (e.g., a region overlapping the gate electrode) of the active layer ACT may not be doped with impurities, while the rest region thereof may be doped with the impurities.

A gate insulating layer GI may be disposed on the active layer ACT, and the gate electrode GE may be disposed on the gate insulating layer GI. In addition, an interlayer dielectric layer ILA may be disposed on the gate electrode GE, and the source electrode SE and the drain electrode DE may be disposed on the interlayer dielectric layer ILA. The source electrode SE and the drain electrode DE may be in contact with and electrically connected to the active layer ACT through the respective contact holes CHA passing through the gate insulating layer GI and the interlayer dielectric layer ILA.

According to some exemplary embodiments of the present disclosure, a passivation layer PSV is disposed over the source electrode SE and the drain electrode DE. The passivation layer PSV may cover the thin film transistor TFT.

The light-emitting diode OLED is formed on the passivation layer PSV. The light-emitting diode OLED may include a first electrode EL1, a second electrode EL2 and an emissive layer EML interposed between the first electrode EL1 and the second electrode EL2. According to some exemplary embodiments of the present disclosure, the first electrode EL1 of the light-emitting diode OLED may be, but is not limited to, an anode electrode. The first electrode EL1 of the light-emitting diode OLED is in contact with and electrically connected to one electrode of the thin film transistor TFT, for example, the drain electrode DE via a contact hole CHB penetrating the passivation layer PSV.

A pixel-defining layer PDL for defining a light-emitting area PXA of each pixel is disposed on the side of the base substrate 330 on which the first electrode EL1 of the light-emitting diode OLED and the like are formed. The pixel-defining layer PDL may expose the upper surface of the first electrode EL1 and may protrude from the base substrate 330 along the periphery of each pixel area.

The emissive layer EML disposed in the light-emitting area PXA surrounded by the pixel-defining layer PDL. For example, the emissive layer EML may be disposed on the exposed surface of the first electrode EL1. According to some exemplary embodiments of the present disclosure, the emissive layer EML may have a multilayer thin-film structure including at least a light generation layer. For example, the emissive layer EML may include a hole injection layer, a hole transport layer, a light generation layer, a hole blocking layer (HBL), an electron transport layer (ETL) and an electron injection layer (EIL). According to some exemplary embodiments of the present disclosure, the color of light generated in the emissive layer EML may be, but is not limited to, one of red, green, and blue. For example, the color of light generated in the emissive layer EML may be one of magenta, cyan and yellow.

A second electrode EL2 of the light-emitting diode OLED may be disposed on the emissive layer EML. The second electrode EL2 of the light-emitting diode OLED may be a cathode electrode.

The thin-film encapsulation layer 110 covering the second electrode EL2 of the light-emitting diode OLED may be disposed on the second electrode EL2 of the light-emitting diode OLED. The thin-film encapsulation layer 110 seals the light-emitting diode OLED. The thin-film encapsulation layer 110 includes at least one inorganic layer (hereinafter referred to as an encapsulation inorganic layer). The thin-film encapsulation layer 110 may further include at least one organic layer (hereinafter referred to as an encapsulation organic layer). The encapsulation inorganic layer protects the light-emitting diode OLED from moisture/oxygen, and the encapsulation organic layer protects the light-emitting diode OLED from foreign substances such as dust particles. By sealing the light-emitting diode OLED by utilizing the thin-film encapsulation layer 110, the thickness of the display device may be reduced and the display device may have flexibility.

The thin-film encapsulation layer 110 may be made up of either multiple layers or a single layer. For example, the thin-film encapsulation layer 110 may include a first encapsulation inorganic layer 111, an encapsulation organic layer 112 and a second encapsulation inorganic layer 113 stacked on the second electrode EL2 in this order.

In some exemplary embodiments, each of the first encapsulation inorganic layer 111 and the second encapsulation inorganic layer 113 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, and the like.

In some embodiments of the present disclosure, the encapsulation organic layer 112 may be made of acrylic resin, methacrylic resin, polyisoprene, vinyl resin, epoxy resin, urethane resin, cellulose resin and perylene resin.

It is to be noted that the structure of the thin-film encapsulation layer 110 is not limited to the above example. The stack structure of the thin-film encapsulation layer 110 may be altered in a variety of ways.

The elements of the second layer L2 may be disposed on the thin-film encapsulation layer 110. The insulating layer IL may be disposed on the second layer L2 and the first layer L1 may be disposed on the insulating layer IL. In the drawings, the first touch electrodes 121 are shown as the elements of the first layer L1. As described above, the first touch electrodes 121 may have a mesh structure to prevent the first touch electrodes 121 from being visible to the user and may be disposed to overlap the light-emitting area PXA. In other words, a mesh hole overlapping with the light-emitting area PXA may be defined in each of the first touch electrodes 121 having the mesh structure.

In the display device 1 according to the above-described exemplary embodiment, the display panel 300 may be implemented as an organic light-emitting display panel having the thin-film encapsulation layer 110, on which the elements of the sensor part 100 are disposed. For example, the connecting lines 155*a*, 157*a*, 155*b*, 157*b*, 155*c*, 157*c*, 155*d* and 157*d*, the first connecting part 123 and the third connecting part 173 are disposed on the thin-film encapsulation layer 110 may be disposed on the thin-film encapsulation layer 110, the insulating layer IL may be disposed on them, and the first touch electrodes 121, the second touch electrode 131, the second connection portion 133 and the resistance lines 151a, 153a, 151b, 153b, 151c, 153c, 151d and 153d, the noise sensing electrode 171, the dummy electrode 190, etc. may be disposed on the insulating layer IL.

Hereinafter, an operation of detecting a touch position by the controller 200 will be described in detail with reference to FIG. 46.

Figure 46:
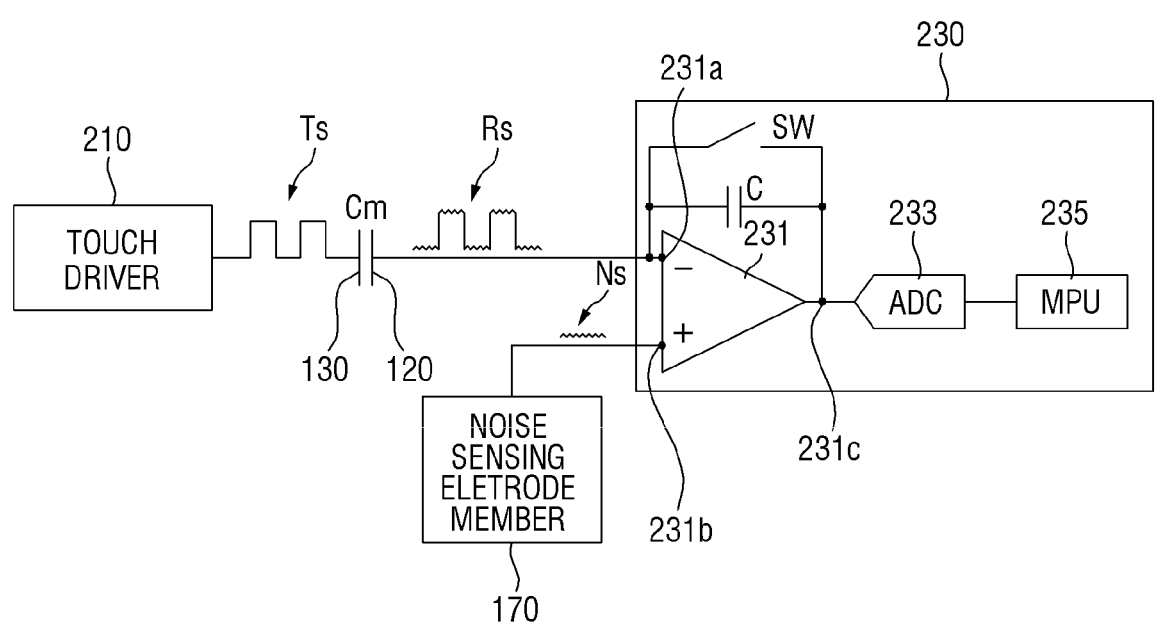
FIG. 46 is a view for illustrating an operation of detecting a touch position according to an exemplary embodiment of the present disclosure.

FIG. 46 is a view for illustrating an operation of detecting a touch position according to an exemplary embodiment of the present disclosure.

Referring to FIG. 46, the touch driver 210 may provide a driving signal Ts to the second electrode members 130 through the second line 903 and the third line 903' as shown in FIG. 3. In some exemplary embodiments, the driving signal Ts may be sequentially provided to each of the second electrode members 130.

The touch detector 230 may receive a sensing signal Rs from the first electrode members 120 through the first lines 901 as shown in FIG. 3. In some exemplary embodiments, the sensing signal Rs may contain information on the amount of the change in the mutual capacitance between the first electrode members 120 and the second electrode members 130, as described above. When the driving signal Ts is applied to the second electrode members 130, mutual capacitance Cm is formed between the second electrode members 130 and the first electrode members 120. When the touch input is made, the mutual capacitance Cm changes, and the sensing signal Rs may contain the information on the amount the changed mutual capacitance.

In some exemplary embodiments, the touch detector 230 may include at least one amplifier such as an operational (OP) amplifier, an analog-to-digital converter 233 and a processor 235.

The amplifier 231 may include a first input terminal 231a, a second input terminal 231b, and an output terminal 231c. According to some exemplary embodiments of the present disclosure, the first input terminal 231a of the amplifier 231, e.g., the inverting input terminal of the OP amplifier may be electrically connected to the first electrode members 120 via the first line 901. The sensing signal Rs may be input to the first input terminal 231a.

According to some exemplary embodiments of the present disclosure, the second input terminal 231b of the amplifier 231, e.g., the non-inverting input terminal of the OP amplifier may be electrically connected to the noise sensing electrode members 170 via the fourth line 905 as shown in FIG. 3. The sensing signal Rs may be input to the second input terminal 231b of the amplifier 231. Accordingly, a reference voltage of each amplifier 231 fluctuates together with the voltage fluctuation of the respective noise sensing electrode members 170. That is to say, the reference potential of each amplifier 231 may be varied according to the potential (voltage level) of the noise sensing electrode members 170.

The potential of the noise sensing electrode members 170 may be varied according to a noise signal introduced into the sensor part 100 from the display panel 300 or the like. For example, the potential of the noise sensing electrode members 170 may be varied in response to a common mode noise introduced into the sensor part 100 from the display panel 300 or the like.

Accordingly, by further disposing the noise sensing electrode member 170 in the sensing area SA and by changing the reference potential of the amplifier 231 using the noise sensing signal Ns sensed by the noise sensing electrode members 170, it is possible to remove or cancel the common mode noise introduced into the sensor part 100. Specifically, the first electrode member 120 and the noise sensing electrode member 170, which are the sensing electrode members, have corresponding ripples in response to the common mode noise. In particular, the first electrode member 120 and the noise sensing electrode member 170 are extended in the same direction and are arranged at positions corresponding to each other in the sensing area SA, so that they receive the noise signal of the same or very similar shape and/or size. In addition, the first electrode members 120 is electrically connected to the first input terminal 231a of the amplifier 231 via the first line 901, and the noise sensing electrode members 170 is electrically connected to the second input terminal 231b of the amplifier 231 via the fourth line 905 which is different from the first line 901. Therefore, the noise components (ripples) included in the sensing signal Rs received from the first electrode members 120 can be effectively canceled. Accordingly, the signal may be output from the output terminal 231c of the amplifier 231 after a noise is removed therefrom.

In some exemplary embodiments, a capacitor C and a reset switch SW may be connected in parallel between the first input terminal 231a and the output terminal 231c of the amplifier 231.

Although the amplifier 231 is implemented as a non-inverting amplifier in the above example, it is to be understood that the present disclosure is not limited thereto. In another exemplary embodiment, the amplifier 231 may be implemented as an inverting amplifier or the like.

The output terminal 231c of the amplifier 231 may be electrically connected to the analog-to-digital converter 233.

The analog-to-digital converter 233 can receive an analog signal to convert it into a digital signal. According to some exemplary embodiments of the present disclosure, the number of the analog-to-digital converters 233 may be equal to the number of the first electrode members 120. Alternatively, in another exemplary embodiment, the first electrode members 120 may share a single analog-to-digital converter 233. In such case, a switching circuit for channel selection may be additionally disposed.

The processor 235 processes the converted signal (digital signal) from the analog-to-digital converter 233 and detects a touch input based on results of the signal processing. For example, the processor 235 may comprehensively analyze the first sensing signal amplified by the amplifier 231 and converted by the analog-to-digital converter 233 to detect if there is a touch input and its position if any. According to some exemplary embodiments of the present disclosure, the processor 235 may be implemented as a microprocessor (MPU). In such case, a memory required for driving the processor 235 may be additionally disposed in the touch detector 230. It is to be noted that the configuration of the processor 235 is not limited thereto. As another example, the processor 235 may be implemented as a microcontroller (MCU) or the like.

The touch sensor TSM according to the above-described exemplary embodiment can effectively cancel the noise signal introduced from the display panel 300 or the like and can improve the signal-to-noise ratio (SNR). Accordingly, malfunction of the touch sensor TSM due to a noise signal can be suppressed, and the sensitivity can be improved.

Hereinafter, an operation of detecting a touch pressure by the controller 200 will be described in detail with reference to FIGS. 47 and 48.

Figure 47:
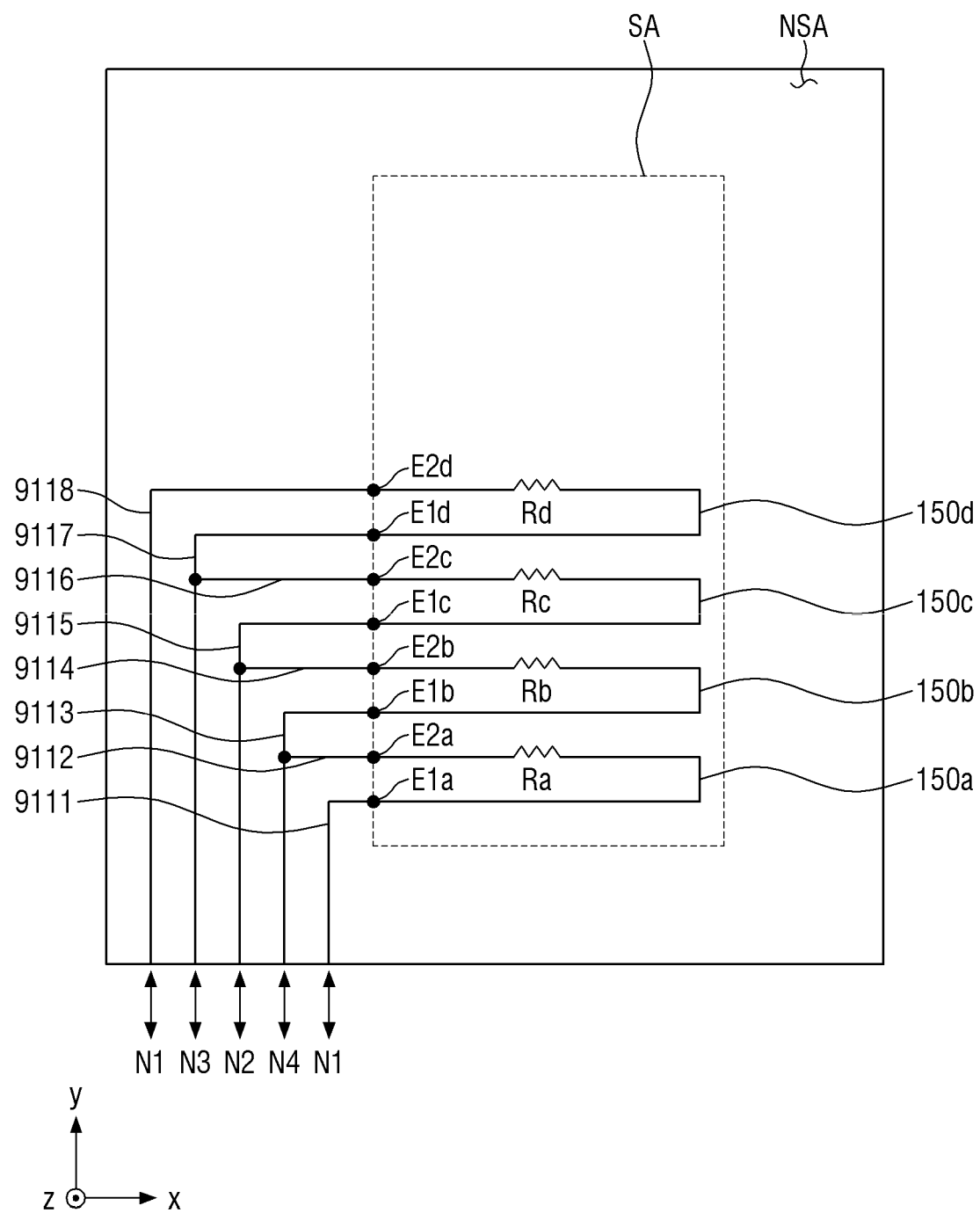
FIG. 47 is a plan view schematically showing the arrangement of the first strain gauge, the second strain gauge, the third strain gauge, the fourth strain gauge, the first to the eighth signal lines shown in FIG. 3 and the connection of the Wheatstone bridge circuit.

FIG. 47 is a plan view schematically showing the arrangement of the first strain gauge, the second strain gauge, the third strain gauge, the fourth strain gauge, the first to the eighth signal lines shown in FIG. 3 and the connection of the Wheatstone bridge circuit. FIG. 48 is a circuit diagram for illustrating an operation of detecting a touch pressure of a touch sensor according to an exemplary embodiment of the present disclosure, specifically showing the Wheatstone bridge circuit electrically connected to the first strain gauge, the second strain gauge, the third strain gauge and the fourth strain gauge shown in FIG. 47.

Figure 48:
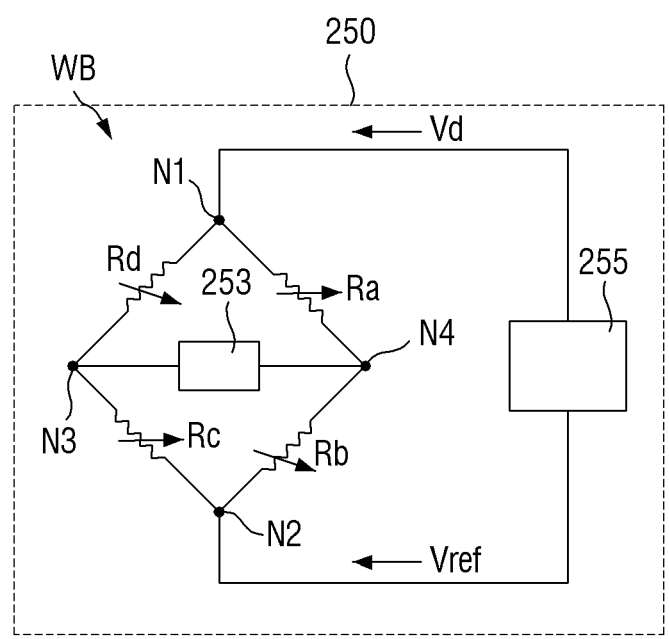
FIG. 48 is a circuit diagram for illustrating an operation of detecting a touch pressure of a touch sensor according to an exemplary embodiment of the present disclosure, specifically the Wheatstone bridge circuit electrically connected to the first strain gauge, the second strain gauge, the third strain gauge and the fourth strain gauge shown in FIG. 47.

Referring to FIGS. 47 and 48, the first strain gauge 150a may include one end E1a and another end E2a both located at one side of the sensing area SA. As described above, the end E1a of the first strain gauge 150a may be connected to the first signal line 9111 while the end E2a of the first strain gauge 150a may be connected to the second signal line 9112.

The second strain gauge 150b may include one end E1b and another end E2b both located at one side (e.g., the left side) of the sensing area SA. The end E1b of the second strain gauge 150b may be connected to the third signal line 9113 while the end E2b of the second strain gauge 150b may be connected to the fourth signal line 9114.

The third strain gauge 150c may include one end E1c and another end E2c both located at one side (e.g., the left side) of the sensing area SA. The end E1c of the third strain gauge 150c may be connected to the fifth signal line 9115 while the end E2c of the third strain gauge 150c may be connected to the sixth signal line 9116.

The fourth strain gauge 150d may include one end E1d and another end E2d both located at one side of the sensing area SA. The end E1d of the fourth strain gauge 150d may be connected to the seventh signal line 9117 while the end E2d of the fourth strain gauge 150d may be connected to the eighth signal line 9118.

In some exemplary embodiments, as shown in FIG. 47, the end E1a and the other end E2a of the first strain gauge 150a, the end E1b and the other end E2b of the second strain gauge 150b, the end E1c and the other end E2c of the third strain gauge 150c, and the end E1d and the other end E2d of the fourth strain gauge 150d may be all located on one side of the sensing area SA, e.g., the left side of the sensing area SA in the drawings.

As described above, in the periphery area NSA, the second signal line 9112 may be connected to the third signal line 9113, the fourth signal line 9114 may be connected to the fifth signal line 9115, and the sixth signal line 9116 may be connected to the seventh signal line 9117. As a result, the area occupied by the signal lines can be reduced.

The pressure detector 250 may include a Wheatstone bridge circuit WB.

The Wheatstone bridge circuit WB includes a first node N1, a second node N2, a first output node N3, and a second output node N4. In some exemplary embodiments, a driving voltage Vd may be applied to the first node N1, and a reference voltage Vref may be applied to the second node N2. For example, the reference voltage Vref may be a ground voltage.

In some exemplary embodiments, the Wheatstone bridge circuit WB may further include a first element 253 connected to the first output node N3 and the second output node N4, and a second element 255 connected to the first node N1 and the second node N2.

The first element 253 may sense the electrical flow between the first output node N3 and the second output node N4. For example, the first element 253 may be a current detector or a voltage measurer.

The second element 255 may be a voltage supply element for supplying a voltage to the first node N1 and the second node N2. In some exemplary embodiments, the second element 255 may provide a driving voltage Vd to the first node N1 and a reference voltage Vref to the second node N2.

The first strain gauge 150a, the second strain gauge 150b, the third strain gauge 150c and the fourth strain gauge 150d may be electrically connected to the Wheatstone bridge circuit WB.

More specifically, in some exemplary embodiments, the end E1a of the first strain gauge 150a may be electrically connected to the first node N1 via the first signal line 9111, and the other end E2a of the first strain gauge 150a may be connected to the second output node N4 via the second signal line 9112 and the third signal line 9113. In addition, the end E1b of the second strain gauge 150b may be electrically connected to the second output node N4 via the third signal line 9113, and the other end E2b of the second strain gauge 150b may be connected to the second output node N2 via the fourth signal line 9114 and the fifth signal line 9115. In addition, the end E1c of the third strain gauge 150c may be electrically connected to the second node N2 via the fifth signal line 9115, and the other end E2c of the third strain gauge 150c may be connected to the first output node N3 via the sixth signal line 9116 and the seventh signal line 9117. In addition, the end E1d of the fourth strain gauge 150d may be electrically connected to the first output node N3 via the seventh signal line 9117, and the other end E2d of the fourth strain gauge 150d may be connected to the first node N1 via the eighth signal line 9118.

According to this exemplary embodiment, the first strain gauge 150a, the second strain gauge 150b, the third strain gauge 150c and the fourth strain gauge 150d may be electrically connected to one another to form the Wheatstone bridge circuit WB, as described above.

In some exemplary embodiments, when no touch input is made or when no external force is applied, the resistance value Ra of the first strain gauge 150a, the resistance value Rb of the second strain gauge 150b, the resistance value Rc of the third strain gauge 150c and the resistance value Rd of the fourth strain gauge 150d may be substantially all equal.

When no touch input is made on the sensor part 100, the resistance value Ra of the first strain gauge 150a, the resistance value Rb of the second strain gauge 150b, the resistance value Rc of the third strain gauge 150c and the resistance value Rd of the fourth strain gauge 150d may remain equivalent. For example, a value obtained by multiplying the resistance value Ra of the first strain gauge 150a by the resistance value Rc of the third strain gauge 150c may be substantially equal to a value obtained by multiplying the resistance value Rb of the second strain gauge 150b by the resistance value Received of the fourth strain gauge 150d. That is to say, the voltage at the first output node N3 may be equal to the voltage at the second output node N4 while no touch input is made on the sensor part 100.

When a touch input is made on the sensor part 100, the shape of at least one of the first strain gauge 150a, the second strain gauge 150b, the third strain gauge 150c and the fourth strain gauge 150d may be deformed by the intensity of the touch. As the shape is deformed, at least one of the resistance value Ra of the first strain gauge 150a, the resistance value Rb of the second strain gauge 150b, the resistance value Rc of the third strain gauge 150c and the resistance value Rd of the fourth strain gauge 150d may be changed. As a result, a voltage difference is generated between the first output node N3 and the second output node N4. In addition, by measuring the voltage difference or the amount of current generated by the voltage difference with the first element 253, it is possible to detect the intensity of the touch or the pressure of the touch.

It is to be noted that the electric connection between the first to fourth strain gauges 150a, 150b, 150c and 150d and the Wheatstone bridge circuit WB1 may be altered in a variety of ways. For example, in FIG. 48, the position of the first strain gauge 150a may be interchanged with the position of the second strain gauge 150b.

That is to say, the touch sensor TSM according to the exemplary embodiment of the present disclosure can detect the position of a touch by using the first electrode members 120, the second electrode members 130 and the touch driver 210, and can detect the intensity of the pressure by using the first strain gauge 150a, the second strain gauge 150b, the third strain gauge 150c, the fourth strain gauge 150d, and the pressure detector 250.

The touch sensor TSM according to the exemplary embodiment of the present disclosure can detect the position of a touch by using the first electrode members 120, the second electrode members 130 and the touch driver 210, and can detect the magnitude of the pressure by using the strain gauges 150 and the pressure detector 250.

The strain gauges 150 of the touch sensor TSM may be used as an input device of various electronic devices including the display device 1. The strain gauges 150 may be used to replace a physical input button or be used in combination with a physical input button. For example, the strain gauges 150 and the pressure detector 250 can be used to detect the intensity of a pressure, and the pre-programmed operation of the display device 1 can be output according to the intensity of the pressure. For example, pre-programmed functions may be performed, such as locking the screen, unlocking the screen, switching a hardware element (e.g., sensors such as fingerprint sensor) from non-operating state to a standby mode or a wake-up mode, switching the screen, calling an application, running an application, capturing a picture, and receiving a phone call.

Figure 49:
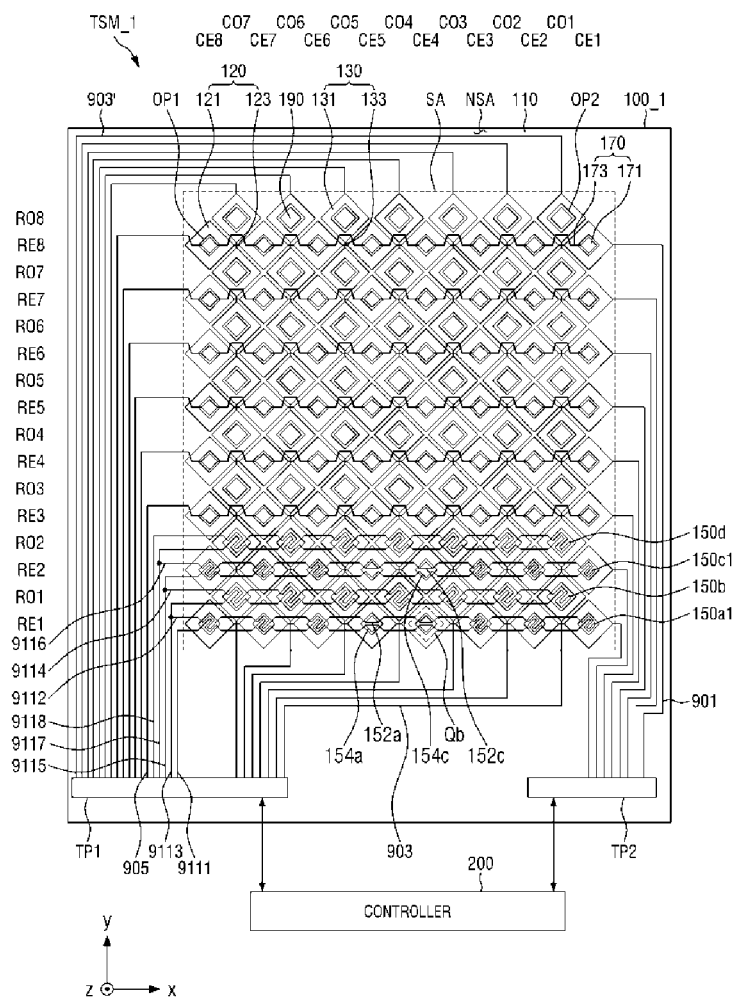
FIG. 49 is a plan view of a sensor part of a touch sensor according to another exemplary embodiment, showing a connection relationship between the sensor part and a controller.
Figure 50:
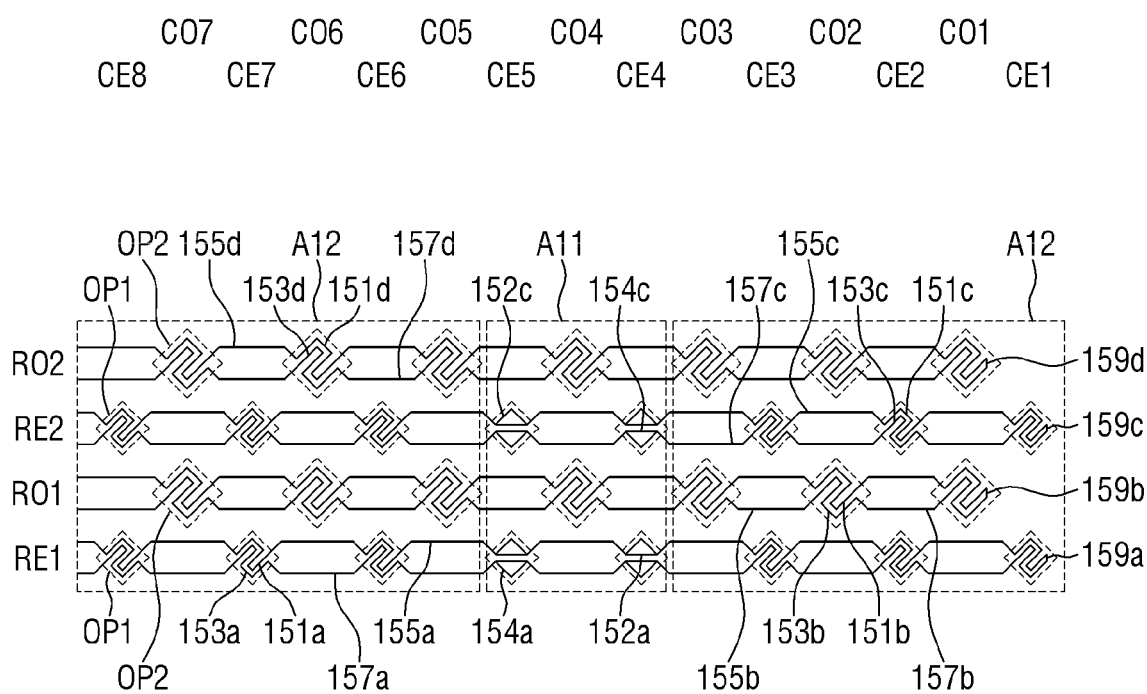
FIG. 50 is an enlarged plan view of the first strain gauge, the second strain gauge, the third strain gauge and the fourth strain gauge shown in FIG. 49.
Figure 51:
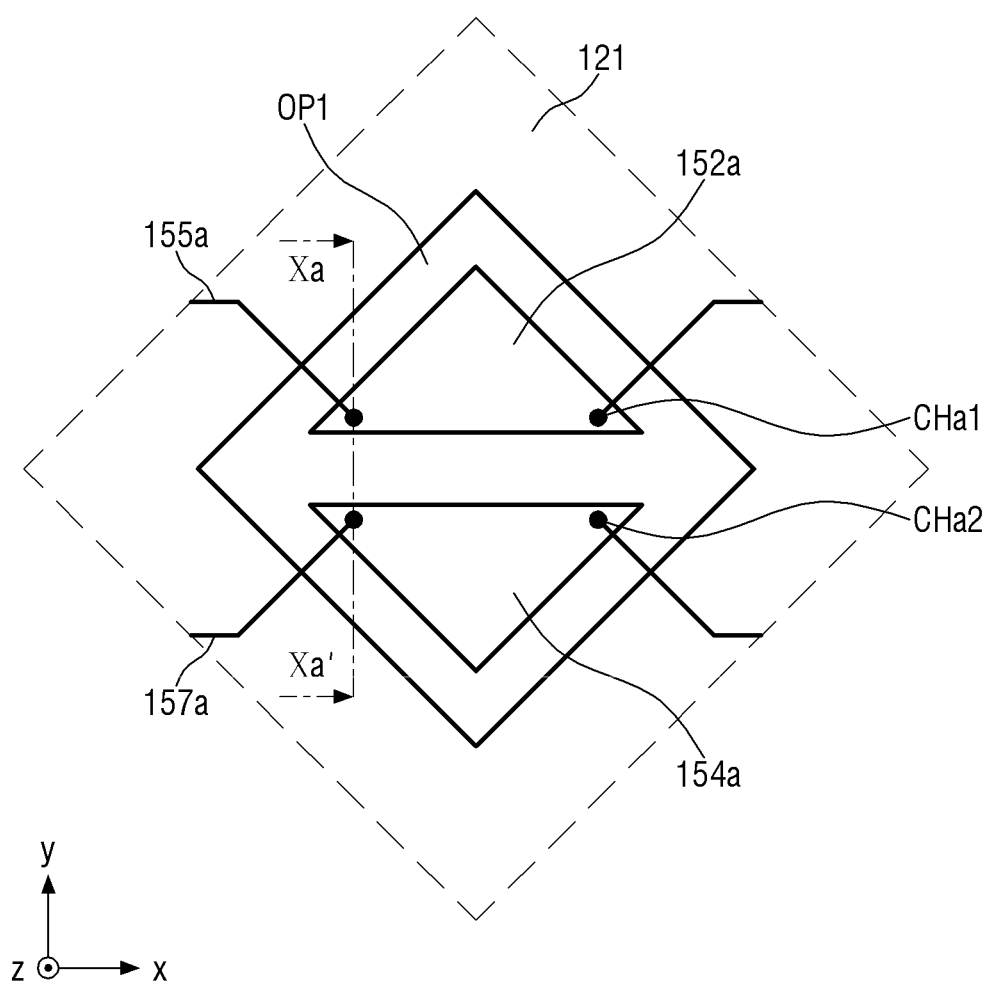
FIG. 51 is an enlarged view of portion Qb of FIG. 49.
Figure 52:
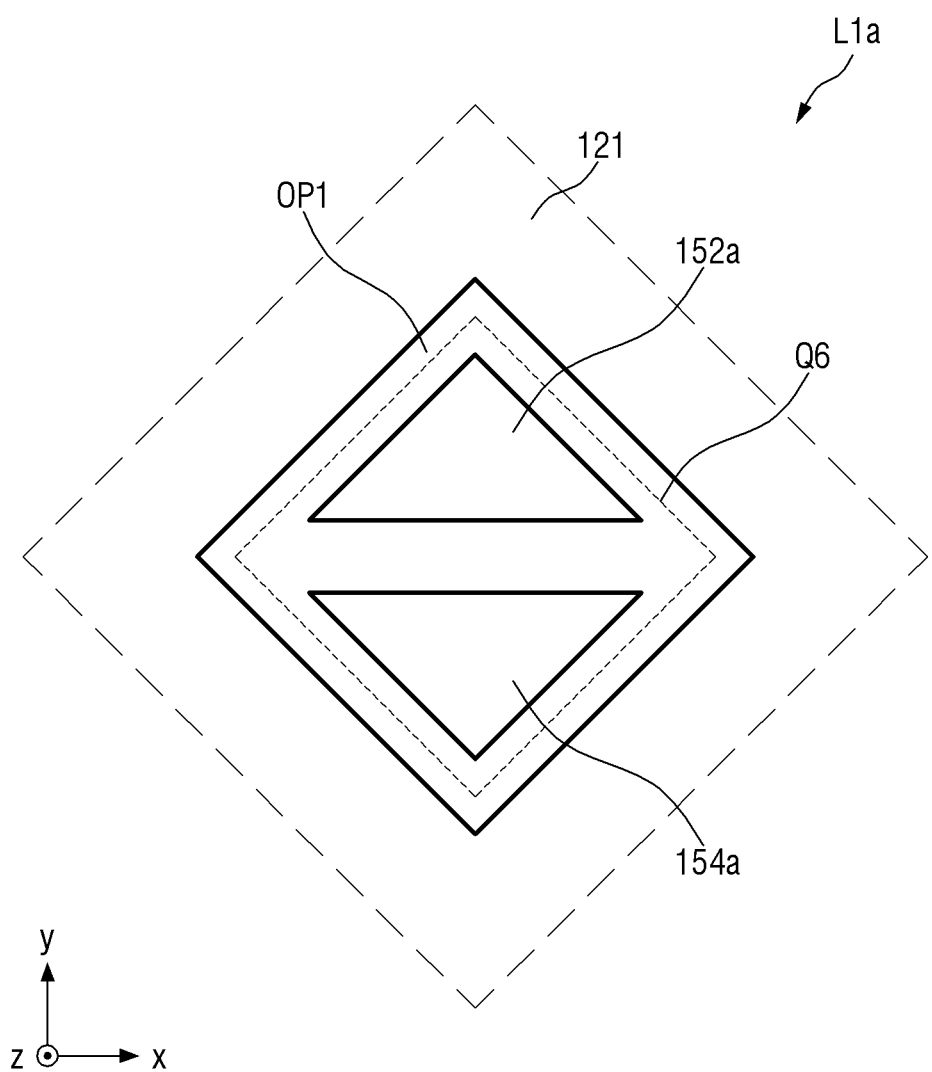
FIG. 52 is a view showing an example of the structure a first layer of the sensor part shown in FIG. 51.
Figure 53:
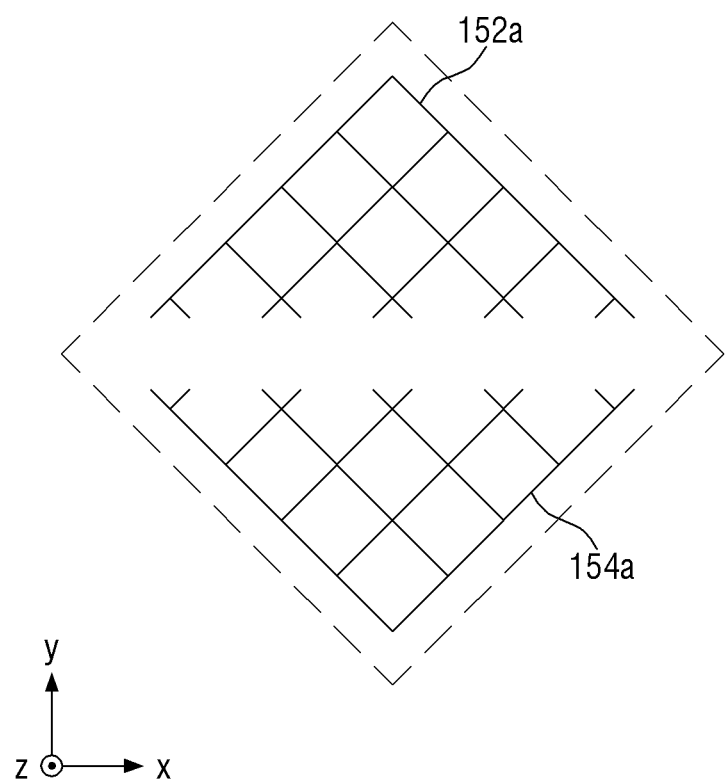
FIG. 53 is an enlarged plan view of portion Q6 of FIG. 52.
Figure 54:
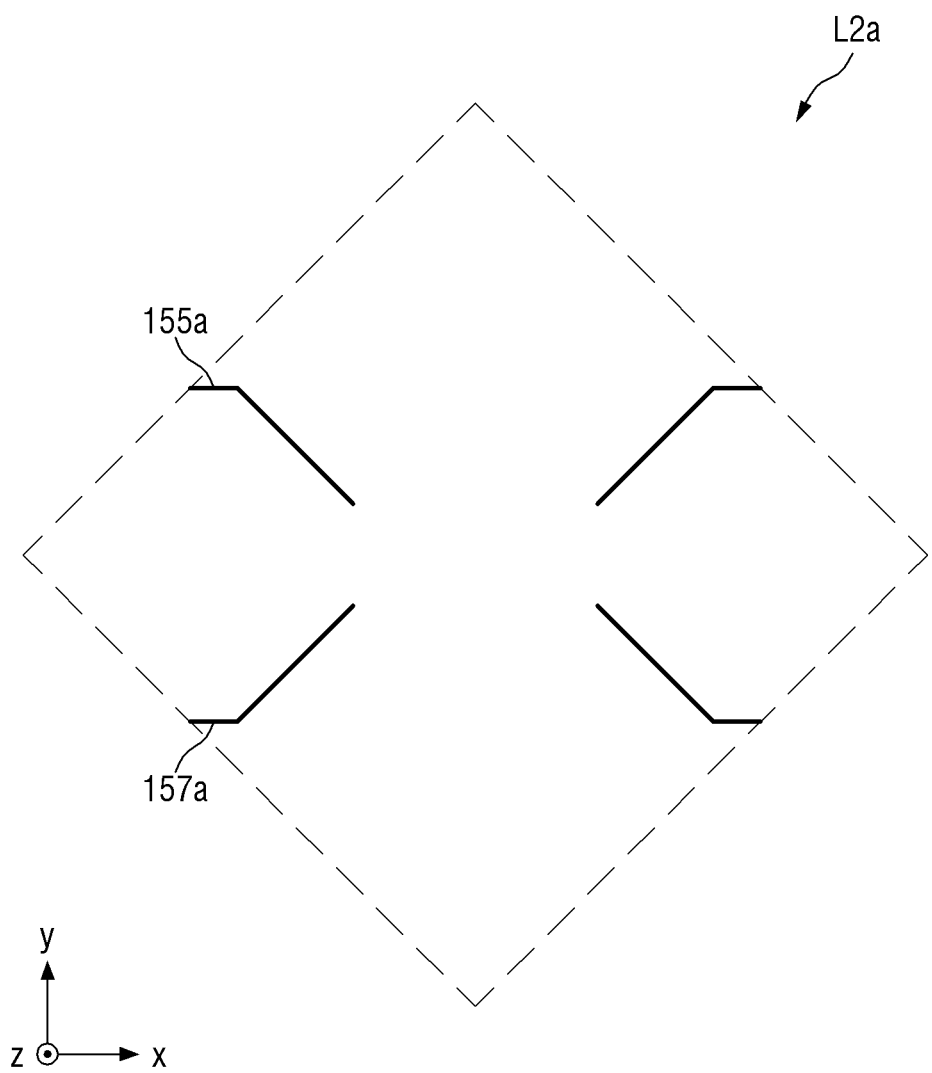
FIG. 54 is a view showing an example of the structure a second layer of the sensor part shown in FIG. 51.
Figure 55:
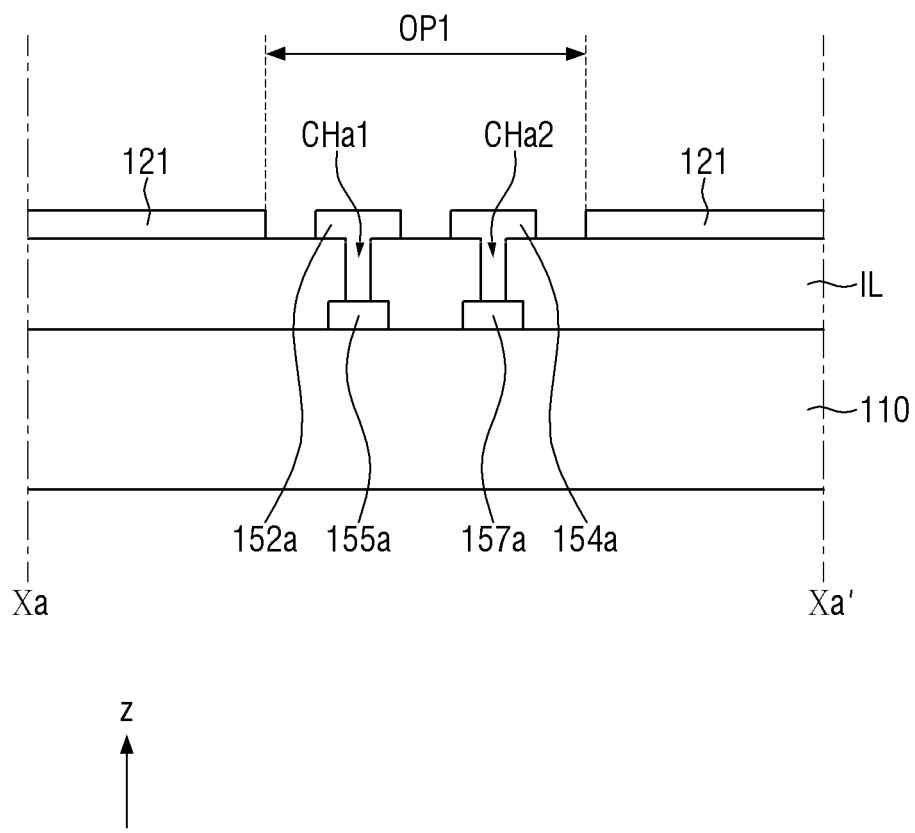
FIG. 55 is a cross-sectional view taken along line Xa-Xa' of FIG. 51.

FIG. 49 is a plan view of a sensor part of a touch sensor according to another exemplary embodiment, showing a connection relationship between the sensor part and a controller. FIG. 50 is an enlarged plan view of the first strain gauge, the second strain gauge, the third strain gauge and the fourth strain gauge shown in FIG. 49. FIG. 51 is an enlarged view of portion Qb of FIG. 49. FIG. 52 is a view showing an example of the structure a first layer of the sensor part shown in FIG. 51. FIG. 53 is an enlarged plan view of Q6 portion of FIG. 52. FIG. 54 is a view showing an example of the structure a second layer of the sensor part shown in FIG. 51. FIG. 55 is a cross-sectional view taken along line Xa-Xa' of FIG. 51.

Referring to FIGS. 49 to 51, a touch sensor TSM-1 according to this exemplary embodiment includes a sensor part 100-1 and a controller 200.

The sensor part 100-1 is substantially identical to the sensor part 100 of the touch sensor TSM except that the former further includes a first strain gauge 150a1 and a third strain gauge 150c1. Therefore, the description will focus on the differences.

The first strain gauge 150a1 further includes a first conductive pattern 152a and a second conductive pattern 154a, unlike the first strain gauge 150a of the sensor part 100 described above.

The third strain gauge 150c1 further includes a third conductive pattern 152c and a fourth conductive pattern 154c, unlike the third strain gauge 150c of the sensor part 100 described above.

As shown in the drawings, the first conductive pattern 152a and the second conductive pattern 154a may be located in the same first layer L1a and may be made of the same material as a first resistance line 151a.

The shape of the first conductive pattern 152a may be different from the shape of the first resistance line 151a when viewed from the top, and the shape of the second conductive pattern 154a may be different from the shape of the second resistance line 153a when viewed from the top.

Like the first conductive pattern 152a and the second conductive pattern 154a, the third conductive pattern 152c and the fourth conductive pattern 154c may be located in the same first layer L1a with the first touch electrode 121 and may be made of the same material as a fifth resistance line 161a.

On the base layer 110, a first area A11 and a second area A12 adjacent to the first area A11 in the first direction x may be defined. In some exemplary embodiments, the first area A11 may be previously defined in the touch sensor TSM-1. For example, the first area A11 may be used in place of a physical input button.

The conductive pattern 152a and the second conductive pattern 154a may be located in the first opening OP1 located in the first area A11 of the first electrode row RE1 and may be spaced apart from the first touch electrodes 121. In some exemplary embodiments, the first conductive pattern 152a and the second conductive pattern 154a may be spaced apart from each other in the first opening OP1. The first resistance line 151a and the second resistance line 153a may be disposed in the first opening OP1 located in the second area A12 different from the first area A11 of the first electrode row RE1.

The third conductive pattern 152c and the fourth conductive pattern 154c may be disposed in the first opening OP1 located in the first area A11 of the second electrode row RE2. The third conductive pattern 152c and the fourth conductive pattern 154c may be spaced apart from the first touch electrodes 121. The first conductive pattern 152a and the second conductive pattern 154a may be spaced apart from each other in the first opening OP1. The fifth resistance line 151c and the sixth resistance line 153c may be disposed in the first opening OP1 located in the second area A12 different from the first area A11 of the second electrode row RE2.

The first conductive pattern 152a and the first resistance line 151a adjacent to each other in the first direction x may be electrically connected to each other via the first connecting line 155a located in the second layer L2a. In some exemplary embodiments, the first conductive pattern 152a may be connected to the first connecting line 155a through a contact hole CHa1 formed in the insulating layer IL. In addition, the second conductive pattern 154a may be electrically connected to the third resistance line 153a adjacent to each other in the first direction x via the second connecting line 157a located in the second layer L2a. In some exemplary embodiments, the second conductive pattern 154a may be connected to the second connecting line 157a through a contact hole CHb1 formed in the insulating layer IL.

The third conductive pattern 152c may be connected to the fifth resistance line 151c via the fifth connecting line 155c. The fourth conductive pattern 154c may be connected to the sixth resistance line 153c via the sixth connecting line 157c. Although not shown in the drawings, A contact hole for connecting the third conductive pattern 152c with the fifth connecting line 155c and a contact hole for connecting the fourth conductive pattern 154c with the sixth connecting line 156c may be formed in the insulating layer IL.

In some exemplary embodiments, when the same pressure is applied, a change in the length or the cross-sectional area of the first conductive pattern 152a may be smaller than a change in the length or the cross-sectional area of the first resistance line 151a. That is to say, the amount of a change in the resistance value of the first conductive pattern 152a may be smaller than the amount of a change in the resistance value of the first resistance line 151a when the same pressure is applied.

Similarly, the amount of a change in the resistance value of the second conductive pattern 154a may be smaller than the amount of a change in the resistance value of the second resistance line 153a for the same pressure, the amount of a change in the resistance value of the third conductive pattern 152c may be smaller than the amount of a change in the resistance value of the fifth resistance line 151c for the same pressure, and the amount of a change in the resistance line 154c may be smaller than the amount of a change in the resistance value of the sixth resistance line 153c for the same pressure.

In some exemplary embodiments, the first conductive pattern 152a and the second conductive pattern 154a may have a mesh structure as shown in FIG. 53. The shapes of the third conductive pattern 152c and the fourth conductive pattern 154c may be substantially identical to as those of the first conductive pattern 152a and the second conductive pattern 154a.

When a user's touch input is made on the first area A11, the resistance value of the first strain gauge 150a1 and/or the resistance value of the third strain gauge 150c1 changes according to the intensity of the touch input. In addition, the resistance value of the first strain gauge 150a1 and/or the resistance value of the third strain gauge 150c1 may change as the user's temperature changes. Therefore, for the first strain gauge 150a1, the amount of a change in the resistance value of the first strain gauge 150a1 may include the components which changes as the shape is changed during a touch pressure (hereinafter referred to as a pressure resistant components) as well as the components which changes based on a change in temperature (hereinafter referred to as a temperature resistant components). The temperature resistant components are irrespective of the magnitude of the touch pressure and thus may act as a noise during pressure detection.

According to this exemplary embodiment, the first strain gauge 150a1 includes the first conductive pattern 152a and the second conductive pattern 154a located in the first area A11, and the third strain gauge 150c1 includes the third conductive pattern 152c and the fourth conductive pattern 154c located in the first area A11. Therefore, when a user's touch input is made in the first area A11, there occurs substantially no change in the resistance value of the first conductive pattern 152a and the second conductive pattern 154a, and there occurs substantially no change in the resistance value of the third conductive pattern 152c and the fourth conductive pattern 154c. The heat generated by the user's temperature is transferred to the first resistance line 151a and the second resistance line 153a from the first conductive pattern 152a and the second conductive pattern 154a, and is transferred to the fifth resistance line 151c and the sixth resistance line 153c from the third conductive pattern 152c and the fourth conductor pattern 154c. Accordingly, a change in the resistance value occurs in the first strain gauge 150a1 and the third strain gauge 150c1 based on the temperature change.

That is to say, when a touch input is made, in the first strain gauges 150a1 and the third strain gauges 150c1, substantially no change occurs due to the intensity of the touch input but a change occurs in the resistance value due to the temperature change. In addition, when a touch input is made in the first area A11, there occurs a change in the resistance value due to the shape change and a change in the resistance value due to the temperature change in the second strain gauge 150b and the fourth strain gauge 150d. Therefore, it is possible to compensate for the components based on the temperature change among the change in the resistance value of the second strain gauge 150b and the fourth strain gauge 150d by using the change in the resistance value generated based on the temperature change in the first strain gauge 150a1 and the third strain gauge 150c1.

According to some modifications, the structure of the touch sensor TSM-1, especially the positions of the first conductive pattern 152a, the second conductive pattern 154a, the third conductive pattern 152c and the fourth conductive pattern 154c may be altered.

Figure 56:
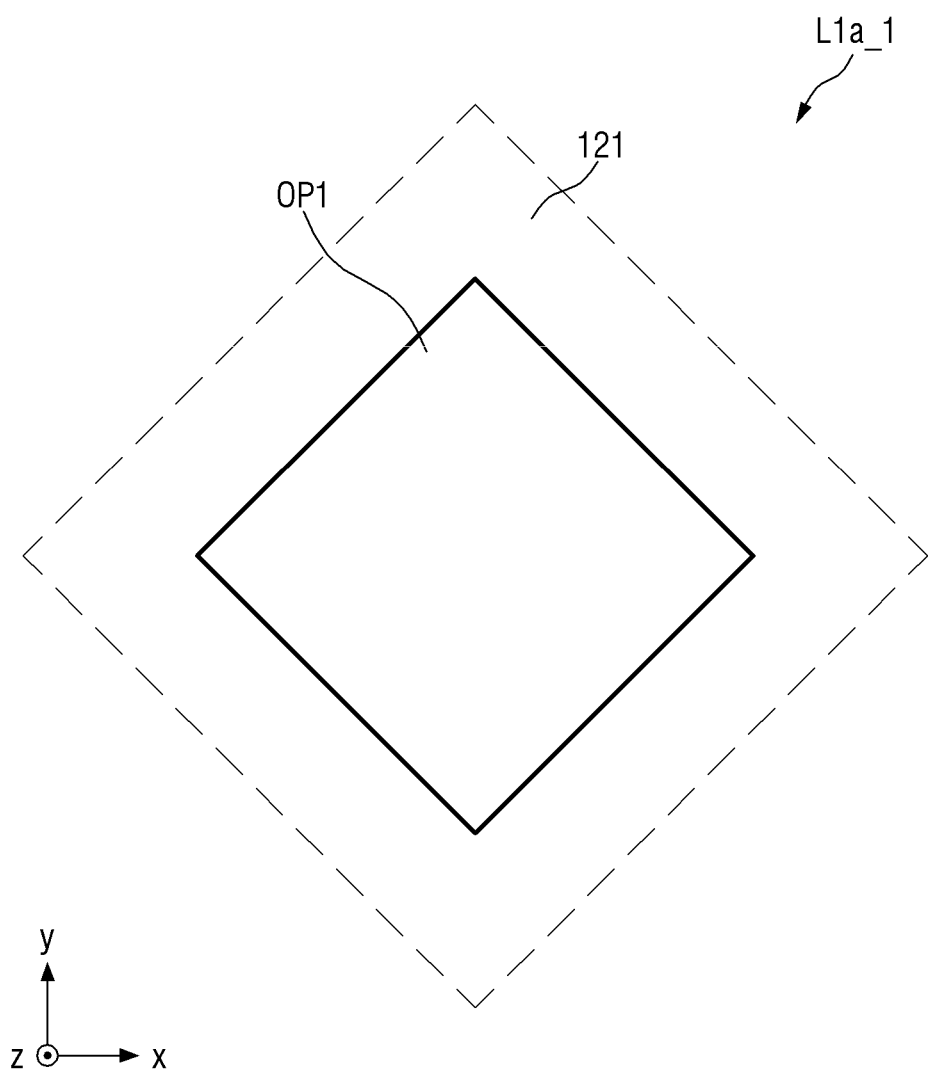
FIG. 56 is a view showing a structure of a first layer according to a modification of the example shown in FIG. 52.
Figure 57:
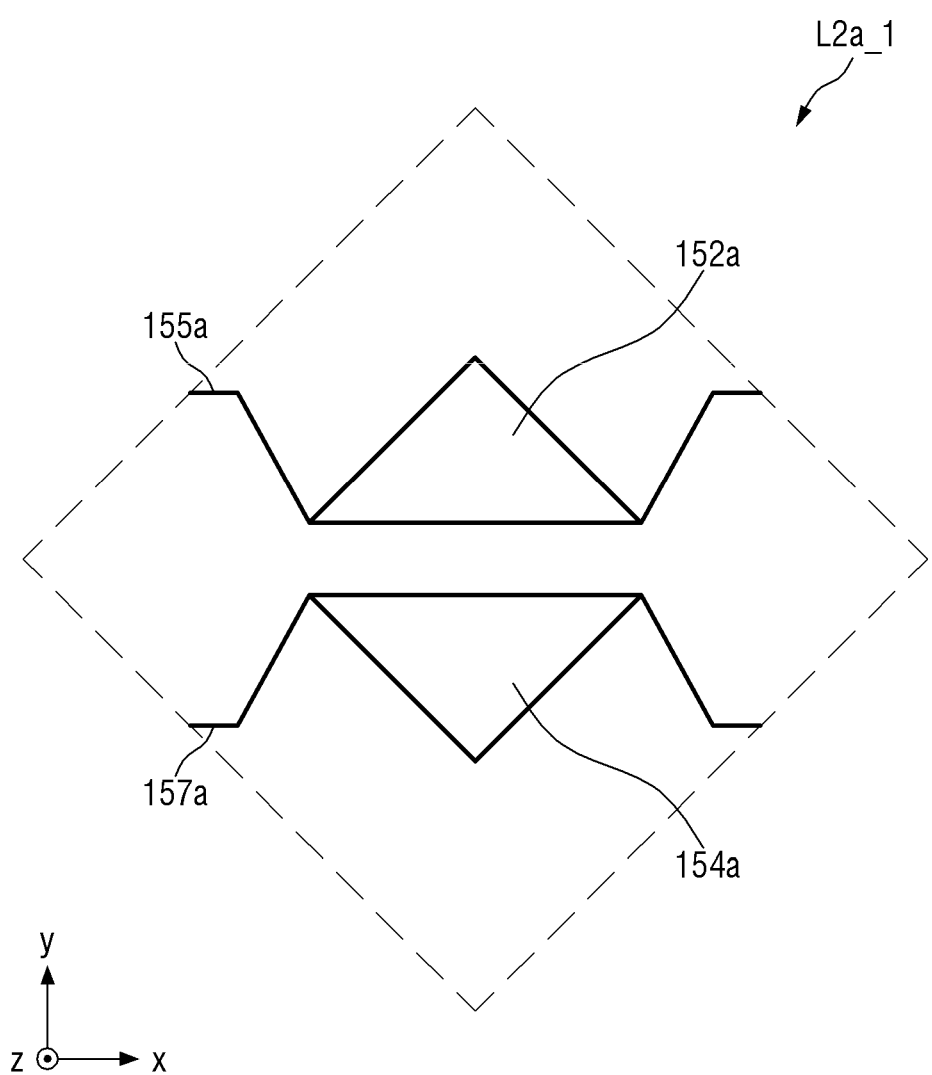
FIG. 57 is a view showing a structure of a second layer according to a modification of the example shown in FIG. 54.

FIG. 56 is a view showing a structure of a first layer according to a modification of the example shown in FIG. 52. FIG. 57 is a view showing a structure of a second layer according to a modification of the example shown in FIG. 54.

Referring to FIGS. 56 and 57, in some modifications, unlike the examples shown in FIGS. 49 to 51, the first conductive pattern 152a, the second conductive pattern 154a, the third conductive pattern 152c and the fourth conductive pattern 152c may be located in a different layer than the first touch electrodes 121. For example, the first touch electrodes 121 may be located in the first layer L1a_1, and the first conductive pattern 152a, the second conductive pattern 154a, the third conductive pattern 152c and the fourth conductive pattern 154c may be located in the same second layer L2a_1 with the first connecting line 155a and the second connecting line 157a.

Figure 58:
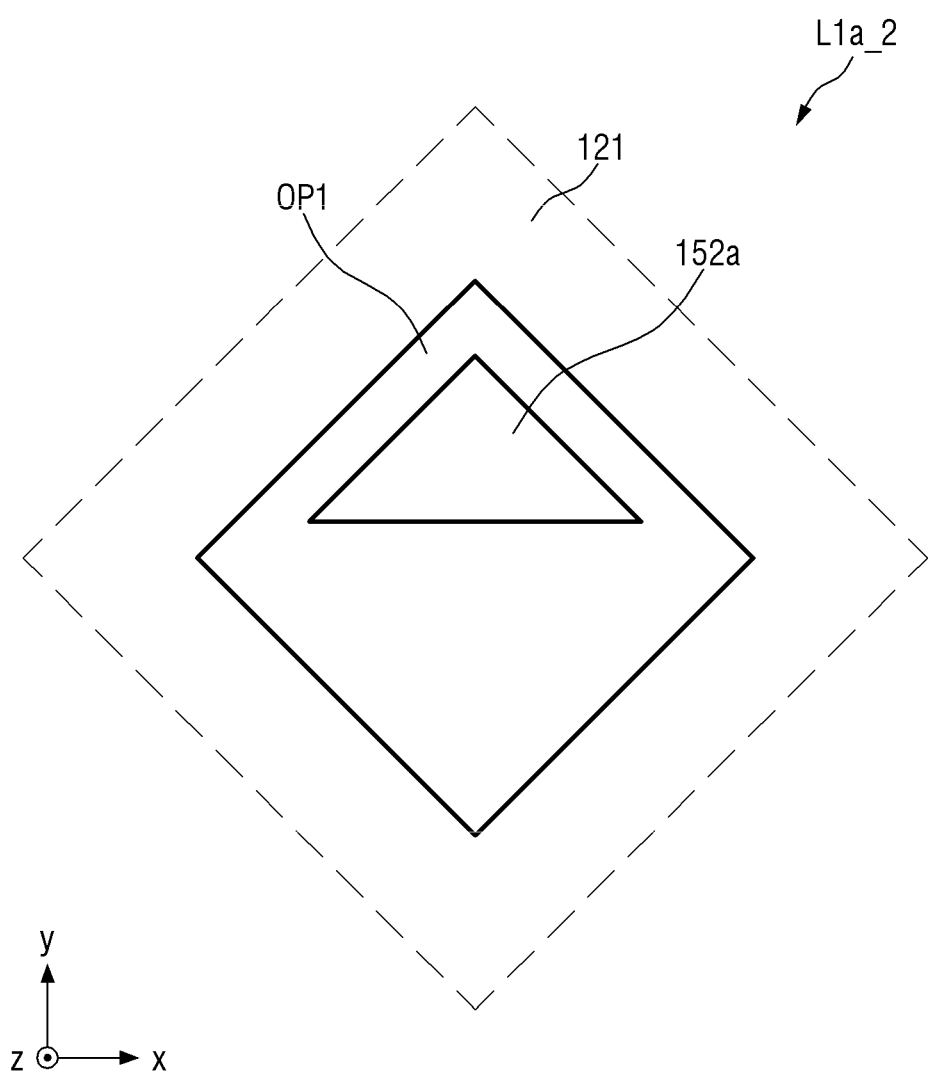
FIG. 58 is a view showing a structure of a first layer according to another modification of the example shown in FIG. 52.
Figure 59:
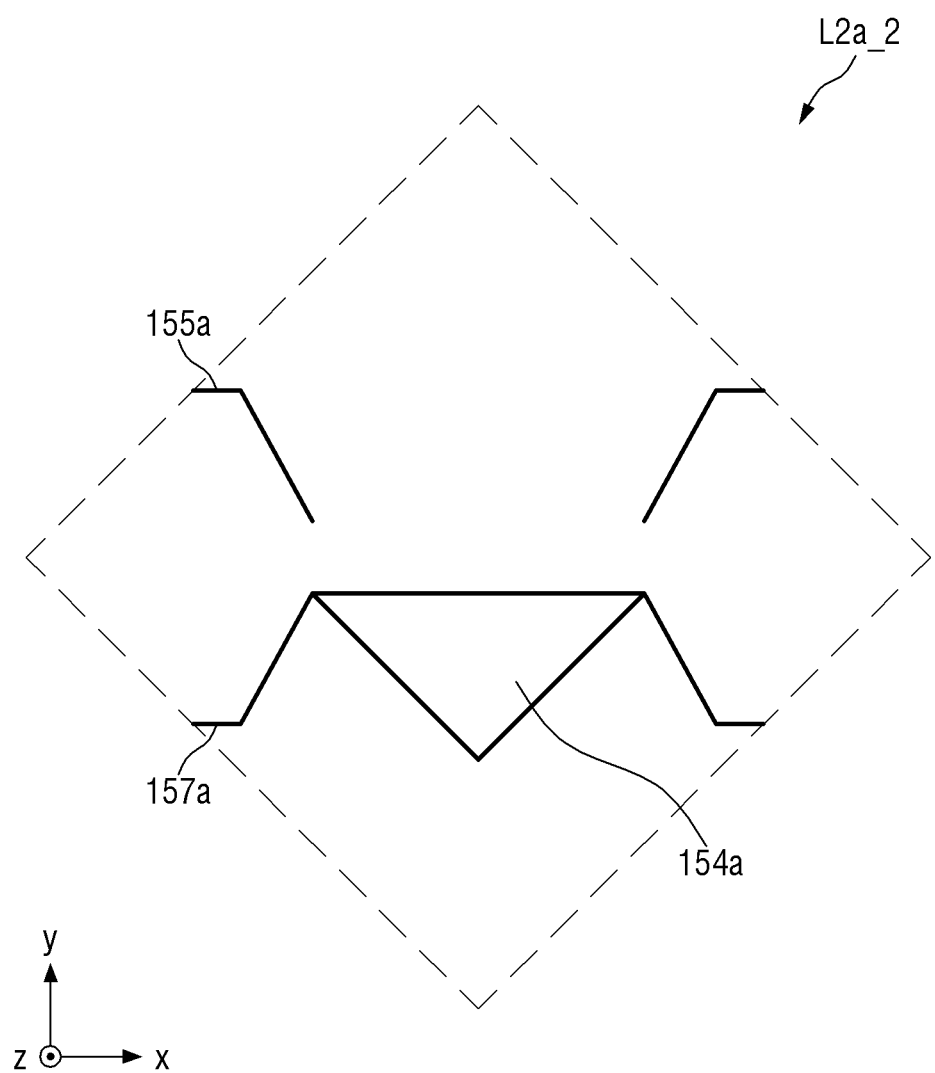
FIG. 59 is a view showing a structure of a second layer according to another modification of the example shown in FIG. 54.

FIG. 58 is a view showing a structure of a first layer according to another modification of the example shown in FIG. 52. FIG. 59 is a view showing a structure of a second layer according to another modification of the example shown in FIG. 54.

Referring to FIGS. 58 and 59, unlike the examples shown in FIGS. 49 to 51, in some other modifications, the first conductive pattern 152a and the third conductive pattern 152c (see FIG. 50) may be located in the same first layer L1a_2 with the first touch electrode 121, and the second conductive pattern 154a and the fourth conductive pattern 154c (see FIG. 50) may be located in the same second layer L2a_2 with the first connecting line 155a and the second connecting line 157a. In the drawings, the first conductive pattern 152a and the second resistance line 154a do not overlap with each other when viewed from the top. It is, however, to be understood that the present disclosure is not limited thereto. The first conductive pattern 152a and the second conductive pattern 154a are located in different layers and thus the first conductive pattern 152a and the fourth conductive pattern 154a may overlap with each other. The relationship between the third conductive pattern 152c (see FIG. 50) and the fourth conductive pattern 154c (see FIG. 50) may be modified similarly to the relationship between the first conductive pattern 152a and the second conductive pattern 154a.

In the touch sensor according to the above-described exemplary embodiments and the display device including the touch sensor, since the strain gauges are located in the touch sensor, it is possible to detect the magnitude of a pressure even without a separate pressure sensor. In addition, there are advantages in that the strain gauges can be produced together during the process of fabricating the touch electrodes and the connecting parts, and that the thickness of the touch sensor is not increased even if the strain gauges are added. In addition, since the strain gauges can be used in place of physical input buttons or in combination with the physical input buttons, it is possible to provide a variety of user interfaces to a user.

In addition, the touch sensor can cancel the noise introduced from the display panel or the like, and thus the touch sensitivity can be improved.

In addition, according to some exemplary embodiments of the present disclosure, the touch sensor can compensate for a change in the resistance due to temperature, so that the detection sensitivity of a touch pressure can be improved.

However, the effects of the embodiments are not restricted to the one set forth herein. The above and other effects of the embodiments will become more apparent to one of daily skill in the art to which the embodiments pertain by referencing the claims.

What is claimed is:

1. A touch sensor comprising:
    a base layer;
    first electrode members arranged on the base layer in a first direction and spaced apart from one another in a second direction intersecting the first direction, each of the first electrode members comprising a first opening and a plurality of first touch electrodes electrically connected to one another in the first direction;
    second electrode members arranged on the base layer in the second direction and spaced apart from one another in the first direction, each of the second electrode members comprising a second opening and a plurality of second touch electrodes electrically connected to one another in the second direction intersecting the first direction;
    a first strain gauge comprising a portion located in the first opening and disposed in a first electrode row among electrode rows of the first electrode members;
    a second strain gauge comprising a portion located in the second opening and disposed in a first row among rows of the second touch electrodes;
    a first signal line connected to one end of the first strain gauge;
    a second signal line connected to an other end of the first strain gauge and spaced apart from the first signal line;
    a third signal line connected to one end of the second strain gauge and the second signal line;
    a fourth signal line connected to an other end of the second strain gauge and spaced apart from the third signal line,
    a dummy pattern located in a different area than the second strain gauge, and
    a plurality of noise sensing electrodes located in a different area than the first strain gauge and electrically connected to one another in the first direction,
    wherein the first touch electrodes, the second touch electrodes, the dummy pattern, and the noise sensing electrode are disposed on a same layer,
    wherein the first strain gauge and the second strain gauge are connected by the second signal line and the third signal line, and
    wherein an area of the first opening surrounding the first strain gauge is smaller than an area of the second opening surrounding the second strain gauge.

2. The touch sensor of claim 1, wherein the first strain gauge comprises: a plurality of first resistance lines electrically connected to one another in the first direction, and a plurality of second resistance lines electrically connected to one another in the first direction, and
    wherein each of the first resistance lines and each of the second resistance lines are located in the first opening in the first electrode row and are spaced from each other in the first opening.

3. The touch sensor of claim 2, wherein the first electrode members further comprise first connecting parts each of which connects two first touch electrodes, among the first touch electrodes, that are adjacent to each other in the first direction, and the second electrode members further comprise second connecting parts each of which connects two second touch electrodes, among the second touch electrodes, that are adjacent to each other in the second direction, the second connecting parts being insulated from the first connecting parts,
    wherein the first touch electrodes, the second touch electrodes, the first resistance lines and the second resistance lines are located in a same first layer, one of the first connecting parts and the second connecting parts are located in a second layer different from the first layer, and an other of the first connecting parts and the second connecting parts are located in the first layer.

4. The touch sensor of claim 3, wherein the first strain gauge comprises:
    first connecting lines each of which connects two first resistance lines, among the first resistance lines, that are adjacent to each other in the first direction, and second connecting lines each of which connects two second resistance lines, among the second resistance lines, that are adjacent to each other in the first direction, and
    wherein the first connecting lines and the second connecting lines are located in the second layer.

5. The touch sensor of claim 4, wherein the first strain gage further comprises a first connecting pattern connected to the first resistance lines and the second resistance lines and located in a same layer with the first resistance lines or the second resistance lines, and
    wherein the first connecting pattern is located in an outermost first opening of the first electrode row among the first openings.

6. The touch sensor of claim 4, further comprising:
    an insulating layer disposed on the base layer, wherein the first connecting lines and the second connecting lines are disposed on the base layer, wherein the insulating layer is disposed on the first connecting lines and the second connecting lines, and wherein the first touch electrodes, the second touch electrodes, the first resistance lines and the second resistance lines are disposed on the insulating layer.

7. The touch sensor of claim 6, wherein the base layer comprises a first encapsulation inorganic layer, an encapsulation organic layer disposed on the first encapsulation inorganic layer, and a second encapsulation inorganic layer disposed on the encapsulation organic layer, and wherein the first connecting lines and the second connecting lines are disposed on the second encapsulation inorganic layer.

8. The touch sensor of claim 2, wherein the first electrode members further comprise first connecting parts each of which connects two first touch electrodes, among the first touch electrodes, that are adjacent to each other in the first direction, and the second electrode members further comprise second connecting parts each of which connects two second touch electrodes, among the second touch electrodes, that are adjacent to each other in the second direction, the second connecting parts being insulated from the first connecting parts, wherein the first touch electrodes, the second touch electrodes and the first resistance lines are located in a same first layer, one of the first connecting parts and the second connecting parts are located in a second layer different from the first layer, and an other of the first connecting parts and the second connecting parts are located in the first layer, and the second resistance lines are located in the second layer.

9. The touch sensor of claim 2, wherein the first electrode members further comprise first connecting parts each of which connects two first touch electrodes, among the first touch electrodes, that are adjacent to each other in the first direction, and the second electrode members further comprise second connecting parts each of which connects two second touch electrodes, among the second touch electrodes, that are adjacent to each other in the second direction, the second connecting parts being insulated from the first connecting parts, wherein the first touch electrodes and the second touch electrodes are located in a same first layer, one of the first connecting parts and the second connecting parts are located in a second layer different from the first layer, and an other of the first connecting parts and the second connecting parts are located in the first layer, and the first resistance lines and the second resistance lines are located in the second layer.

10. The touch sensor of claim 2, wherein the second strain gauge comprises: a plurality of third resistance lines electrically connected to one another in the first direction, and a plurality of fourth resistance lines electrically connected to one another in the first direction, third connecting lines each of which connects two third resistance lines, among the third resistance lines, that are adjacent to each other in the first direction, and fourth connecting lines each of which connects two fourth resistance lines, among the fourth resistance lines, that are adjacent to each other in the first direction, wherein each of the third resistance lines and each of the fourth resistance lines are located in the second opening in the first row, and are spaced from each other in the second opening.

11. The touch sensor of claim 2, further comprising: a third strain gauge located in a second electrode row, among the electrode rows, that is adjacent to the first electrode row in the second direction of the first electrode members and comprising a portion located in the first opening in the second electrode row; and a fourth strain gauge located in a second row, among the rows, that is adjacent to the first row in the second direction of the second electrodes and comprising a portion located in second first opening in the second row, where the first row is located between the first electrode row and the second electrode row along the second direction, and the second electrode row is located between the first row and the second row along the second direction.

12. The touch sensor of claim 11, further comprising: a fifth signal line connected to one end of the third strain gauge and the fourth signal line; a sixth signal line connected to another end of the third strain gauge; a seventh signal line connected to one end of the fourth strain gauge and the sixth signal line; and an eighth signal line connected to another end of the fourth strain gauge.

13. The touch sensor of claim 12, wherein a sensing area where the first electrode members and the second electrode members are disposed, and a peripheral area around the sensing area, are defined in the base layer, wherein the third signal line is connected to the second signal line in the peripheral area, the fifth signal line is connected to the fourth signal line in the peripheral area, and the seventh signal line is connected to the sixth signal line in the peripheral area.

14. The touch sensor of claim 12, further comprising: a Wheatstone bridge circuit comprising a first node to which a driving voltage is applied, a second node to which a reference voltage is applied, a first output node and a second output node, wherein the first signal line and the eighth signal line are electrically connected to the first node, the third signal line is electrically connected to the second output node, the fifth signal line is electrically connected to the second node, and the seventh signal line is electrically connected to the first output node.

15. The touch sensor of claim 2, wherein the base layer comprises a first area and a second area adjacent to the first area in the first direction, wherein the first strain gauge further comprises: a first conductive pattern electrically connected to the first resistance lines in the first direction and having a shape different from that of the first resistance lines, and a second conductive pattern connected to the second resistance lines in the first direction and having a shape different from that of the second resistance lines, wherein the first conductive pattern and the second conductive pattern are located in the first opening in the first area and are spaced apart from each other, and wherein the first resistance lines and the second resistance lines are located in the first opening in the second area.

16. The touch sensor of claim 15, wherein the first conductive pattern and the second conductive pattern have a mesh structure.

17. The touch sensor of claim 1, wherein the dummy pattern is disposed in the second opening located in the different area among the second openings and spaced apart from the second touch electrodes, and the first touch electrodes and the second touch electrodes are made of a same material.

18. The touch sensor of claim 1, wherein each of the noise sensing electrodes is located in the first opening and spaced apart from the first touch electrodes in the different area.

19. The touch sensor of claim 18, further comprising: a controller configured to cancel a noise in a signal sensed by the first electrode members based on a noise signal sensed by the noise sensing electrode members.

20. A touch sensor comprising:
a base layer;
a plurality of touch electrodes disposed on the base layer and arranged in a first direction and having a first opening and a second opening; and
a plurality of strain gauges including a first strain gauge and a second strain gauge, the first strain gauge comprising a plurality of first resistance lines electrically connected to one another in the first direction, a plurality of second resistance lines electrically connected to one another in the first direction, and a connecting pattern connecting one of the first resistance lines to one of the second resistance lines, and the second strain gauge comprising a plurality of third resistance lines electrically connected to one another in the first direction, a plurality of fourth resistance lines electrically connected to one another in the first direction, and a connecting pattern connecting one of the third resistance lines to one of the fourth resistance lines,
wherein each of the first resistance lines is located in the first opening and is spaced apart from the touch electrode, and each of the second resistance lines is located in the first opening and is spaced apart from the touch electrode and the first resistance lines, and each of the third resistance lines is located in the second opening and is spaced apart from the touch electrode, and each of the fourth resistance lines is located in the second opening and is spaced apart from the touch electrode and the third resistance lines, wherein each of the first resistance lines is connected to a first connecting line disposed outside of the first opening, and each of the second resistance lines is connected to a second connecting line disposed outside of the first opening, each of the third resistance lines is connected to a third connecting line disposed outside of the opening, and each of the fourth resistance lines is connected to a fourth connecting line disposed outside of the second opening, and wherein an area of the first opening surrounding the first strain gauge is smaller than an area of the second opening surrounding the second strain gauge.

21. The touch sensor of claim 20, wherein the first resistance lines or the second resistance lines are located in a same layer with the touch electrodes and are made of a same material as the touch electrode.

22. The touch sensor of claim 20, wherein the first resistance lines and the second resistance lines are located in a different layer than the touch electrodes.

23. The touch sensor of claim 20, further comprising: a noise sensing electrode located in a different area than the strain gauge, wherein the noise sensing electrode is located in the opening in the different area and is spaced apart from the touch electrodes.

24. The touch sensor of claim 23, wherein the noise sensing electrode is located in a same layer with the touch electrodes and is made of a same material as the touch electrodes.

25. A display device comprising:
a base substrate;
a light-emitting diode disposed on the base substrate;
a thin-film encapsulation layer disposed on the light-emitting diode;
a plurality of touch electrode disposed on the thin-film encapsulation layer and comprising first and second openings; and a plurality of strain gauge including a first strain gauge and a second strain gauge, wherein the first strain gauge comprises:
a first resistance line and a second resistance line located in the first opening and spaced apart from the touch electrode;
a first connecting line connected to the first resistance line and located on a different layer than the touch electrode, wherein the first connecting line is disposed outside of the first opening;
a second connecting line connected to the second resistance line, spaced apart from the first connecting line and located on a same layer as the first connecting line, wherein the second connecting line is disposed outside of the first opening; and
a connecting pattern connected to the first resistance line and the second resistance line and located in a same layer as the touch electrode, wherein the second strain gauge comprises:
a third resistance line and a fourth resistance line located in the second opening and spaced apart from the touch electrode;
a third connecting line connected to the third resistance line and located on a different layer than the touch electrode, wherein the third connecting line is disposed outside of the second opening;
a fourth connecting line connected to the fourth resistance line, spaced apart from the third connecting line and located on a same layer as the third connecting line, wherein the fourth connecting line is disposed outside of the second opening; and
a connecting pattern connected to the third resistance line and the fourth resistance line and located in a same layer as the touch electrode, and wherein an area of the first opening surrounding the first strain gauge is smaller than an area of the second opening surrounding the second strain gauge.

* * * * *